(12) United States Patent
Obuchi et al.

(10) Patent No.: US 7,428,693 B2
(45) Date of Patent: Sep. 23, 2008

(54) ERROR-DETECTING ENCODING AND DECODING APPARATUS AND DIVIDING APPARATUS

(75) Inventors: Kazuhisa Obuchi, Kawasaki (JP);
Tetsuya Yano, Kawasaki (JP);
Takaharu Nakamura, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 490 days.

(21) Appl. No.: 10/970,859

(22) Filed: Oct. 20, 2004

(65) Prior Publication Data

US 2005/0097432 A1 May 5, 2005

Related U.S. Application Data

(63) Continuation of application No. PCT/JP02/03965, filed on Apr. 22, 2002.

(51) Int. Cl.
*G06F 11/00* (2006.01)
*H03M 13/00* (2006.01)

(52) U.S. Cl. .................. 714/804; 714/803; 714/805; 714/758

(58) Field of Classification Search ............... 714/758, 714/804, 805, 803
See application file for complete search history.

(56) References Cited

U.S. PATENT DOCUMENTS

| | | | | |
|---|---|---|---|---|
| 4,117,458 A | * | 9/1978 | Burghard et al. | 714/759 |
| 4,809,273 A | * | 2/1989 | Jackowski et al. | 714/703 |
| 5,768,294 A | * | 6/1998 | Chen et al. | 714/766 |
| 5,778,013 A | * | 7/1998 | Jedwab | 714/807 |
| 5,951,707 A | * | 9/1999 | Christensen et al. | 714/752 |
| 6,236,647 B1 | | 5/2001 | Amalfitano | |
| 6,763,492 B1 | | 7/2004 | Hurt et al. | |
| 6,883,131 B2 | * | 4/2005 | Acton | 714/755 |
| 6,961,893 B1 | * | 11/2005 | Mukund et al. | 714/781 |
| 7,020,209 B1 | | 3/2006 | Okumura | |

FOREIGN PATENT DOCUMENTS

EP  0 366 589  2/1990

(Continued)

OTHER PUBLICATIONS

Supplementary Partial European Search Report dated Jun. 30, 2005.

(Continued)

*Primary Examiner*—Mujtaba K. Chaudry
(74) *Attorney, Agent, or Firm*—Katten Muchin Rosenman LLP

(57) ABSTRACT

Disclosed are an error-detecting encoding apparatus for creating parity bits by error-detecting encoding processing, appending the parity bits to an input data string and encoding the data string, and an error-detecting decoding apparatus for detecting error using these parity bits. Data segmenting means segments an input data string, which is to undergo error-detecting encoding, into a plurality of sub-data strings, dividing means divides the segmented sub-data strings by a polynomial, which is for generating an error-detecting code, and calculates remainders, converting means applies conversion processing, which conforms to a segmentation position of the sub-data strings, to the remainders on a per-remainder basis, and combining means combines converted values, which have been obtained by the conversion processing, and outputs parity bits. An encoder appends this parity to a data string, and a decoder detects error using this parity.

12 Claims, 36 Drawing Sheets

FOREIGN PATENT DOCUMENTS

| | | |
|---|---|---|
| JP | 01-265332 | 10/1989 |
| JP | 03-085923 | 4/1991 |
| JP | 03-098346 | 4/1991 |
| JP | 09-018354 | 1/1997 |
| JP | 09-064754 | 3/1997 |
| JP | 10-209880 | 8/1998 |
| JP | 10-215187 | 8/1998 |
| JP | 2001-7784 | 1/2001 |
| JP | 2001-168730 | 6/2001 |
| WO | 02/27939 | 4/2002 |

OTHER PUBLICATIONS

Notification of Reasons for Refusal dated Oct. 17, 2006.

Florian Braun, et al. "Fast Incremental CRC Updates for IP over ATM Networks" High Performance Switching and Routing, 2001 IEEE Workshop, May 29, 2001, pp. 48-52, XP010542769.

* cited by examiner

FIG. 2

|   | 15 | 14 | 13 | 12 | 11 | 10 | 9 | 8 | 7 | 6 | 5 | 4 | 3 | 2 | 1 | 0 |
|---|----|----|----|----|----|----|---|---|---|---|---|---|---|---|---|---|
| 15 | 0 | 1 | 0 | 0 | 0 | 0 | 0 | 0 | 0 | 0 | 0 | 0 | 0 | 0 | 0 | 0 |
| 14 | 0 | 0 | 1 | 0 | 0 | 0 | 0 | 0 | 0 | 0 | 0 | 0 | 0 | 0 | 0 | 0 |
| 13 | 0 | 0 | 0 | 1 | 0 | 0 | 0 | 0 | 0 | 0 | 0 | 0 | 0 | 0 | 0 | 0 |
| 12 | 1 | 0 | 0 | 0 | 1 | 0 | 0 | 0 | 0 | 0 | 0 | 0 | 0 | 0 | 0 | 0 |
| 11 | 0 | 0 | 0 | 0 | 0 | 1 | 0 | 0 | 0 | 0 | 0 | 0 | 0 | 0 | 0 | 0 |
| 10 | 0 | 0 | 0 | 0 | 0 | 0 | 1 | 0 | 0 | 0 | 0 | 0 | 0 | 0 | 0 | 0 |
| 9 | 0 | 0 | 0 | 0 | 0 | 0 | 0 | 1 | 0 | 0 | 0 | 0 | 0 | 0 | 0 | 0 |
| 8 | 0 | 0 | 0 | 0 | 0 | 0 | 0 | 0 | 1 | 0 | 0 | 0 | 0 | 0 | 0 | 0 |
| 7 | 0 | 0 | 0 | 0 | 0 | 0 | 0 | 0 | 0 | 1 | 0 | 0 | 0 | 0 | 0 | 0 |
| 6 | 0 | 0 | 0 | 0 | 0 | 0 | 0 | 0 | 0 | 0 | 1 | 0 | 0 | 0 | 0 | 0 |
| 5 | 1 | 0 | 0 | 0 | 0 | 0 | 0 | 0 | 0 | 0 | 0 | 1 | 0 | 0 | 0 | 0 |
| 4 | 0 | 0 | 0 | 0 | 0 | 0 | 0 | 0 | 0 | 0 | 0 | 0 | 1 | 0 | 0 | 0 |
| 3 | 0 | 0 | 0 | 0 | 0 | 0 | 0 | 0 | 0 | 0 | 0 | 0 | 0 | 1 | 0 | 0 |
| 2 | 0 | 0 | 0 | 0 | 0 | 0 | 0 | 0 | 0 | 0 | 0 | 0 | 0 | 0 | 1 | 0 |
| 1 | 0 | 0 | 0 | 0 | 0 | 0 | 0 | 0 | 0 | 0 | 0 | 0 | 0 | 0 | 0 | 1 |
| 0 | 1 | 0 | 0 | 0 | 0 | 0 | 0 | 0 | 0 | 0 | 0 | 0 | 0 | 0 | 0 | 0 |

A =

Columns: 15TH BIT PRIOR TO SHIFT (col 15), 4TH BIT PRIOR TO SHIFT (col 4), labeled "PRIOR TO SHIFT"
Rows: AFTER SHIFT; 5TH BIT AFTER SHIFT (row 5)

FIG. 3

(A) 2-BIT SHIFT MATRIX $A^2 = A \times A$ (B) 4-BIT SHIFT MATRIX $A^4 = A^2 \times A^2$

FIG. 4

(A) 8-BIT SHIFT MATRIX $A^8 =$
$A^4 \times A^4 =$ (B) 16-BIT SHIFT MATRIX $A^{16} =$
$A^8 \times A^8 =$

FIG. 5

$A^{24} = A^{16} \times A^8$

FIG. 6

(A) 32-BIT SHIFT MATRIX $A^{32} =$
$A^{24} \times A^8$ (B) 40-BIT SHIFT MATRIX $A^{40} =$
$A^{32} \times A^8$

| TIME | INPUT | | REGISTER SR | | | | | | | | | | | | | | | | |
|---|---|---|---|---|---|---|---|---|---|---|---|---|---|---|---|---|---|---|---|
| | | | 0 | 1 | 2 | 3 | 4 | 5 | 6 | 7 | 8 | 9 | 10 | 11 | 12 | 13 | 14 | 15 | |
| | | | 0 | 0 | 0 | 0 | 0 | 0 | 0 | 0 | 0 | 0 | 0 | 0 | 0 | 0 | 0 | 0 | |
| 1 | $x^{31}$ | 1 | 1 | 0 | 0 | 0 | 0 | 1 | 0 | 0 | 0 | 0 | 0 | 0 | 1 | 0 | 0 | 0 | |
| 2 | $x^{30}$ | 1 | 1 | 1 | 0 | 0 | 0 | 1 | 1 | 0 | 0 | 0 | 0 | 0 | 1 | 1 | 0 | 0 | |
| 3 | $x^{29}$ | 1 | 1 | 1 | 1 | 0 | 0 | 1 | 1 | 1 | 0 | 0 | 0 | 0 | 1 | 1 | 1 | 0 | |
| 4 | $x^{28}$ | 1 | 1 | 1 | 1 | 1 | 0 | 1 | 1 | 1 | 1 | 0 | 0 | 0 | 1 | 1 | 1 | 1 | |
| 5 | $x^{27}$ | 1 | 0 | 1 | 1 | 1 | 1 | 0 | 1 | 1 | 1 | 1 | 0 | 0 | 0 | 1 | 1 | 1 | |
| 6 | $x^{26}$ | 1 | 0 | 0 | 1 | 1 | 1 | 1 | 0 | 1 | 1 | 1 | 1 | 0 | 0 | 0 | 1 | 1 | |
| 7 | $x^{25}$ | 1 | 0 | 0 | 0 | 1 | 1 | 1 | 1 | 0 | 1 | 1 | 1 | 1 | 0 | 0 | 0 | 1 | |
| 8 | $x^{24}$ | 1 | 0 | 0 | 0 | 0 | 1 | 1 | 1 | 1 | 0 | 1 | 1 | 1 | 1 | 0 | 0 | 0 | $\leftarrow R_A(x)$ |

(B) 24-BIT SHIFT MATRIX $A^{24}$

| | 15 | 14 | 13 | 12 | 11 | 10 | 9 | 8 | 7 | 6 | 5 | 4 | 3 | 2 | 1 | 0 | $R_A(x)$ | $R_{A'}(x)$ |
|---|---|---|---|---|---|---|---|---|---|---|---|---|---|---|---|---|---|---|
| 15 | 0 | 0 | 1 | 0 | 1 | 1 | 0 | 0 | 0 | 0 | 0 | 1 | 1 | 0 | 0 | 0 | 0 | 0 |
| 14 | 0 | 0 | 0 | 1 | 0 | 1 | 1 | 0 | 0 | 0 | 0 | 0 | 1 | 1 | 0 | 0 | 0 | 1 |
| 13 | 1 | 0 | 0 | 0 | 1 | 0 | 1 | 1 | 0 | 0 | 0 | 0 | 0 | 1 | 1 | 0 | 0 | 0 |
| 12 | 1 | 1 | 0 | 0 | 0 | 1 | 0 | 1 | 1 | 0 | 0 | 0 | 0 | 0 | 0 | 1 | 1 | 0 |
| 11 | 1 | 1 | 1 | 0 | 0 | 1 | 1 | 0 | 1 | 1 | 0 | 0 | 1 | 1 | 0 | 0 | 1 | 1 |
| 10 | 0 | 1 | 1 | 0 | 1 | 1 | 1 | 1 | 0 | 1 | 1 | 0 | 0 | 1 | 1 | 0 | 1 | 0 |
| 9 | 1 | 0 | 1 | 1 | 0 | 0 | 1 | 1 | 1 | 0 | 1 | 1 | 0 | 0 | 1 | 1 | 1 | 1 |
| 8 | 1 | 1 | 0 | 1 | 1 | 0 | 0 | 1 | 1 | 1 | 0 | 1 | 1 | 0 | 0 | 1 | 0 = | 1 |
| 7 | 0 | 1 | 1 | 0 | 1 | 1 | 0 | 0 | 1 | 1 | 1 | 0 | 1 | 1 | 0 | 0 | 1 | 1 |
| 6 | 1 | 0 | 1 | 1 | 0 | 1 | 1 | 0 | 0 | 1 | 1 | 1 | 0 | 1 | 1 | 0 | 1 | 0 |
| 5 | 0 | 1 | 0 | 1 | 1 | 0 | 1 | 1 | 0 | 0 | 1 | 1 | 1 | 0 | 1 | 1 | 1 | 1 |
| 4 | 1 | 0 | 0 | 0 | 0 | 0 | 0 | 1 | 0 | 0 | 1 | 0 | 0 | 0 | 1 | 0 | 1 | 0 |
| 3 | 1 | 1 | 0 | 0 | 0 | 0 | 0 | 0 | 1 | 0 | 0 | 1 | 0 | 0 | 0 | 1 | 0 | 0 |
| 2 | 0 | 1 | 1 | 0 | 0 | 0 | 0 | 0 | 0 | 1 | 1 | 0 | 0 | 1 | 0 | 0 | 0 | 0 |
| 1 | 1 | 0 | 1 | 1 | 0 | 0 | 0 | 0 | 0 | 0 | 1 | 1 | 0 | 0 | 1 | 0 | 0 | 1 |
| 0 | 0 | 1 | 0 | 1 | 1 | 0 | 0 | 0 | 0 | 0 | 0 | 1 | 1 | 0 | 0 | 1 | 0 | 1 |

| TIME | INPUT | | REGISTER SR | | | | | | | | | | | | | | | | |
|---|---|---|---|---|---|---|---|---|---|---|---|---|---|---|---|---|---|---|---|
| | | | 0 | 1 | 2 | 3 | 4 | 5 | 6 | 7 | 8 | 9 | 10 | 11 | 12 | 13 | 14 | 15 | |
| | | | 0 | 0 | 0 | 0 | 0 | 0 | 0 | 0 | 0 | 0 | 0 | 0 | 0 | 0 | 0 | 0 | |
| 1 | $x^{23}$ | 1 | 1 | 0 | 0 | 0 | 0 | 1 | 0 | 0 | 0 | 0 | 0 | 0 | 1 | 0 | 0 | 0 | |
| 2 | $x^{22}$ | 1 | 1 | 1 | 0 | 0 | 0 | 1 | 1 | 0 | 0 | 0 | 0 | 0 | 1 | 1 | 0 | 0 | |
| 3 | $x^{21}$ | 1 | 1 | 1 | 1 | 0 | 0 | 1 | 1 | 1 | 0 | 0 | 0 | 0 | 1 | 1 | 1 | 0 | |
| 4 | $x^{20}$ | 1 | 1 | 1 | 1 | 1 | 0 | 1 | 1 | 1 | 1 | 0 | 0 | 0 | 1 | 1 | 1 | 1 | |
| 5 | $x^{19}$ | 1 | 0 | 1 | 1 | 1 | 1 | 0 | 1 | 1 | 1 | 1 | 0 | 0 | 0 | 1 | 1 | 1 | |
| 6 | $x^{18}$ | 1 | 0 | 0 | 1 | 1 | 1 | 1 | 0 | 1 | 1 | 1 | 1 | 0 | 0 | 0 | 1 | 1 | |
| 7 | $x^{17}$ | 1 | 0 | 0 | 0 | 1 | 1 | 1 | 1 | 0 | 1 | 1 | 1 | 1 | 0 | 0 | 0 | 1 | |
| 8 | $x^{16}$ | 1 | 0 | 0 | 0 | 0 | 1 | 1 | 1 | 1 | 0 | 1 | 1 | 1 | 1 | 0 | 0 | 0 | $\leftarrow R_B(x)$ |

(B) 16-BIT SHIFT MATRIX $A^{16}$

| | 15 | 14 | 13 | 12 | 11 | 10 | 9 | 8 | 7 | 6 | 5 | 4 | 3 | 2 | 1 | 0 | $R_B(x)$ | $R_{B'}(x)$ |
|---|---|---|---|---|---|---|---|---|---|---|---|---|---|---|---|---|---|---|
| 15 | 0 | 0 | 0 | 0 | 1 | 1 | 0 | 0 | 1 | 0 | 0 | 0 | 1 | 0 | 0 | 0 | 0 | 1 |
| 14 | 0 | 0 | 0 | 0 | 0 | 1 | 1 | 0 | 0 | 1 | 0 | 0 | 0 | 1 | 0 | 0 | 0 | 1 |
| 13 | 0 | 0 | 0 | 0 | 0 | 0 | 1 | 1 | 0 | 0 | 1 | 0 | 0 | 0 | 1 | 0 | 0 | 0 |
| 12 | 1 | 0 | 0 | 0 | 0 | 0 | 0 | 1 | 1 | 0 | 0 | 1 | 0 | 0 | 0 | 1 | 1 | 0 |
| 11 | 1 | 1 | 0 | 0 | 0 | 1 | 1 | 0 | 1 | 0 | 0 | 0 | 0 | 0 | 0 | 0 | 1 | 1 |
| 10 | 0 | 1 | 1 | 0 | 0 | 1 | 1 | 1 | 0 | 0 | 1 | 0 | 0 | 0 | 0 | 0 | 1 | 1 |
| 9 | 1 | 0 | 1 | 1 | 0 | 0 | 1 | 1 | 0 | 0 | 0 | 1 | 0 | 0 | 0 | 0 | 1 | 1 |
| 8 | 1 | 1 | 0 | 1 | 1 | 0 | 0 | 1 | 0 | 0 | 0 | 0 | 1 | 0 | 0 | 0 | 0 = | 1 |
| 7 | 1 | 1 | 1 | 0 | 1 | 1 | 0 | 0 | 1 | 0 | 0 | 0 | 0 | 1 | 0 | 0 | 1 | 0 |
| 6 | 0 | 1 | 1 | 1 | 0 | 1 | 1 | 0 | 0 | 1 | 0 | 0 | 0 | 0 | 1 | 0 | 1 | 1 |
| 5 | 0 | 0 | 1 | 1 | 1 | 0 | 1 | 1 | 0 | 0 | 1 | 0 | 0 | 0 | 0 | 1 | 1 | 1 |
| 4 | 1 | 0 | 0 | 1 | 0 | 0 | 1 | 0 | 0 | 0 | 0 | 0 | 0 | 0 | 0 | 0 | 1 | 0 |
| 3 | 1 | 1 | 0 | 0 | 1 | 0 | 0 | 1 | 0 | 0 | 0 | 0 | 0 | 0 | 0 | 0 | 0 | 0 |
| 2 | 0 | 1 | 1 | 0 | 0 | 1 | 0 | 0 | 1 | 0 | 0 | 0 | 1 | 0 | 0 | 0 | 0 | 0 |
| 1 | 0 | 0 | 1 | 1 | 0 | 0 | 1 | 0 | 0 | 0 | 0 | 0 | 0 | 1 | 0 | 0 | 0 | 1 |
| 0 | 0 | 0 | 0 | 1 | 1 | 0 | 0 | 0 | 0 | 0 | 1 | 0 | 0 | 0 | 1 | 0 | 0 | 1 |

| TIME | INPUT | | REGISTER SR | | | | | | | | | | | | | | | | |
|---|---|---|---|---|---|---|---|---|---|---|---|---|---|---|---|---|---|---|---|
| | | | 0 | 1 | 2 | 3 | 4 | 5 | 6 | 7 | 8 | 9 | 10 | 11 | 12 | 13 | 14 | 15 |
| | | | 0 | 0 | 0 | 0 | 0 | 0 | 0 | 0 | 0 | 0 | 0 | 0 | 0 | 0 | 0 | 0 |
| 1 | $x^{15}$ | 1 | 1 | 0 | 0 | 0 | 0 | 1 | 0 | 0 | 0 | 0 | 0 | 1 | 0 | 0 | 0 |
| 2 | $x^{14}$ | 1 | 1 | 1 | 0 | 0 | 0 | 1 | 1 | 0 | 0 | 0 | 0 | 1 | 1 | 0 | 0 |
| 3 | $x^{13}$ | 1 | 1 | 1 | 1 | 0 | 0 | 1 | 1 | 1 | 0 | 0 | 0 | 1 | 1 | 1 | 0 |
| 4 | $x^{12}$ | 1 | 1 | 1 | 1 | 1 | 0 | 1 | 1 | 1 | 1 | 0 | 0 | 1 | 1 | 1 | 1 |
| 5 | $x^{11}$ | 1 | 0 | 1 | 1 | 1 | 1 | 0 | 1 | 1 | 1 | 1 | 0 | 0 | 0 | 1 | 1 | 1 |
| 6 | $x^{10}$ | 1 | 0 | 0 | 1 | 1 | 1 | 1 | 0 | 1 | 1 | 1 | 1 | 0 | 0 | 0 | 1 | 1 |
| 7 | $x^{9}$ | 1 | 0 | 0 | 0 | 1 | 1 | 1 | 1 | 0 | 1 | 1 | 1 | 1 | 0 | 0 | 0 | 1 |
| 8 | $x^{8}$ | 1 | 0 | 0 | 0 | 0 | 1 | 1 | 1 | 1 | 0 | 1 | 1 | 1 | 1 | 0 | 0 | 0 | ← $R_C(x)$ |

(B) 8-BIT SHIFT MATRIX $A^8$ $R_C(x) \cdot R_C'(x)$ shown at right, with the matrix multiplication illustrated.

FIG. 13

| TIME | INPUT | | REGISTER SR | | | | | | | | | | | | | | | | |
|---|---|---|---|---|---|---|---|---|---|---|---|---|---|---|---|---|---|---|---|
| | | | 0 | 1 | 2 | 3 | 4 | 5 | 6 | 7 | 8 | 9 | 10 | 11 | 12 | 13 | 14 | 15 |
| | | | 0 | 0 | 0 | 0 | 0 | 0 | 0 | 0 | 0 | 0 | 0 | 0 | 0 | 0 | 0 | 0 |
| 1 | $x^{7}$ | 1 | 1 | 0 | 0 | 0 | 0 | 1 | 0 | 0 | 0 | 0 | 0 | 1 | 0 | 0 | 0 |
| 2 | $x^{6}$ | 1 | 1 | 1 | 0 | 0 | 0 | 1 | 1 | 0 | 0 | 0 | 0 | 1 | 1 | 0 | 0 |
| 3 | $x^{5}$ | 1 | 1 | 1 | 1 | 0 | 0 | 1 | 1 | 1 | 0 | 0 | 0 | 1 | 1 | 1 | 0 |
| 4 | $x^{4}$ | 1 | 1 | 1 | 1 | 1 | 0 | 1 | 1 | 1 | 1 | 0 | 0 | 1 | 1 | 1 | 1 |
| 5 | $x^{3}$ | 1 | 0 | 1 | 1 | 1 | 1 | 0 | 1 | 1 | 1 | 1 | 0 | 0 | 0 | 1 | 1 | 1 |
| 6 | $x^{2}$ | 1 | 0 | 0 | 1 | 1 | 1 | 1 | 0 | 1 | 1 | 1 | 1 | 0 | 0 | 0 | 1 | 1 |
| 7 | $x^{1}$ | 1 | 0 | 0 | 0 | 1 | 1 | 1 | 1 | 0 | 1 | 1 | 1 | 1 | 0 | 0 | 0 | 1 |
| 8 | $x^{0}$ | 1 | 0 | 0 | 0 | 0 | 1 | 1 | 1 | 1 | 0 | 1 | 1 | 1 | 1 | 0 | 0 | 0 | ← $R_D(x)$ |

FIG. 14

| REGISTER | | | | | | | | | | | | | | | | |
|---|---|---|---|---|---|---|---|---|---|---|---|---|---|---|---|---|
| 0 | 1 | 2 | 3 | 4 | 5 | 6 | 7 | 8 | 9 | 10 | 11 | 12 | 13 | 14 | 15 | |
| 1 | 1 | 0 | 0 | 0 | 1 | 0 | 1 | 1 | 0 | 1 | 0 | 0 | 1 | 0 | ← $R_A'(x)$ |
| 1 | 1 | 0 | 0 | 0 | 1 | 1 | 0 | 1 | 1 | 1 | 1 | 0 | 0 | 1 | 1 | ← $R_B'(x)$ |
| 1 | 1 | 1 | 1 | 0 | 1 | 1 | 1 | 1 | 1 | 0 | 0 | 0 | 0 | 0 | 0 | ← $R_C'(x)$ |
| 0 | 0 | 0 | 0 | 1 | 1 | 1 | 1 | 0 | 1 | 1 | 1 | 1 | 0 | 0 | 0 | ← $R_D(x) = R_D'(x)$ |
| 1 | 1 | 1 | 1 | 0 | 0 | 1 | 1 | 1 | 0 | 0 | 1 | 1 | 0 | 0 | 1 | ← $R_A'(x) \oplus R_B'(x) \oplus R_C'(x) \oplus R_D(x) =$ CRC PARITY |

FIG. 16

(A) Register SR shift table:

| TIME | INPUT | 0 | 1 | 2 | 3 | 4 | 5 | 6 | 7 | 8 | 9 | 10 | 11 | 12 | 13 | 14 | 15 |
|---|---|---|---|---|---|---|---|---|---|---|---|---|---|---|---|---|---|
| | | 0 | 0 | 0 | 0 | 0 | 0 | 0 | 0 | 0 | 0 | 0 | 0 | 0 | 0 | 0 | 0 |
| 1 | $x^{47}$ 1 | 1 | 0 | 0 | 0 | 0 | 1 | 0 | 0 | 0 | 0 | 0 | 1 | 0 | 0 | 0 | |
| 2 | $x^{46}$ 1 | 1 | 1 | 0 | 0 | 0 | 1 | 1 | 0 | 0 | 0 | 0 | 1 | 1 | 0 | 0 | |
| 3 | $x^{45}$ 1 | 1 | 1 | 1 | 0 | 0 | 1 | 1 | 1 | 0 | 0 | 0 | 1 | 1 | 1 | 0 | |
| 4 | $x^{44}$ 1 | 1 | 1 | 1 | 1 | 0 | 1 | 1 | 1 | 1 | 0 | 0 | 1 | 1 | 1 | 1 | |
| 5 | $x^{43}$ 1 | 0 | 1 | 1 | 1 | 1 | 0 | 1 | 1 | 1 | 1 | 0 | 0 | 1 | 1 | 1 | 1 |
| 6 | $x^{42}$ 1 | 0 | 0 | 1 | 1 | 1 | 1 | 0 | 1 | 1 | 1 | 1 | 0 | 0 | 1 | 1 | 1 |
| 7 | $x^{41}$ 1 | 0 | 0 | 0 | 1 | 1 | 1 | 1 | 0 | 1 | 1 | 1 | 1 | 0 | 0 | 0 | 1 |
| 8 | $x^{40}$ 1 | 0 | 0 | 0 | 0 | 1 | 1 | 1 | 1 | 0 | 1 | 1 | 1 | 1 | 0 | 0 | 0 | ← $R_A(x)$ |

(B) 24-bit shift matrix $A^{24}$, with columns $R_A(x)$ and $R_{A'}(x)$ — relation $0 =$ between $R_A(x)$ and $R_{A'}(x)$.

FIG. 17

(A) Register SR shift table for times 1–8 with inputs $x^{39}$ through $x^{32}$, all input bits = 1, resulting in $R_B(x)$.

(B) 16-bit shift matrix $A^{16}$, with columns $R_B(x)$ and $R_{B'}(x)$ — relation $0 =$ between $R_B(x)$ and $R_{B'}(x)$.

| TIME | INPUT | REGISTER SR 0 | 1 | 2 | 3 | 4 | 5 | 6 | 7 | 8 | 9 | 10 | 11 | 12 | 13 | 14 | 15 |
|---|---|---|---|---|---|---|---|---|---|---|---|---|---|---|---|---|---|
| | | 0 | 0 | 0 | 0 | 0 | 0 | 0 | 0 | 0 | 0 | 0 | 0 | 0 | 0 | 0 | 0 |
| 1 | $x^{47}$ 1 | 1 | 0 | 0 | 0 | 0 | 1 | 0 | 0 | 0 | 0 | 0 | 0 | 1 | 0 | 0 | 0 |
| 2 | $x^{46}$ 1 | 1 | 1 | 0 | 0 | 0 | 1 | 1 | 0 | 0 | 0 | 0 | 0 | 1 | 1 | 0 | 0 |
| 3 | $x^{45}$ 1 | 1 | 1 | 1 | 0 | 0 | 1 | 1 | 1 | 0 | 0 | 0 | 0 | 1 | 1 | 1 | 0 |
| 4 | $x^{44}$ 1 | 1 | 1 | 1 | 1 | 0 | 1 | 1 | 1 | 1 | 0 | 0 | 0 | 1 | 1 | 1 | 1 |
| 5 | $x^{43}$ 1 | 0 | 1 | 1 | 1 | 1 | 0 | 1 | 1 | 1 | 1 | 0 | 0 | 0 | 1 | 1 | 1 |
| 6 | $x^{42}$ 1 | 0 | 0 | 1 | 1 | 1 | 1 | 0 | 1 | 1 | 1 | 1 | 0 | 0 | 0 | 1 | 1 |
| 7 | $x^{41}$ 1 | 0 | 0 | 0 | 1 | 1 | 1 | 1 | 0 | 1 | 1 | 1 | 1 | 0 | 0 | 0 | 1 |
| 8 | $x^{40}$ 1 | 0 | 0 | 0 | 0 | 1 | 1 | 1 | 1 | 0 | 1 | 1 | 1 | 1 | 0 | 0 | 0 | ←$R_A(x)$ (B) 40-BIT SHIFT MATRIX $A^{40}$    $R_A(x)$   $R_{A'}(x)$

| | 15 | 14 | 13 | 12 | 11 | 10 | 9 | 8 | 7 | 6 | 5 | 4 | 3 | 2 | 1 | 0 | | |
|---|---|---|---|---|---|---|---|---|---|---|---|---|---|---|---|---|---|---|
| 15 | 0 | 0 | 0 | 0 | 0 | 1 | 0 | 1 | 1 | 0 | 0 | 1 | 1 | 1 | 1 | 0 | 0 | 0 |
| 14 | 0 | 0 | 0 | 0 | 0 | 0 | 1 | 0 | 1 | 1 | 0 | 0 | 1 | 1 | 1 | 1 | 0 | 1 |
| 13 | 1 | 0 | 0 | 0 | 0 | 0 | 1 | 0 | 1 | 1 | 0 | 0 | 0 | 1 | 1 | 1 | 0 | 0 |
| 12 | 0 | 1 | 0 | 0 | 0 | 0 | 0 | 1 | 0 | 1 | 1 | 0 | 0 | 0 | 1 | 1 | 1 | 1 |
| 11 | 0 | 0 | 1 | 0 | 0 | 1 | 0 | 1 | 1 | 1 | 0 | 1 | 0 | 1 | 1 | 0 | 1 | 0 |
| 10 | 0 | 0 | 0 | 1 | 0 | 0 | 1 | 0 | 1 | 1 | 1 | 0 | 1 | 0 | 1 | 1 | 1 | 1 |
| 9 | 1 | 0 | 0 | 0 | 1 | 0 | 0 | 1 | 0 | 1 | 1 | 1 | 0 | 1 | 0 | 1 | 1 | 0 |
| 8 | 0 | 1 | 0 | 0 | 0 | 1 | 0 | 0 | 1 | 0 | 1 | 1 | 1 | 0 | 1 | 0 | 0 = 0 |
| 7 | 0 | 0 | 1 | 0 | 0 | 0 | 1 | 0 | 0 | 1 | 0 | 1 | 1 | 1 | 0 | 1 | 1 | 1 |
| 6 | 1 | 1 | 0 | 1 | 0 | 0 | 0 | 1 | 0 | 0 | 1 | 0 | 1 | 1 | 1 | 0 | 1 | 1 |
| 5 | 0 | 1 | 1 | 0 | 1 | 0 | 0 | 0 | 1 | 0 | 0 | 1 | 0 | 1 | 1 | 1 | 1 | 1 |
| 4 | 1 | 0 | 1 | 1 | 0 | 0 | 0 | 1 | 1 | 0 | 0 | 0 | 1 | 0 | 1 | 1 | 1 | 1 |
| 3 | 0 | 1 | 0 | 1 | 1 | 0 | 0 | 0 | 1 | 1 | 0 | 0 | 0 | 1 | 0 | 1 | 0 | 1 |
| 2 | 0 | 0 | 1 | 0 | 1 | 1 | 0 | 0 | 0 | 1 | 1 | 0 | 0 | 0 | 1 | 0 | 0 | 1 |
| 1 | 0 | 0 | 0 | 1 | 0 | 1 | 1 | 0 | 0 | 0 | 1 | 1 | 0 | 0 | 0 | 1 | 0 | 0 |
| 0 | 0 | 0 | 0 | 0 | 1 | 0 | 1 | 1 | 0 | 0 | 0 | 1 | 1 | 0 | 0 | 0 | 0 | 1 |

| TIME | INPUT | REGISTER SR 0 | 1 | 2 | 3 | 4 | 5 | 6 | 7 | 8 | 9 | 10 | 11 | 12 | 13 | 14 | 15 |
|---|---|---|---|---|---|---|---|---|---|---|---|---|---|---|---|---|---|
| | | 0 | 0 | 0 | 0 | 0 | 0 | 0 | 0 | 0 | 0 | 0 | 0 | 0 | 0 | 0 | 0 |
| 1 | $x^{39}$ 1 | 1 | 0 | 0 | 0 | 0 | 1 | 0 | 0 | 0 | 0 | 0 | 0 | 1 | 0 | 0 | 0 |
| 2 | $x^{38}$ 1 | 1 | 1 | 0 | 0 | 0 | 1 | 1 | 0 | 0 | 0 | 0 | 0 | 1 | 1 | 0 | 0 |
| 3 | $x^{37}$ 1 | 1 | 1 | 1 | 0 | 0 | 1 | 1 | 1 | 0 | 0 | 0 | 0 | 1 | 1 | 1 | 0 |
| 4 | $x^{36}$ 1 | 1 | 1 | 1 | 1 | 0 | 1 | 1 | 1 | 1 | 0 | 0 | 0 | 1 | 1 | 1 | 1 |
| 5 | $x^{35}$ 1 | 0 | 1 | 1 | 1 | 1 | 0 | 1 | 1 | 1 | 1 | 0 | 0 | 0 | 1 | 1 | 1 |
| 6 | $x^{34}$ 1 | 0 | 0 | 1 | 1 | 1 | 1 | 0 | 1 | 1 | 1 | 1 | 0 | 0 | 0 | 1 | 1 |
| 7 | $x^{33}$ 1 | 0 | 0 | 0 | 1 | 1 | 1 | 1 | 0 | 1 | 1 | 1 | 1 | 0 | 0 | 0 | 1 |
| 8 | $x^{32}$ 1 | 0 | 0 | 0 | 0 | 1 | 1 | 1 | 1 | 0 | 1 | 1 | 1 | 1 | 0 | 0 | 0 | ←$R_B(x)$ (B) 32-BIT SHIFT MATRIX $A^{32}$    $R_B(x)$   $R_{B'}(x)$

| | 15 | 14 | 13 | 12 | 11 | 10 | 9 | 8 | 7 | 6 | 5 | 4 | 3 | 2 | 1 | 0 | | |
|---|---|---|---|---|---|---|---|---|---|---|---|---|---|---|---|---|---|---|
| 15 | 1 | 0 | 0 | 0 | 1 | 1 | 1 | 0 | 0 | 0 | 1 | 0 | 1 | 1 | 0 | 0 | 0 | 0 |
| 14 | 1 | 1 | 0 | 0 | 0 | 1 | 1 | 1 | 0 | 0 | 0 | 1 | 0 | 1 | 1 | 0 | 0 | 1 |
| 13 | 0 | 1 | 1 | 0 | 0 | 0 | 1 | 1 | 1 | 0 | 0 | 0 | 1 | 0 | 1 | 1 | 0 | 0 |
| 12 | 1 | 0 | 1 | 1 | 0 | 0 | 0 | 1 | 1 | 1 | 0 | 0 | 0 | 1 | 0 | 1 | 1 | 1 |
| 11 | 1 | 1 | 0 | 1 | 0 | 1 | 0 | 1 | 1 | 0 | 0 | 0 | 1 | 1 | 1 | 0 | 1 | 0 |
| 10 | 1 | 1 | 1 | 0 | 1 | 0 | 1 | 0 | 1 | 1 | 0 | 0 | 1 | 1 | 1 | 1 | 1 | 0 |
| 9 | 0 | 1 | 1 | 1 | 0 | 1 | 0 | 1 | 0 | 1 | 1 | 0 | 0 | 1 | 1 | 1 | 1 | 1 |
| 8 | 1 | 0 | 1 | 1 | 1 | 0 | 1 | 0 | 1 | 0 | 1 | 1 | 0 | 0 | 0 | 1 | 0 = 0 |
| 7 | 0 | 1 | 0 | 1 | 1 | 1 | 0 | 1 | 0 | 1 | 0 | 1 | 1 | 0 | 0 | 0 | 0 | 1 |
| 6 | 0 | 0 | 1 | 0 | 1 | 1 | 1 | 0 | 1 | 0 | 1 | 0 | 1 | 1 | 1 | 0 | 1 | 0 |
| 5 | 1 | 0 | 0 | 1 | 0 | 1 | 1 | 1 | 0 | 1 | 0 | 1 | 1 | 0 | 1 | 1 | 1 | 1 |
| 4 | 1 | 1 | 0 | 0 | 1 | 0 | 1 | 1 | 1 | 0 | 0 | 0 | 0 | 0 | 0 | 1 | 1 | 0 |
| 3 | 1 | 1 | 1 | 0 | 0 | 0 | 1 | 0 | 1 | 1 | 0 | 0 | 0 | 0 | 0 | 0 | 0 | 1 |
| 2 | 0 | 1 | 1 | 1 | 0 | 0 | 0 | 1 | 0 | 1 | 1 | 0 | 0 | 0 | 0 | 0 | 0 | 1 |
| 1 | 0 | 0 | 1 | 1 | 0 | 0 | 0 | 0 | 1 | 1 | 1 | 0 | 0 | 0 | 0 | 0 | 0 | 0 |
| 0 | 0 | 0 | 0 | 1 | 1 | 1 | 0 | 0 | 0 | 1 | 1 | 1 | 0 | 0 | 0 | 0 | 0 | 1 |

| TIME | INPUT | | REGISTER SR | | | | | | | | | | | | | | | |
|---|---|---|---|---|---|---|---|---|---|---|---|---|---|---|---|---|---|---|
| | | | 0 | 1 | 2 | 3 | 4 | 5 | 6 | 7 | 8 | 9 | 10 | 11 | 12 | 13 | 14 | 15 |
| | | | 0 | 0 | 0 | 0 | 0 | 0 | 0 | 0 | 0 | 0 | 0 | 0 | 0 | 0 | 0 | 0 |
| 1 | $x^{31}$ | 1 | 1 | 0 | 0 | 0 | 0 | 1 | 0 | 0 | 0 | 0 | 0 | 0 | 1 | 0 | 0 | 0 |
| 2 | $x^{30}$ | 1 | 1 | 1 | 0 | 0 | 0 | 1 | 1 | 0 | 0 | 0 | 0 | 0 | 1 | 1 | 0 | 0 |
| 3 | $x^{29}$ | 1 | 1 | 1 | 1 | 0 | 0 | 1 | 1 | 1 | 0 | 0 | 0 | 0 | 1 | 1 | 1 | 0 |
| 4 | $x^{28}$ | 1 | 1 | 1 | 1 | 1 | 0 | 1 | 1 | 1 | 1 | 0 | 0 | 0 | 1 | 1 | 1 | 1 |
| 5 | $x^{27}$ | 1 | 0 | 1 | 1 | 1 | 1 | 0 | 1 | 1 | 1 | 1 | 0 | 0 | 0 | 1 | 1 | 1 |
| 6 | $x^{26}$ | 1 | 0 | 0 | 1 | 1 | 1 | 1 | 0 | 1 | 1 | 1 | 1 | 0 | 0 | 0 | 1 | 1 |
| 7 | $x^{25}$ | 1 | 0 | 0 | 0 | 1 | 1 | 1 | 1 | 0 | 1 | 1 | 1 | 1 | 0 | 0 | 0 | 1 |
| 8 | $x^{24}$ | 1 | 0 | 0 | 0 | 0 | 1 | 1 | 1 | 1 | 0 | 1 | 1 | 1 | 1 | 0 | 0 | 0 | ← $R_C(x)$ (B)

24-BIT SHIFT MATRIX $A^{24}$     $R_C(x)$  $R_{C'}(x)$

| | 15 | 14 | 13 | 12 | 11 | 10 | 9 | 8 | 7 | 6 | 5 | 4 | 3 | 2 | 1 | 0 | ↓ | ↓ |
|---|---|---|---|---|---|---|---|---|---|---|---|---|---|---|---|---|---|---|
| 15 | 0 | 0 | 1 | 0 | 1 | 1 | 0 | 0 | 0 | 0 | 0 | 1 | 1 | 0 | 0 | 0 | 0 | 0 |
| 14 | 0 | 0 | 0 | 1 | 0 | 1 | 1 | 0 | 0 | 0 | 0 | 0 | 1 | 1 | 0 | 0 | 0 | 1 |
| 13 | 1 | 0 | 0 | 0 | 1 | 0 | 1 | 1 | 0 | 0 | 0 | 0 | 0 | 1 | 1 | 0 | 0 | 0 |
| 12 | 1 | 1 | 0 | 0 | 0 | 1 | 0 | 1 | 1 | 0 | 0 | 0 | 0 | 0 | 1 | 1 | 1 | 0 |
| 11 | 1 | 1 | 0 | 0 | 1 | 1 | 1 | 0 | 1 | 1 | 0 | 0 | 1 | 1 | 0 | 0 | 1 | 1 |
| 10 | 0 | 1 | 1 | 0 | 0 | 1 | 1 | 1 | 0 | 1 | 1 | 0 | 0 | 1 | 1 | 0 | 1 | 0 |
| 9 | 1 | 0 | 1 | 1 | 0 | 0 | 1 | 1 | 1 | 0 | 1 | 1 | 0 | 0 | 1 | 1 | | |
| 8 | 1 | 1 | 0 | 1 | 1 | 0 | 0 | 1 | 1 | 1 | 0 | 1 | 1 | 0 | 0 | 1 | 0 = | 1 |
| 7 | 0 | 1 | 1 | 0 | 1 | 1 | 0 | 0 | 1 | 1 | 1 | 0 | 1 | 1 | 0 | 0 | 1 | 1 |
| 6 | 1 | 0 | 1 | 1 | 0 | 1 | 1 | 0 | 0 | 1 | 1 | 1 | 0 | 1 | 1 | 0 | 1 | 0 |
| 5 | 0 | 1 | 0 | 1 | 1 | 0 | 1 | 1 | 0 | 0 | 1 | 1 | 1 | 0 | 1 | 1 | 0 | 1 |
| 4 | 1 | 0 | 0 | 0 | 0 | 0 | 1 | 1 | 0 | 0 | 0 | 1 | 0 | 0 | 0 | 1 | 1 | 0 |
| 3 | 1 | 1 | 0 | 0 | 0 | 0 | 0 | 1 | 1 | 0 | 0 | 1 | 0 | 0 | 0 | 0 | 0 | 0 |
| 2 | 0 | 1 | 1 | 0 | 0 | 0 | 0 | 0 | 1 | 1 | 0 | 0 | 1 | 0 | 0 | 0 | 0 | 0 |
| 1 | 1 | 0 | 1 | 1 | 0 | 0 | 0 | 0 | 0 | 1 | 1 | 0 | 0 | 1 | 0 | 0 | 0 | 1 |
| 0 | 0 | 1 | 0 | 1 | 1 | 0 | 0 | 0 | 0 | 0 | 1 | 1 | 0 | 0 | 0 | 1 | 0 | 1 |

| TIME | INPUT | | REGISTER SR | | | | | | | | | | | | | | | |
|---|---|---|---|---|---|---|---|---|---|---|---|---|---|---|---|---|---|---|
| | | | 0 | 1 | 2 | 3 | 4 | 5 | 6 | 7 | 8 | 9 | 10 | 11 | 12 | 13 | 14 | 15 |
| | | | 0 | 0 | 0 | 0 | 0 | 0 | 0 | 0 | 0 | 0 | 0 | 0 | 0 | 0 | 0 | 0 |
| 1 | $x^{23}$ | 1 | 1 | 0 | 0 | 0 | 0 | 1 | 0 | 0 | 0 | 0 | 0 | 0 | 1 | 0 | 0 | 0 |
| 2 | $x^{22}$ | 1 | 1 | 1 | 0 | 0 | 0 | 1 | 1 | 0 | 0 | 0 | 0 | 0 | 1 | 1 | 0 | 0 |
| 3 | $x^{21}$ | 1 | 1 | 1 | 1 | 0 | 0 | 1 | 1 | 1 | 0 | 0 | 0 | 0 | 1 | 1 | 1 | 0 |
| 4 | $x^{20}$ | 1 | 1 | 1 | 1 | 1 | 0 | 1 | 1 | 1 | 1 | 0 | 0 | 0 | 1 | 1 | 1 | 1 |
| 5 | $x^{19}$ | 1 | 0 | 1 | 1 | 1 | 1 | 0 | 1 | 1 | 1 | 1 | 0 | 0 | 0 | 1 | 1 | 1 |
| 6 | $x^{18}$ | 1 | 0 | 0 | 1 | 1 | 1 | 1 | 0 | 1 | 1 | 1 | 1 | 0 | 0 | 0 | 1 | 1 |
| 7 | $x^{17}$ | 1 | 0 | 0 | 0 | 1 | 1 | 1 | 1 | 0 | 1 | 1 | 1 | 1 | 0 | 0 | 0 | 1 |
| 8 | $x^{16}$ | 1 | 0 | 0 | 0 | 0 | 1 | 1 | 1 | 1 | 0 | 1 | 1 | 1 | 1 | 0 | 0 | 0 | ← $R_D(x)$ (B)

16-BIT SHIFT MATRIX $A^{16}$     $R_D(x)$  $R_{D'}(x)$

| | 15 | 14 | 13 | 12 | 11 | 10 | 9 | 8 | 7 | 6 | 5 | 4 | 3 | 2 | 1 | 0 | ↓ | ↓ |
|---|---|---|---|---|---|---|---|---|---|---|---|---|---|---|---|---|---|---|
| 15 | 0 | 0 | 0 | 0 | 1 | 1 | 0 | 0 | 1 | 0 | 0 | 0 | 1 | 0 | 0 | 0 | 0 | 1 |
| 14 | 0 | 0 | 0 | 0 | 0 | 1 | 1 | 0 | 0 | 1 | 0 | 0 | 0 | 1 | 0 | 0 | 0 | 1 |
| 13 | 0 | 0 | 0 | 0 | 0 | 0 | 1 | 1 | 0 | 0 | 1 | 0 | 0 | 0 | 1 | 0 | 0 | 0 |
| 12 | 1 | 0 | 0 | 0 | 0 | 0 | 0 | 1 | 1 | 0 | 0 | 1 | 0 | 0 | 0 | 1 | 1 | 0 |
| 11 | 1 | 1 | 0 | 0 | 1 | 1 | 0 | 0 | 1 | 0 | 0 | 0 | 0 | 0 | 0 | 0 | 1 | 1 |
| 10 | 0 | 1 | 1 | 0 | 0 | 1 | 1 | 0 | 0 | 1 | 0 | 0 | 0 | 0 | 0 | 0 | 1 | 1 |
| 9 | 1 | 0 | 1 | 1 | 0 | 0 | 1 | 1 | 0 | 0 | 1 | 0 | 0 | 0 | 0 | 0 | 1 | 1 |
| 8 | 1 | 1 | 0 | 1 | 1 | 0 | 0 | 1 | 1 | 0 | 0 | 1 | 0 | 0 | 0 | 0 | 0 = | 1 |
| 7 | 1 | 1 | 1 | 0 | 1 | 1 | 0 | 0 | 1 | 1 | 0 | 0 | 1 | 0 | 0 | 0 | 1 | 0 |
| 6 | 0 | 1 | 1 | 1 | 0 | 1 | 1 | 0 | 0 | 1 | 1 | 0 | 0 | 1 | 0 | 0 | 1 | 1 |
| 5 | 0 | 0 | 1 | 1 | 1 | 0 | 1 | 1 | 0 | 0 | 1 | 1 | 0 | 0 | 1 | 1 | 1 | 1 |
| 4 | 1 | 0 | 0 | 1 | 0 | 0 | 1 | 0 | 1 | 0 | 0 | 1 | 1 | 0 | 0 | 0 | 1 | 0 |
| 3 | 1 | 1 | 0 | 0 | 1 | 0 | 0 | 0 | 0 | 1 | 0 | 0 | 1 | 1 | 0 | 0 | 0 | 0 |
| 2 | 0 | 1 | 1 | 0 | 0 | 1 | 0 | 0 | 1 | 0 | 1 | 0 | 0 | 1 | 0 | 0 | 0 | 0 |
| 1 | 0 | 0 | 1 | 1 | 0 | 0 | 1 | 0 | 0 | 0 | 0 | 1 | 0 | 0 | 1 | 0 | 0 | 1 |
| 0 | 0 | 0 | 0 | 1 | 1 | 0 | 0 | 1 | 0 | 0 | 0 | 1 | 0 | 0 | 0 | 1 | 0 | 1 |

| TIME | INPUT | | REGISTER SR | | | | | | | | | | | | | | | | |
|---|---|---|---|---|---|---|---|---|---|---|---|---|---|---|---|---|---|---|
| | | | 0 | 1 | 2 | 3 | 4 | 5 | 6 | 7 | 8 | 9 | 10 | 11 | 12 | 13 | 14 | 15 |
| | | | 0 | 0 | 0 | 0 | 0 | 0 | 0 | 0 | 0 | 0 | 0 | 0 | 0 | 0 | 0 | 0 |
| 1 | $x^{15}$ | 1 | 1 | 0 | 0 | 0 | 0 | 1 | 0 | 0 | 0 | 0 | 0 | 1 | 0 | 0 | 0 |
| 2 | $x^{14}$ | 0 | 0 | 1 | 0 | 0 | 0 | 0 | 1 | 0 | 0 | 0 | 0 | 0 | 1 | 0 | 0 |
| 3 | $x^{13}$ | 0 | 0 | 0 | 1 | 0 | 0 | 0 | 0 | 1 | 0 | 0 | 0 | 0 | 0 | 1 | 0 |
| 4 | $x^{12}$ | 1 | 1 | 0 | 0 | 1 | 0 | 1 | 0 | 0 | 1 | 0 | 0 | 0 | 1 | 0 | 0 | 1 |
| 5 | $x^{11}$ | 1 | 0 | 1 | 0 | 0 | 1 | 0 | 1 | 0 | 0 | 1 | 0 | 0 | 0 | 1 | 0 | 0 |
| 6 | $x^{10}$ | 0 | 0 | 0 | 1 | 0 | 0 | 1 | 0 | 1 | 0 | 0 | 1 | 0 | 0 | 0 | 1 | 0 |
| 7 | $x^{9}$ | 0 | 0 | 0 | 0 | 1 | 0 | 0 | 1 | 0 | 1 | 0 | 0 | 1 | 0 | 0 | 0 | 1 |
| 8 | $x^{8}$ | 1 | 0 | 0 | 0 | 0 | 1 | 0 | 0 | 1 | 0 | 1 | 0 | 0 | 1 | 0 | 0 | 0 | ← $R_E(x)$ |

(B)

8-BIT SHIFT MATRIX $A^8$

| | 15 | 14 | 13 | 12 | 11 | 10 | 9 | 8 | 7 | 6 | 5 | 4 | 3 | 2 | 1 | 0 | $R_E(x)$ | $R_{E'}(x)$ |
|---|---|---|---|---|---|---|---|---|---|---|---|---|---|---|---|---|---|---|
| 15 | 1 | 0 | 0 | 0 | 1 | 0 | 0 | 1 | 0 | 0 | 0 | 0 | 0 | 0 | 0 | 0 | 0 | 1 |
| 14 | 0 | 1 | 0 | 0 | 0 | 1 | 0 | 0 | 1 | 0 | 0 | 0 | 0 | 0 | 0 | 0 | 0 | 0 |
| 13 | 0 | 0 | 1 | 0 | 0 | 0 | 1 | 0 | 0 | 1 | 0 | 0 | 0 | 0 | 0 | 0 | 0 | 1 |
| 12 | 1 | 0 | 0 | 1 | 0 | 0 | 0 | 1 | 0 | 0 | 1 | 0 | 0 | 0 | 0 | 0 | 1 | 0 |
| 11 | 0 | 1 | 0 | 0 | 0 | 0 | 0 | 0 | 0 | 0 | 0 | 1 | 0 | 0 | 0 | 0 | 0 | 0 |
| 10 | 0 | 0 | 1 | 0 | 0 | 0 | 0 | 0 | 0 | 0 | 0 | 0 | 1 | 0 | 0 | 0 | 0 | 0 |
| 9 | 0 | 0 | 0 | 1 | 0 | 0 | 0 | 0 | 0 | 0 | 0 | 0 | 0 | 1 | 0 | 0 | 1 | 1 |
| 8 | 1 | 0 | 0 | 0 | 1 | 0 | 0 | 0 | 0 | 0 | 0 | 0 | 0 | 0 | 0 | 1 | 0 = | 0 |
| 7 | 1 | 1 | 0 | 0 | 0 | 1 | 0 | 0 | 0 | 0 | 0 | 0 | 0 | 0 | 0 | 0 | 1 | 0 |
| 6 | 0 | 1 | 1 | 0 | 0 | 0 | 1 | 0 | 0 | 0 | 0 | 0 | 0 | 0 | 0 | 0 | 0 | 1 |
| 5 | 0 | 0 | 1 | 1 | 0 | 0 | 0 | 1 | 0 | 0 | 0 | 0 | 0 | 0 | 0 | 0 | 0 | 1 |
| 4 | 0 | 0 | 0 | 1 | 0 | 0 | 0 | 0 | 0 | 0 | 0 | 0 | 0 | 0 | 0 | 0 | 1 | 1 |
| 3 | 1 | 0 | 0 | 0 | 1 | 0 | 0 | 0 | 0 | 0 | 0 | 0 | 0 | 0 | 0 | 0 | 0 | 0 |
| 2 | 0 | 1 | 0 | 0 | 0 | 1 | 0 | 0 | 0 | 0 | 0 | 0 | 0 | 0 | 0 | 0 | 0 | 0 |
| 1 | 0 | 0 | 1 | 0 | 0 | 0 | 1 | 0 | 0 | 0 | 0 | 0 | 0 | 0 | 0 | 0 | 0 | 1 |
| 0 | 0 | 0 | 0 | 1 | 0 | 0 | 0 | 1 | 0 | 0 | 0 | 0 | 0 | 0 | 0 | 0 | 0 | 1 |

FIG. 27

| TIME | INPUT | | REGISTER SR | | | | | | | | | | | | | | | |
|---|---|---|---|---|---|---|---|---|---|---|---|---|---|---|---|---|---|
| | | | 0 | 1 | 2 | 3 | 4 | 5 | 6 | 7 | 8 | 9 | 10 | 11 | 12 | 13 | 14 | 15 |
| | | | 0 | 0 | 0 | 0 | 0 | 0 | 0 | 0 | 0 | 0 | 0 | 0 | 0 | 0 | 0 | 0 |
| 1 | $x^7$ | 1 | 1 | 0 | 0 | 0 | 0 | 1 | 0 | 0 | 0 | 0 | 0 | 1 | 0 | 0 | 0 |
| 2 | $x^6$ | 1 | 1 | 1 | 0 | 0 | 0 | 1 | 1 | 0 | 0 | 0 | 0 | 1 | 1 | 0 | 0 |
| 3 | $x^5$ | 0 | 0 | 1 | 1 | 0 | 0 | 0 | 1 | 1 | 0 | 0 | 0 | 0 | 1 | 1 | 0 |
| 4 | $x^4$ | 0 | 0 | 0 | 1 | 1 | 0 | 0 | 0 | 1 | 1 | 0 | 0 | 0 | 0 | 1 | 1 |
| 5 | $x^3$ | 1 | 0 | 0 | 0 | 1 | 1 | 0 | 0 | 1 | 1 | 0 | 0 | 0 | 0 | 0 | 1 |
| 6 | $x^2$ | 1 | 0 | 0 | 0 | 0 | 1 | 1 | 0 | 0 | 1 | 1 | 0 | 0 | 0 | 0 | 0 |
| 7 | $x^1$ | 1 | 1 | 0 | 0 | 0 | 0 | 1 | 0 | 0 | 0 | 1 | 1 | 0 | 0 | 0 | 0 |
| 8 | $x^0$ | 1 | 1 | 1 | 0 | 0 | 0 | 1 | 0 | 1 | 0 | 0 | 0 | 1 | 0 | 1 | 0 | 0 | ← $R_F(x) = R_{F'}(x)$ |

FIG. 28

| REGISTER | | | | | | | | | | | | | | | | | |
|---|---|---|---|---|---|---|---|---|---|---|---|---|---|---|---|---|---|
| 0 | 1 | 2 | 3 | 4 | 5 | 6 | 7 | 8 | 9 | 10 | 11 | 12 | 13 | 14 | 15 | |
| 1 | 1 | 1 | 1 | 1 | 1 | 0 | 1 | 0 | 0 | 1 | 0 | 1 | 0 | 1 | 0 | ← $R_{A'}(x)$ |
| 1 | 1 | 1 | 1 | 0 | 1 | 0 | 1 | 0 | 1 | 1 | 0 | 1 | 0 | | | ← $R_{B'}(x)$ |
| 1 | 1 | 0 | 0 | 0 | 1 | 0 | 1 | 1 | 1 | 0 | 1 | 0 | 0 | 1 | | ← $R_{C'}(x)$ |
| 1 | 1 | 0 | 0 | 0 | 1 | 1 | 0 | 1 | 1 | 1 | 1 | 0 | 0 | 1 | 1 | ← $R_{D'}(x)$ |
| 1 | 1 | 0 | 0 | 1 | 1 | 1 | 0 | 0 | 1 | 0 | 0 | 0 | 1 | 0 | 1 | ← $R_{E'}(x)$ |
| 1 | 1 | 0 | 0 | 0 | 1 | 0 | 1 | 0 | 0 | 0 | 1 | 0 | 1 | 0 | 0 | ← $R_F(x)$ |
| 0 | 0 | 0 | 0 | 0 | 0 | 0 | 0 | 0 | 0 | 0 | 0 | 0 | 0 | 0 | 0 | ← $R_{A'} \oplus R_{B'} \oplus R_{C'} \oplus R_{D'} \oplus R_{E'} \oplus R_{F'}$ |

CALCULATE CRC OF 32-BIT ALL "1"s

| TIME | | INPUT | 0 | 1 | 2 | 3 | 4 | 5 | 6 | 7 | 8 | 9 | 10 | 11 | 12 | 13 | 14 | 15 |
|---|---|---|---|---|---|---|---|---|---|---|---|---|---|---|---|---|---|---|
| 1 | | 1 | 0 | 0 | 0 | 0 | 0 | 0 | 0 | 0 | 0 | 0 | 0 | 0 | 0 | 0 | 0 | 0 |
| 2 | $x^{47}$ | 1 | 1 | 0 | 0 | 0 | 0 | 0 | 0 | 0 | 0 | 0 | 0 | 0 | 0 | 0 | 0 | 0 |
| 3 | $x^{46}$ | 1 | 1 | 1 | 0 | 0 | 0 | 0 | 0 | 0 | 0 | 0 | 0 | 0 | 0 | 0 | 0 | 0 |
| 4 | $x^{45}$ | 1 | 1 | 1 | 1 | 0 | 0 | 0 | 0 | 0 | 0 | 0 | 0 | 0 | 0 | 0 | 0 | 0 |
| 5 | $x^{44}$ | 1 | 0 | 1 | 1 | 1 | 1 | 0 | 0 | 0 | 0 | 0 | 0 | 0 | 0 | 0 | 1 | 1 |
| 6 | $x^{43}$ | 1 | 0 | 0 | 1 | 1 | 1 | 1 | 0 | 0 | 0 | 0 | 0 | 0 | 0 | 0 | 1 | 1 |
| 7 | $x^{42}$ | 1 | 0 | 0 | 0 | 1 | 1 | 1 | 1 | 0 | 0 | 0 | 0 | 0 | 0 | 0 | 1 | 1 |
| 8 | $x^{41}$ | 1 | 0 | 0 | 0 | 0 | 1 | 1 | 1 | 1 | 0 | 0 | 0 | 0 | 0 | 0 | 1 | 1 |
| 9 | $x^{40}$ | 1 | 1 | 0 | 0 | 0 | 0 | 1 | 1 | 1 | 1 | 0 | 0 | 0 | 0 | 0 | 0 | 0 |
| 10 | $x^{39}$ | 1 | 0 | 1 | 0 | 0 | 0 | 0 | 1 | 1 | 1 | 1 | 0 | 0 | 0 | 0 | 1 | 1 |
| 11 | $x^{38}$ | 1 | 1 | 0 | 1 | 0 | 0 | 0 | 0 | 1 | 1 | 1 | 1 | 0 | 0 | 0 | 0 | 0 |
| 12 | $x^{37}$ | 1 | 1 | 1 | 0 | 1 | 0 | 0 | 0 | 0 | 1 | 1 | 1 | 1 | 0 | 0 | 1 | 1 |
| 13 | $x^{36}$ | 1 | 0 | 1 | 1 | 0 | 1 | 0 | 0 | 0 | 0 | 1 | 1 | 1 | 1 | 0 | 1 | 1 |
| 14 | $x^{35}$ | 1 | 0 | 0 | 1 | 1 | 0 | 1 | 0 | 0 | 0 | 0 | 1 | 1 | 1 | 1 | 1 | 1 |
| 15 | $x^{34}$ | 1 | 1 | 0 | 0 | 1 | 1 | 0 | 1 | 0 | 0 | 0 | 0 | 1 | 1 | 1 | 0 | 0 |
| 16 | $x^{33}$ | 1 | 0 | 1 | 0 | 0 | 1 | 1 | 0 | 1 | 0 | 0 | 0 | 0 | 1 | 1 | 1 | 1 |
| 17 | $x^{32}$ | 1 | 1 | 0 | 1 | 0 | 0 | 1 | 1 | 0 | 1 | 0 | 0 | 0 | 0 | 1 | 0 | 0 |
| 18 | $x^{31}$ | 1 | 0 | 1 | 0 | 1 | 0 | 0 | 1 | 1 | 0 | 1 | 0 | 0 | 0 | 0 | 1 | 1 |
| 19 | $x^{30}$ | 1 | 0 | 0 | 1 | 0 | 1 | 0 | 0 | 1 | 1 | 0 | 1 | 0 | 0 | 0 | 1 | 1 |
| 20 | $x^{29}$ | 1 | 0 | 0 | 0 | 1 | 0 | 1 | 0 | 0 | 1 | 1 | 0 | 1 | 0 | 0 | 1 | 1 |
| 21 | $x^{28}$ | 1 | 0 | 0 | 0 | 0 | 1 | 0 | 1 | 0 | 0 | 1 | 1 | 0 | 1 | 0 | 1 | 1 |
| 22 | $x^{27}$ | 1 | 1 | 0 | 0 | 0 | 0 | 1 | 0 | 1 | 0 | 0 | 1 | 1 | 0 | 1 | 0 | 0 |
| 23 | $x^{26}$ | 1 | 1 | 1 | 0 | 0 | 0 | 0 | 1 | 0 | 1 | 0 | 0 | 1 | 1 | 0 | 0 | 0 |
| 24 | $x^{25}$ | 1 | 0 | 1 | 1 | 0 | 0 | 0 | 0 | 1 | 0 | 1 | 0 | 0 | 1 | 1 | 1 | 1 |
| 25 | $x^{24}$ | 1 | 1 | 0 | 1 | 1 | 0 | 0 | 0 | 0 | 1 | 0 | 1 | 0 | 0 | 1 | 0 | 0 |
| 26 | $x^{23}$ | 1 | 0 | 1 | 0 | 1 | 1 | 0 | 0 | 0 | 0 | 1 | 0 | 1 | 0 | 0 | 1 | 1 |
| 27 | $x^{22}$ | 1 | 0 | 0 | 1 | 0 | 1 | 1 | 0 | 0 | 0 | 0 | 1 | 0 | 1 | 0 | 1 | 1 |
| 28 | $x^{21}$ | 1 | 1 | 0 | 0 | 1 | 0 | 1 | 1 | 0 | 0 | 0 | 0 | 1 | 0 | 1 | 0 | 0 |
| 29 | $x^{20}$ | 1 | 0 | 1 | 0 | 0 | 1 | 0 | 1 | 1 | 0 | 0 | 0 | 0 | 1 | 0 | 1 | 1 |
| 30 | $x^{19}$ | 1 | 1 | 0 | 1 | 0 | 0 | 1 | 0 | 1 | 1 | 0 | 0 | 0 | 0 | 1 | 0 | 0 |
| 31 | $x^{18}$ | 1 | 0 | 1 | 0 | 1 | 0 | 0 | 1 | 0 | 1 | 1 | 0 | 0 | 0 | 0 | 1 | 1 |
| 32 | $x^{16}$ | 1 | 1 | 0 | 1 | 0 | 1 | 0 | 0 | 1 | 0 | 1 | 1 | 0 | 0 | 0 | 0 | 0 |

← CRC PARITY R(x)

REGISTER — SR

FIG. 45 PRIOR ART

| TIME | INPUT | | Register 0 | 1 | 2 | 3 | 4 | 5 | 6 | 7 | 8 | 9 | 10 | 11 | 12 | 13 | 14 | 15 |
|---|---|---|---|---|---|---|---|---|---|---|---|---|---|---|---|---|---|---|
|  |  |  | 0 | 0 | 0 | 0 | 0 | 0 | 0 | 0 | 0 | 0 | 0 | 0 | 0 | 0 | 0 | 0 |
| 1 | x^47 | 1 | 1 | 0 | 0 | 0 | 0 | 1 | 0 | 0 | 0 | 0 | 0 | 1 | 0 | 0 | 0 | 0 |
| 2 | x^46 | 1 | 1 | 1 | 0 | 0 | 0 | 1 | 1 | 0 | 0 | 0 | 0 | 1 | 1 | 0 | 0 | 0 |
| 3 | x^45 | 1 | 1 | 1 | 1 | 0 | 0 | 1 | 1 | 1 | 0 | 0 | 0 | 1 | 1 | 1 | 0 | 0 |
| 4 | x^44 | 1 | 1 | 1 | 1 | 1 | 0 | 1 | 1 | 1 | 1 | 0 | 0 | 1 | 1 | 1 | 1 | 0 |
| 5 | x^43 | 1 | 0 | 1 | 1 | 1 | 1 | 0 | 1 | 1 | 1 | 1 | 0 | 0 | 1 | 1 | 1 | 1 |
| 6 | x^42 | 1 | 0 | 0 | 1 | 1 | 1 | 1 | 0 | 1 | 1 | 1 | 1 | 0 | 0 | 0 | 1 | 1 |
| 7 | x^41 | 1 | 0 | 0 | 0 | 1 | 1 | 1 | 1 | 0 | 1 | 1 | 1 | 1 | 0 | 0 | 0 | 1 |
| 8 | x^40 | 1 | 0 | 0 | 0 | 0 | 1 | 1 | 1 | 1 | 0 | 1 | 1 | 1 | 1 | 0 | 0 | 0 |
| 9 | x^39 | 1 | 1 | 0 | 0 | 0 | 0 | 1 | 1 | 1 | 0 | 1 | 1 | 0 | 1 | 0 | 0 | 0 |
| 10 | x^38 | 1 | 1 | 1 | 0 | 0 | 0 | 1 | 0 | 1 | 1 | 1 | 0 | 1 | 0 | 0 | 1 | 0 |
| 11 | x^37 | 1 | 1 | 1 | 1 | 0 | 0 | 1 | 1 | 0 | 1 | 1 | 1 | 0 | 0 | 0 | 0 | 1 |
| 12 | x^36 | 1 | 0 | 1 | 1 | 1 | 0 | 0 | 1 | 1 | 0 | 1 | 1 | 1 | 0 | 0 | 0 | 0 |
| 13 | x^35 | 1 | 1 | 0 | 1 | 1 | 1 | 0 | 1 | 1 | 0 | 1 | 1 | 0 | 0 | 0 | 0 | 0 |
| 14 | x^34 | 1 | 1 | 1 | 0 | 1 | 1 | 0 | 1 | 0 | 1 | 1 | 0 | 1 | 0 | 0 | 0 | 0 |
| 15 | x^33 | 1 | 1 | 1 | 1 | 0 | 1 | 0 | 0 | 1 | 0 | 1 | 1 | 0 | 0 | 0 | 0 | 0 |
| 16 | x^32 | 1 | 1 | 1 | 1 | 1 | 0 | 0 | 0 | 0 | 1 | 0 | 1 | 1 | 1 | 0 | 0 | 0 |
| 17 | x^31 | 1 | 1 | 1 | 1 | 1 | 1 | 0 | 0 | 0 | 0 | 1 | 0 | 1 | 0 | 1 | 0 | 0 |
| 18 | x^30 | 1 | 1 | 1 | 1 | 1 | 1 | 0 | 1 | 0 | 0 | 0 | 1 | 0 | 0 | 0 | 1 | 0 |
| 19 | x^29 | 1 | 1 | 1 | 1 | 1 | 1 | 0 | 0 | 1 | 0 | 0 | 0 | 1 | 1 | 0 | 0 | 1 |
| 20 | x^28 | 1 | 0 | 1 | 1 | 1 | 1 | 1 | 0 | 0 | 1 | 0 | 0 | 0 | 1 | 1 | 0 | 0 |
| 21 | x^27 | 1 | 1 | 0 | 1 | 1 | 1 | 1 | 0 | 1 | 0 | 0 | 1 | 0 | 0 | 1 | 1 | 0 |
| 22 | x^26 | 1 | 1 | 1 | 0 | 1 | 1 | 0 | 0 | 1 | 0 | 0 | 1 | 0 | 1 | 1 | 1 | 1 |
| 23 | x^25 | 1 | 0 | 1 | 1 | 0 | 1 | 1 | 0 | 0 | 1 | 0 | 0 | 1 | 0 | 1 | 1 | 1 |
| 24 | x^24 | 1 | 0 | 0 | 1 | 1 | 0 | 1 | 1 | 0 | 0 | 1 | 0 | 0 | 1 | 0 | 1 | 1 |
| 25 | x^23 | 1 | 0 | 0 | 0 | 1 | 1 | 0 | 1 | 1 | 0 | 0 | 1 | 0 | 0 | 1 | 0 | 1 |
| 26 | x^22 | 1 | 0 | 0 | 0 | 0 | 1 | 1 | 0 | 1 | 1 | 0 | 0 | 1 | 0 | 0 | 1 | 0 |
| 27 | x^21 | 1 | 1 | 0 | 0 | 0 | 0 | 1 | 0 | 1 | 1 | 1 | 0 | 0 | 0 | 0 | 0 | 1 |
| 28 | x^20 | 1 | 0 | 1 | 0 | 0 | 0 | 0 | 1 | 0 | 1 | 1 | 0 | 0 | 0 | 0 | 0 | 0 |
| 29 | x^19 | 1 | 1 | 0 | 1 | 0 | 0 | 1 | 0 | 0 | 1 | 0 | 1 | 1 | 0 | 0 | 0 | 0 |
| 30 | x^18 | 1 | 1 | 1 | 0 | 1 | 0 | 0 | 1 | 0 | 0 | 1 | 0 | 1 | 0 | 1 | 0 | 0 |
| 31 | x^17 | 1 | 1 | 1 | 1 | 0 | 1 | 1 | 1 | 1 | 0 | 0 | 1 | 0 | 0 | 0 | 1 | 0 |
| 32 | x^16 | 1 | 1 | 1 | 1 | 1 | 0 | 0 | 1 | 1 | 1 | 0 | 0 | 1 | 1 | 0 | 0 | 1 | ~R1 |
| | x^15 | 1 |
| | x^14 | 0 |
| | x^13 | 0 |
| | x^12 | 1 |
| | x^11 | 1 |
| | x^10 | 0 |
| | x^9 | 0 |
| | x^8 | 1 |
| | x^7 | 1 |
| | x^6 | 1 |
| | x^5 | 0 |
| | x^4 | 0 |
| | x^3 | 1 |
| | x^2 | 1 |
| | x^1 | 1 |
| | x^0 | 1 |

P1 → COINCIDENCE DETECTION

FIG. 46 PRIOR ART

| TIME | | INPUT | REGISTER SR 0 | 1 | 2 | 3 | 4 | 5 | 6 | 7 | 8 | 9 | 10 | 11 | 12 | 13 | 14 | 15 |
|---|---|---|---|---|---|---|---|---|---|---|---|---|---|---|---|---|---|---|
| | | | 0 | 0 | 0 | 0 | 0 | 0 | 0 | 0 | 0 | 0 | 0 | 0 | 0 | 0 | 0 | 0 |
| 1 | $x^{47}$ | 1 | 1 | 0 | 0 | 0 | 0 | 1 | 0 | 0 | 0 | 0 | 0 | 0 | 1 | 0 | 0 | 0 |
| 2 | $x^{46}$ | 1 | 1 | 1 | 0 | 0 | 0 | 1 | 1 | 0 | 0 | 0 | 0 | 0 | 1 | 1 | 0 | 0 |
| 3 | $x^{45}$ | 1 | 1 | 1 | 1 | 0 | 0 | 1 | 1 | 1 | 0 | 0 | 0 | 0 | 1 | 1 | 1 | 0 |
| 4 | $x^{44}$ | 1 | 1 | 1 | 1 | 1 | 0 | 1 | 1 | 1 | 1 | 0 | 0 | 0 | 1 | 1 | 1 | 1 |
| 5 | $x^{43}$ | 1 | 0 | 1 | 1 | 1 | 1 | 0 | 1 | 1 | 1 | 1 | 0 | 0 | 0 | 1 | 1 | 1 |
| 6 | $x^{42}$ | 1 | 0 | 0 | 1 | 1 | 1 | 1 | 0 | 1 | 1 | 1 | 1 | 0 | 0 | 0 | 1 | 1 |
| 7 | $x^{41}$ | 1 | 0 | 0 | 0 | 1 | 1 | 1 | 1 | 0 | 1 | 1 | 1 | 1 | 0 | 0 | 0 | 1 |
| 8 | $x^{40}$ | 1 | 0 | 0 | 0 | 0 | 1 | 1 | 1 | 1 | 0 | 1 | 1 | 1 | 1 | 0 | 0 | 0 |
| 9 | $x^{39}$ | 1 | 1 | 0 | 0 | 0 | 0 | 0 | 1 | 1 | 1 | 0 | 1 | 1 | 0 | 1 | 0 | 0 |
| 10 | $x^{38}$ | 1 | 1 | 1 | 0 | 0 | 0 | 1 | 0 | 1 | 1 | 1 | 0 | 1 | 0 | 0 | 1 | 0 |
| 11 | $x^{37}$ | 1 | 1 | 1 | 1 | 0 | 0 | 1 | 1 | 0 | 1 | 1 | 1 | 0 | 0 | 0 | 0 | 1 |
| 12 | $x^{36}$ | 1 | 0 | 1 | 1 | 1 | 0 | 0 | 1 | 1 | 0 | 1 | 1 | 1 | 0 | 0 | 0 | 0 |
| 13 | $x^{35}$ | 1 | 1 | 0 | 1 | 1 | 1 | 1 | 0 | 1 | 1 | 0 | 1 | 1 | 0 | 0 | 0 | 0 |
| 14 | $x^{34}$ | 1 | 1 | 1 | 0 | 1 | 1 | 0 | 1 | 0 | 1 | 1 | 0 | 1 | 0 | 0 | 0 | 0 |
| 15 | $x^{33}$ | 1 | 1 | 1 | 1 | 0 | 1 | 0 | 0 | 1 | 0 | 1 | 1 | 0 | 0 | 0 | 0 | 0 |
| 16 | $x^{32}$ | 1 | 1 | 1 | 1 | 1 | 0 | 0 | 0 | 0 | 1 | 0 | 1 | 1 | 0 | 0 | 0 | 0 |
| 17 | $x^{31}$ | 1 | 1 | 1 | 1 | 1 | 1 | 1 | 0 | 0 | 0 | 1 | 0 | 1 | 0 | 1 | 0 | 0 |
| 18 | $x^{30}$ | 1 | 1 | 1 | 1 | 1 | 1 | 0 | 1 | 0 | 0 | 0 | 1 | 0 | 0 | 0 | 1 | 0 |
| 19 | $x^{29}$ | 1 | 1 | 1 | 1 | 1 | 0 | 0 | 1 | 0 | 0 | 0 | 1 | 1 | 0 | 0 | 0 | 1 |
| 20 | $x^{28}$ | 1 | 0 | 1 | 1 | 1 | 1 | 1 | 0 | 0 | 1 | 0 | 0 | 0 | 1 | 1 | 0 | 0 |
| 21 | $x^{27}$ | 1 | 1 | 0 | 1 | 1 | 1 | 0 | 1 | 0 | 0 | 1 | 0 | 0 | 1 | 1 | 1 | 0 |
| 22 | $x^{26}$ | 1 | 1 | 1 | 0 | 1 | 1 | 0 | 0 | 1 | 0 | 0 | 1 | 0 | 1 | 1 | 1 | 1 |
| 23 | $x^{25}$ | 1 | 0 | 1 | 1 | 0 | 1 | 1 | 0 | 0 | 1 | 0 | 0 | 1 | 0 | 1 | 1 | 1 |
| 24 | $x^{24}$ | 1 | 0 | 0 | 1 | 1 | 0 | 1 | 1 | 0 | 0 | 1 | 0 | 0 | 1 | 0 | 1 | 1 |
| 25 | $x^{23}$ | 1 | 0 | 0 | 0 | 1 | 1 | 0 | 1 | 1 | 0 | 0 | 1 | 0 | 0 | 1 | 0 | 1 |
| 26 | $x^{22}$ | 1 | 0 | 0 | 0 | 0 | 1 | 1 | 0 | 1 | 1 | 0 | 0 | 1 | 0 | 0 | 1 | 0 |
| 27 | $x^{21}$ | 1 | 1 | 0 | 0 | 0 | 0 | 1 | 0 | 1 | 1 | 0 | 0 | 0 | 0 | 0 | 0 | 1 |
| 28 | $x^{20}$ | 1 | 0 | 1 | 0 | 0 | 0 | 0 | 1 | 0 | 1 | 1 | 0 | 0 | 0 | 0 | 0 | 0 |
| 29 | $x^{19}$ | 1 | 1 | 0 | 1 | 0 | 0 | 1 | 0 | 0 | 1 | 0 | 1 | 1 | 0 | 0 | 0 | 0 |
| 30 | $x^{18}$ | 1 | 1 | 1 | 0 | 1 | 0 | 1 | 1 | 0 | 0 | 1 | 0 | 1 | 0 | 1 | 0 | 0 |
| 31 | $x^{17}$ | 1 | 1 | 1 | 1 | 0 | 1 | 1 | 1 | 1 | 0 | 0 | 1 | 0 | 0 | 0 | 1 | 0 |
| 32 | $x^{16}$ | 1 | 1 | 1 | 1 | 1 | 0 | 0 | 1 | 1 | 1 | 0 | 0 | 1 | 1 | 0 | 0 | 1 |
| 33 | $x^{15}$ | 1 | 0 | 1 | 1 | 1 | 1 | 0 | 0 | 1 | 1 | 0 | 0 | 1 | 1 | 0 | 0 | 0 |
| 34 | $x^{14}$ | 0 | 0 | 0 | 1 | 1 | 1 | 1 | 0 | 0 | 1 | 1 | 0 | 0 | 1 | 1 | 0 | 0 |
| 35 | $x^{13}$ | 0 | 0 | 0 | 0 | 1 | 1 | 1 | 1 | 0 | 0 | 1 | 1 | 0 | 0 | 1 | 1 | 0 |
| 36 | $x^{12}$ | 1 | 0 | 0 | 0 | 0 | 1 | 1 | 1 | 1 | 0 | 0 | 1 | 1 | 0 | 0 | 1 | 1 |
| 37 | $x^{11}$ | 1 | 0 | 0 | 0 | 0 | 0 | 1 | 1 | 1 | 1 | 0 | 0 | 1 | 1 | 0 | 0 | 1 |
| 38 | $x^{10}$ | 0 | 0 | 0 | 0 | 0 | 0 | 0 | 1 | 1 | 1 | 1 | 0 | 0 | 1 | 1 | 1 | 0 |
| 39 | $x^{9}$ | 0 | 0 | 0 | 0 | 0 | 0 | 0 | 0 | 1 | 1 | 1 | 1 | 0 | 0 | 1 | 1 | 1 |
| 40 | $x^{8}$ | 1 | 0 | 0 | 0 | 0 | 0 | 0 | 0 | 0 | 1 | 1 | 1 | 1 | 0 | 0 | 1 | 1 |
| 41 | $x^{7}$ | 1 | 0 | 0 | 0 | 0 | 0 | 0 | 0 | 0 | 0 | 1 | 1 | 1 | 1 | 0 | 0 | 1 |
| 42 | $x^{6}$ | 1 | 0 | 0 | 0 | 0 | 0 | 0 | 0 | 0 | 0 | 0 | 1 | 1 | 1 | 1 | 0 | 0 |
| 43 | $x^{5}$ | 0 | 0 | 0 | 0 | 0 | 0 | 0 | 0 | 0 | 0 | 0 | 0 | 1 | 1 | 1 | 1 | 0 |
| 44 | $x^{4}$ | 0 | 0 | 0 | 0 | 0 | 0 | 0 | 0 | 0 | 0 | 0 | 0 | 0 | 1 | 1 | 1 | 1 |
| 45 | $x^{3}$ | 1 | 0 | 0 | 0 | 0 | 0 | 0 | 0 | 0 | 0 | 0 | 0 | 0 | 0 | 1 | 1 | 1 |
| 46 | $x^{2}$ | 1 | 0 | 0 | 0 | 0 | 0 | 0 | 0 | 0 | 0 | 0 | 0 | 0 | 0 | 0 | 1 | 1 |
| 47 | $x^{1}$ | 1 | 0 | 0 | 0 | 0 | 0 | 0 | 0 | 0 | 0 | 0 | 0 | 0 | 0 | 0 | 0 | 1 |
| 48 | $x^{0}$ | 1 | 0 | 0 | 0 | 0 | 0 | 0 | 0 | 0 | 0 | 0 | 0 | 0 | 0 | 0 | 0 | 0 |

CONFIRM ALL "0"s

ERROR-DETECTING ENCODING AND DECODING APPARATUS AND DIVIDING APPARATUS

CROSS-REFERENCE TO RELATED APPLICATION

The present application is a continuation of International Application No. PCT/JP02/03965 which was filed on Apr. 22, 2002, which is herein incorporated by reference.

BACKGROUND OF THE INVENTION

This invention relates to an error-detecting encoding and decoding apparatus and to a dividing apparatus. More particularly, the invention relates to an error-detecting encoding apparatus for generating parity bits for detecting error in an input data string and appending the parity bits to the data string, an error-detecting decoding apparatus for applying error-detecting processing to an input data string to which parity bits have been appended and detecting error in the input data string, and a dividing apparatus that can be used in this error-detecting encoding and decoding apparatus.

An error-detecting code is applied in a system in which it is required that data be transmitted without error when data communication is carried out, as in the case of mobile communications, facsimile machines and cash dispensers at banks, etc., or in a system in which it is required that data be read out without error when a large quantity of data is stored on a magnetic disk or CD. Further, an error-detecting code usually is used in conjunction with an error-correcting code and is for performing detection of an error that could not be correctly completely by error correction; if error is detected, resend control or re-readout control is, performed.

System in Which Error Correction is Applied

FIG. 42 is an example of the configuration of a system in which error correction is applied. On a transmitting side 1, an error-detecting encoder 1b applies error-detecting encoding to a data string of prescribed bit length generated by an information generator 1a, and an error-correcting encoder 1c subjects the input data string to error-correcting encoding by convolutional encoding or turbo encoding processing and transmits the encoded data to a receiving side 3. On the receiving side 3, an error-correcting decoder 3a decodes the entered encoded data string by error-correcting decoding and inputs the decoded data string to an error-detecting decoder 3b. The latter applies error-detecting decoding to the decoded data string to thereby detect whether error is present or not and, if an error is present, sends a resend-request signal RRQ to the transmitting side. If there is no error, an information extracting unit 3c extracts and outputs the data. Described below will be a CRC (Cyclic Redundancy Check), which is error detection based upon a cyclic code.

CRC

Simply stated, on the transmitting side, CRC regards a data string of a prescribed bit length as a polynomial, divides the data string by a polynomial (a generator polynomial) that is for generating an error-detecting code, and performs encoding in such a manner that the remainder will become zero. On the receiving side, CRC regards a receive data string as a polynomial, divides this data string by the same generator polynomial as that on the transmitting side, judges that there is no error if the remainder is zero and judges that there is an error if the remainder is not zero.

Specifically, on the transmitting side, k-bit information is regarded as a polynomial $K(x)$, the polynomial $K(x)$ is divided by a generator polynomial $G(x)$, and a parity bit is appended in such a manner that the remainder will be zero. For example, if the generator polynomial $G(x)$ consists of 16 bits and $$x^{16}K(x) \div G(x) = Q(x), \text{ remainder } R(x)$$

holds, then $$W(x) = x^{16}K(x) + R(x)$$

is adopted as is adopted as a code word. Here $x^{16}K(x)$ signifies a data string in which 16 "0" bits have been appended to the low-order side of the k-bit data string.

On the receiving side, if $W'(x)=W(x)+E(x)$, which is the result of appending an error $E(x)$ to the code word $W(x)$, is received, then $W'(x)$ is divided by $G(x)$. Absence of error is detected if the remainder is zero. If the remainder is other than zero, then the presence of an error is detected. More specifically, $$W'(x)/G(x)$$

is calculated and whether the above is divisible is detected.

Next, a case where a 32-bit signal of all "1"s is subjected to error-detecting encoding and decoding by a generator polynomial $G(x)=x^{16}+x^{12}+x^5+1$ will be illustrated.

CRC Calculating Unit

FIG. 43 illustrates first and second examples of structures of a CRC calculating unit in a case where generator polynomial $G(x)=x^{16}+x^{12}+x^5+1$ holds.

① First CRC Calculating Unit (A) of FIG. 43 illustrates an example of an ordinary CRC calculating unit, namely a divider for when $G(x)=x^{16}+x^{12}+x^5+1$ holds. The CRC calculating unit is constituted by a 16-stage shift register SR, exclusive-OR gates EOR1 to EOR3, which are provided on the input side at positions of bits and 0, 5 and 12, for performing an exclusive-OR operation between the output data of the preceding stage and feedback data, and a switch SW provided on the output side at the position of bit 15.

The data string $x^{16}K(x)$ can be divided by inputting the data string to the EOR1 one bit at a time from the higher order side in a state in which the switch has been changed over to the feedback side (the A side). That is, in error-detecting encoding, if the data string $K(x)$ prior to encoding is assumed to be 32 bits, then $x^{16}K(x)$ becomes 48 bits. This 48-bit data string is input from the higher order side while causing the shift register SR to operate. The content of the shift register SR when the input of the 48 bits ends is the remainder $R(x)$ and therefore this is appended to the lower order side of $K(x)$ as the parity bits and the result is output as $W(x)$.

If $W'(x)$ is 48 bits when error-detecting decoding is performed, the 48-bit signal is input to the EOR1 of a CRC calculating unit, the structure of which is identical with that shown in (A) of FIG. 43, from the higher order side while the shift register SR is made operate. The content of the shift register SR when the input of the 48 bits ends is the remainder $R(x)$ and therefore absence of an error is decided if all bits are "0"s and presence of an error is decided if even a single bit is not "0".

② Second CRC Calculating Unit (B) of FIG. 43 illustrates a CRC calculating unit [a divider when $G(x)=x^{16}+x^{12}+x^5+1$ holds] in which the number of operations is reduced by modifying the data input position of (A). Here the position of the EOR1 for data input is moved from the left end to the right end. The data input is divided by inputting the data to the EOR1 one bit at a time from the higher order side of the data string in a manner similar to that of (A). As compared with (A), the position of EOR1 is merely moved from the left end to the right end, but this is equivalent to inputting the data while multiplying the input data string by $x^{16}$. That is, if the 32-bit data string K(x) is input to the EOR1 from the higher order side while the shift register SR is made to operate, then the content of the shift register SR when the input of the 32-bit data string K(x) ends is the remainder R(x) and therefore this is appended to the lower order side of K(x) as the parity bits (16 bits). The result is output as W(x).

If the input data string W'(x) is composed of 48 bits with the inclusion of the parity bits (the 16 bits on the lower order side are the parity bits) when error-detecting decoding is performed, then 32 bits of the data string are input to the EOR1 of a CRC calculating unit, the structure of which is identical with that shown in (B) of FIG. 43, from the higher order side while the shift register SR is made operate. The content of the shift register SR when the input of the 32 bits ends is the remainder. Accordingly, the remainder is compared with the remaining 16 bits that are the parity bits, absence of an error is decided if there is perfect agreement and presence of an error is decided if there is not perfect agreement. As a result, the number of operations can be reduced to 32.

Error-detecting encoding can also be performed as follows: If the input data string W'(x) is composed of 48 bits with the inclusion of the parity bits (the 16 bits on the lower order side are the parity bits), then all 48 bits of the data string are input to the EOR1 of a CRC calculating unit, the structure of which is identical with that shown in (B) of FIG. 43, from the higher order side while the shift register SR is made to operate. In this case, absence of an error is decided if the content of the shift register SR is all "0"s and presence of an error is determined if the content is not all "0"s. It should be noted that the content of the shift register SR in this error-detecting decoding scheme is not the remainder but indicates the result of coincidence detection.

Prior-Art Example of Encoder

In the CRC calculating unit shown in (B) of, the value in shift register SR is made all "0"s in the initial state. The switch SW is switched to the A side and the data string K(x) is input to the EOR1 successively one bit at a time. The register value R(x) when input of the entire data strings ends is the residue of G(x), namely the remainder. Accordingly, if the switch SW is switched to the B side and the value R(x) of the shift register SR is output, then parity bits can be obtained.

This illustrates an example in which a 32-bit data string K(x) of all "1"s is subjected to CRC encoding by the generator polynomial $G(x)=x^{16}+x^{12}+x^5+1$. The bits of the value R(x) in the shift register SR when input of the 32 bits ends are the parity bits. In this case, K(x), $x^{16}$K(x), R(x) and W(x) are as follows:

$K(x)=x^{31}+x^{30}+x^{29}+x^{28}+\ldots+x^2+x^1+1$ $x^{16}K(x)=x^{47}+x^{46}+x^{45}+x^{44}+\ldots+x^{18}+x^{17}+x^{16}$ $R(x)=x^{15}+x^{12}+x^{11}+x^8+x^7+x^6+x^3+x^2+x+1$ $W(x)=x^{16}K(x)+R(x)$ $=(x^{47}+x^{46}+x^{45}+x^{44}+\ldots+x^{18}+x^{17}+x^{16})+(x^{15}+x^{12}+x^{11}+x^8+x^7+x^6+x^3+x^2+x+1)$ FIG. 44 illustrates the content of the register SR when a data string whose 32 bits on the higher order side are all "1"s in the data string $x^{16}$K(x) has been input to the EOR1 shown in (B) of FIG. 43 one bit at a time by one clock. The bits of the value R(x) in the shift register SR when input of the 32 bits ends are the parity bits.

First Prior-Art Example of Decoder (Coincidence-detecting Decoding Method)

In the CRC calculating unit shown in (B) of FIG. 43, the value in the register SR is made all "0"s in the initial state. The switch SW is switched to the A side and only information bits obtained by excluding the parity bits in the input data string W(x)' are input successively. Coincidence is detected between the value in the register SR when input only of the information bits ends and the parity bits, which are the remaining bits of the input data string. It is determined that there is no error if the two coincide and that there is an error if the two do not coincide.

FIG. 45 illustrates the content of the register SR when encoded data that is the result of appending 16 parity bits to a 32-bit data string of all "1"s has been input to the EOR1 shown in (B) of FIG. 43 from the higher order side one bit at a time by one clock. Error detection is performed based upon whether the value R1 in the shift register SR when input of 32 bits of the encoded data ends coincides with the remaining 16 bits (parity bits) P1 of the input data string. A decoding method for detecting error based upon whether calculated parity coincides with parity that has been appended to an input data string, as described above, is referred to as a coincidence-detecting decoding method.

Second Prior-Art Example of Decoder (All-"0"s Detecting Decoding Method)

In the CRC calculating unit shown in (B) of FIG. 43, the value in the register SR is made all "0"s in the initial state. The switch SW is switched to the A side, information bits of input data string W(x)' are input successively and then the parity bits are input. Whether the value in the register SR when input of the parity bits ends is indicative of all "0"s is checked, it is determined that there is no error if all bits are "0"s and that there is an error if even one bit is "1".

FIG. 46 illustrates the content of the register SR when encoded data that is the result of appending 16 parity bits to a 32-bit data string of all "1"s has been input to the EOR1 shown in (B) of FIG. 43 from the higher order side one bit at a time by one clock. Whether the value in the shift register SR when input of the 32 bits of encoded data and 16 parity bits ends is indicative of all "0"s is checked, it is determined that there is no error if all bits are "0"s and that there is an error if even one bit is "1". A decoding method for determining that there is no error if all bits are "0"s and determining that there is an error if even one bit is "1", as described above, is referred to as an all-"0"s-detecting method.

With CRC calculation, as indicated in FIGS. 44 to 46, calculation lasting at least the information bit length is required. That is, with the error-detecting encoder and decoder of FIGS. 44 to 46, at least 32 clocks are required. With a fourth-generation (new-generation) mobile communication system, the maximum information rate will be 100 Mbps or greater (1 Gbps or greater in case of a wireless LAN) according to the General Affairs Ministry. In the case of an information rate of 100 Mbps, a 100-MHz clock is necessary to perform the CRC calculation. In this case also there is a delay of one packet length brought about merely by CRC error detection. If resend control also is taken into account, there will be a marked decline in the data transmission rate since generating a resend-request signal takes time.

Further, if the CRC calculation employs a low-speed clock of, e.g., 25 MHz, four CRC calculation units will be required. Since a CRC calculation unit is intrinsically of small size, the scale of the hardware is not a problem but the delay due to calculation is a length of four packets. When resend is considered, the data transmission rate undergoes a large decline.

FIG. 47 illustrates a time chart on the receiving side in such case. It will be understood that if a packet #1 is received and this packet is NG, then resend is requested from packet #7 onward. It should be noted that if the CRC calculation is performed at high speed, resend can be requested earlier.

Further, if the information rate is 1 Gbps, the delay ascribable to CRC calculation is ten packet lengths even when it is attempted to use ten CRC calculation circuits that operate at at 100-Mbps clock. Here resend control is not realistic.

SUMMARY OF THE INVENTION

Accordingly, an object of the present invention is to shorten the time needed for CRC calculation.

Another object of the present invention is to shorten packet delay time even in a case where resent control is performed.

A first aspect of the present invention is an error-detecting encoding apparatus for creating parity bits by error-detecting encoding processing, appending the parity bits to an input data string and encoding the data string. In this error-detecting encoding apparatus, data segmenting means segments an input data string, which is to undergo error-detecting encoding, into a plurality of sub-data strings; dividing means divides the segmented sub-data strings by a generator polynomial and calculates remainders; converting means applies conversion processing, which conforms to a segmentation position of the sub-data strings, to the remainders on a per-remainder basis; and combining means combines converted values, which have been obtained by the conversion processing, and outputs parity bits. In accordance with error-detecting encoding processing of the present invention, the time required for CRC calculation (calculation of parity bits) can be shortened to about 1/n if it is assumed that a data string is segmented into n sub-data strings by the data segmenting means.

Second and third aspects of the present invention relate to an error-detecting decoding apparatus for applying error-detecting processing to an input data string to which parity bits have been appended and detecting error in the input data string.

In the error-detecting decoding apparatus of the second aspect of the present invention, data segmenting means segments an input data string into a plurality of sub-data strings; dividing means divides the segmented sub-data strings by a generator polynomial and calculates remainders; converting means applies conversion processing, which conforms to a segmentation position of the sub-data strings, to the remainders on a per-remainder basis; combining means combines converted values, which have been obtained by the conversion processing, and outputs parity bits; and an error detector detects whether or not input data is erroneous depending upon whether these parity bits and parity bits that have been appended to the input data coincide.

In the error-detecting decoding apparatus of the third aspect of the present invention, data segmenting means segments an input data string, inclusive of parity bits, into a plurality of sub-data strings; dividing means divides the segmented sub-data strings by a prescribed generator polynomial and calculates remainders; converting means applies conversion processing, which conforms to a segmentation position of the sub-data string, to the remainders on a per-remainder basis; combining means combines converted values that have been obtained by the conversion processing; and an error detector detects whether or not input data is erroneous depending upon whether result of combining converted values is that all bits are "0"s.

In accordance with the error-detecting decoding apparatus of the second and third aspects, the time required for CRC calculation (calculation of parity bits) can be shortened to about 1/n if it is assumed that a data string is segmented into n sub-data strings by the data segmenting means, and therefore error detection can be performed in a short time. Further, packet delay time can be shortened even in a case where resend control is performed.

A fourth aspect of the present invention is a dividing apparatus for regarding a K-bit input data string as a first polynomial, dividing it by a second polynomial and calculating the remainder. In this dividing apparatus, data segmenting means segments the input data string into a plurality of sub-data strings; for every segmented sub-data string, dividing means regards information bits of the sub-data strings as polynomials, divides them by the second polynomial and calculates the remainders; converting means applies conversion processing, which conforms to a segmentation position of the sub-data strings, to the remainders on a per-remainder basis; and a combiner combines converted values that have been obtained by the conversion processing, and adopts the result of combining the converted values as a remainder that prevails when the K-bit input data string is divided by the second polynomial. In accordance with this dividing apparatus, dividing time can be shortened to about 1/n if it is assumed that a data string is segmented into n sub-data strings by the data segmenting means.

BRIEF DESCRIPTION OF THE DRAWINGS

FIG. 2 is a diagram useful in describing a 16×16 matrix for performing a 1-bit shift in a CRC calculating unit;

FIG. 3 is a diagram useful in describing a 2-bit shift matrix $A^2$ ($=A \times A$) and a 4-bit shift matrix $A^4$ ($=A^2 \times A^2$);

FIG. 4 is a diagram useful in describing an 8-bit shift matrix $A^8$ ($=A^4 \times A^4$) and a 16-bit shift matrix $A^{16}$ ($=A^8 \times A^8$);

FIG. 5 is a diagram useful in describing a 24-bit shift matrix $A^{24}$ ($=A^{16} \times A^8$)

FIG. 6 is a diagram useful in describing a 32-bit shift matrix $A^{32}$ ($=A^{24} \times A^8$) and a 40-bit shift matrix $A^{40}$ ($=A^{32} \times A^8$);

FIG. 10 is a first diagram for describing operation of an error-detecting encoder;

FIG. 11 is a second diagram for describing operation of an error-detecting encoder;

FIG. 12 is a third diagram for describing operation of an error-detecting encoder;

FIG. 13 is a fourth diagram for describing operation of an error-detecting encoder;

FIG. 14 is a fifth diagram for describing operation of an error-detecting encoder;

FIG. 16 is a first diagram for describing operation of the error-detecting decoder;

FIG. 17 is a second diagram for describing operation of the error-detecting decoder;

FIG. 18 is a third diagram for describing operation of the error-detecting decoder;

FIG. 19 is a fourth diagram for describing operation of the error-detecting decoder;

FIG. 20 is a fifth diagram for describing operation of the error-detecting decoder;

FIG. 22 is a first diagram for describing operation of the error-detecting decoder;

FIG. 22 is a first diagram for describing operation of the error-detecting decoder;

FIG. 23 is a second diagram for describing operation of the error-detecting decoder;

FIG. 24 is a third diagram for describing operation of the error-detecting decoder;

FIG. 25 is a fourth diagram for describing operation of the error-detecting decoder;

FIG. 26 is a fifth diagram for describing operation of the error-detecting decoder;

FIG. 27 is a sixth diagram for describing operation of the error-detecting decoder;

FIG. 28 is a seventh diagram for describing operation of the error-detecting decoder;

FIG. 44 is a diagram useful in describing operation of an error-detecting encoder;

FIG. 45 is a diagram useful in describing a coincidence-detecting decoding method;

FIG. 46 is a diagram useful in describing an all-"0"s detecting decoding method.

DESCRIPTION OF THE PREFERRED EMBODIMENTS (A) Overview of the Present Invention (a) Principles of the Present Invention A remainder, i.e., parity bits, that results when a received word W'(x) is divided by the generator polynomial G(x) ($=x^{16}+x^{12}+x^5+1$) can be obtained as follows: Assuming that the received word W'(x) is composed of 32 bits, it is segmented into $$W'(x)=x^{24}A(x)+x^{16}B(x)+x^8C(x)+D(x)$$

eight bits at a time and the received word W'(x) is divided by G(x). The division formula is expressed as follows:

$$W'(x)/G(x)=x^{24}A(x)/G(x)+x^{16}B(x)/G(x)+x^8C(x)/G(x)+D(x)/G(x)$$

$A(x)/G(x)$, $B(x)/G(x)$, $C(x)/G(x)$, $D(x)/G(x)$ are calculated and the remainders are designated as follows in order:

$R_A(x)$, $R_B(x)$, $R_C(x)$, $R_D(x)$.

Next,

① remainder $R_A'(x)$ of $x^{24}A(x)/G(x)$ is calculated from $R_A(x)$;

② the remainder $R_B'(x)$ of $x^{16}B(x)/G(x)$ is calculated from $R_B(x)$;

③ the remainder $R_C'(x)$ of $x^8C(x)/G(x)$ is calculated from $R_C(x)$; and

④ we let $R_D(x)=R_D'(x)$ hold.

If $R_A'(x)$, $R_B'(x)$, $R_C'(x)$ and $R_D'(x)$ are found, then the remainder, i.e, parity bits, resulting when the received word W'(x) is divided by the generator polynomial G(x) is obtained.

The calculation of $R_A'(x)$ from $R_A(x)$ [$=A(x)/G(x)$] is performed as follows: $R_A'(x)$ is the remainder of $x^{24}A(x)/G(x)$, and coefficients of $x^{24}A(x)$ below order $x^{23}$ are zero. Accordingly, in the conversion of $R_A'(x)$ from $R_A(x)$ [$=A(x)/G(x)$], if first A(x) is input to the CRC calculating unit shown in (B) of FIG. 43, $R_A(x)$ is calculated [$R_A(x)$ is stored in the shift register SR] and then the shift register SR is shifted 24 times with the input to the CRC calculating unit being 24 bits that are all "0"s, the content of this shift register will become $R_A'(x)$. In actuality, however, if the shift is performed 24 times, a commensurate calculation time is required. As will be described later, therefore, calculation time is reduced by executing equivalent processing. It should be noted that the shifting operation of the shift register SR based upon an N-bit "0" input will be referred to below simply as an "N-bit shift" or "N-bit-shift processing".

Figure 43:
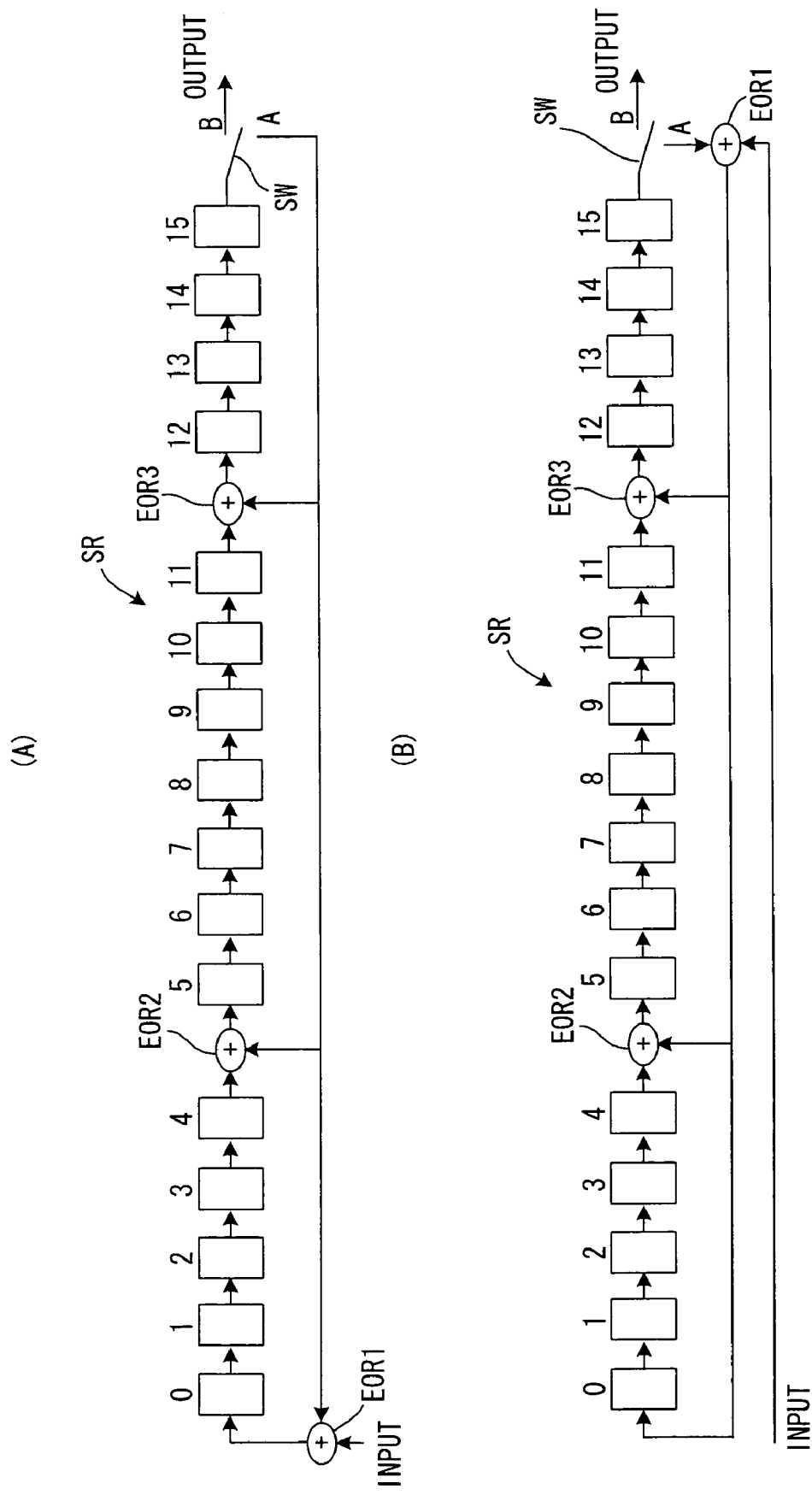
FIG. 43 illustrates first and second examples of structures of a CRC calculating unit in a case where generator polynomial $G(x)=x^{16}+x^{12}+x^5+1$ holds.

Similarly, as for the conversion of $R_B'(x)$ from $R_B(x)$ [$=B(x)/G(x)$], if B(x) is input to the CRC calculating unit shown in (B) of FIG. 43, $R_B(x)$ is calculated [$R_B(x)$ is stored in the shift register SR] and then the shift register SR is shifted 16 times, the content of this shift register will become $R_B'(x)$.

Further, as for the conversion of $R_C'(x)$ from $R_C(x)$ [$=C(x)/G(x)$], if C(x) is input to the CRC calculating unit shown in (B) of FIG. 43, $R_C(x)$ is calculated [$R_C(x)$ is stored in the shift register SR] and then the shift register SR is shifted eight times, the content of this shift register will become $R_C'(x)$.

(b) Error-detecting Encoder

Figure 1:
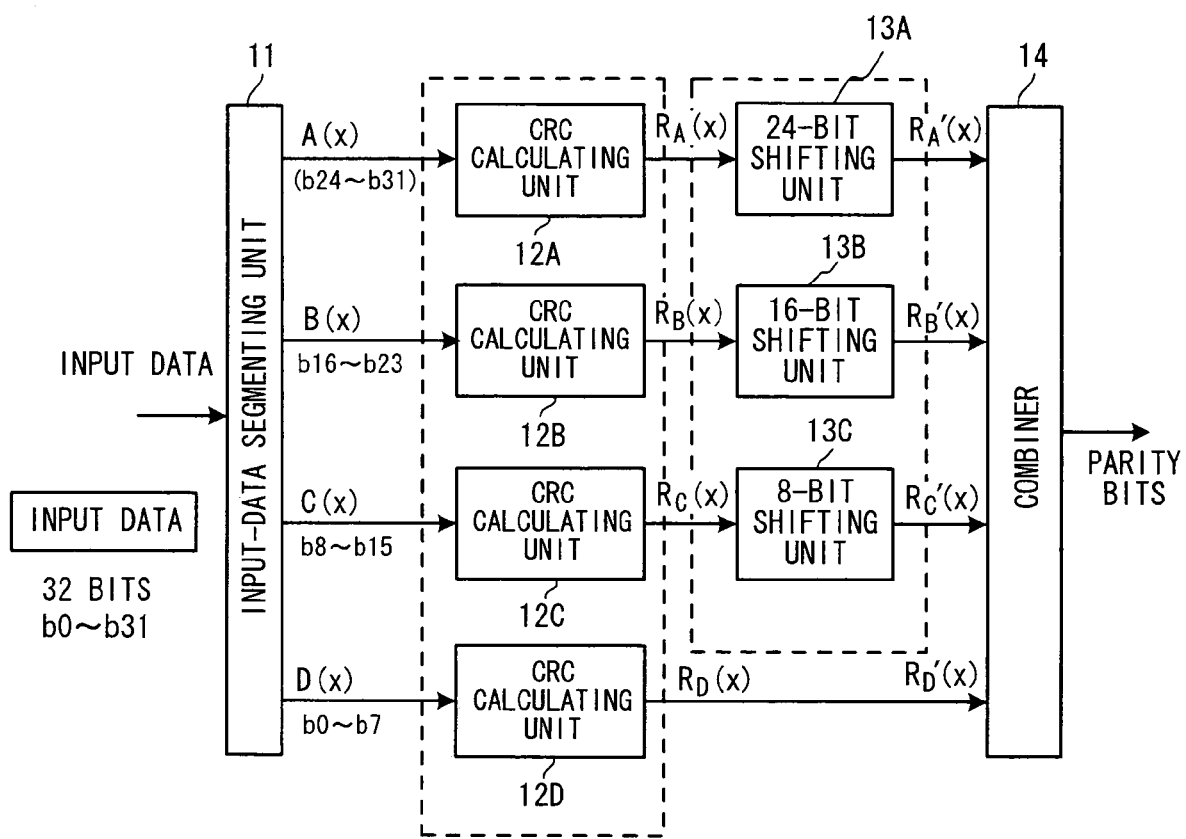
FIG. 1 is a block diagram of an error-detecting encoder according to the present invention.

FIG. 1 is a block diagram of an error-detecting encoder according to the present invention in a case where data that is to undergo error-detecting encoding is a 32-bit data string b0 to b31. An input-data segmenting unit 11 segments the 32-bit data string b0 to b31 into data strings b0 to b7, b8 to b15, b16 to b23, b24 to b31 of eight bits each, and adopts this as $$x^{24}A(x)+x^{16}B(x)+x^8C(x)+D(x)$$

where we let A(x) represent a polynomial expressed by the 8-bit information of b24 to b31, B(x) a polynomial expressed by the 8-bit information of b16 to b23, C(x) a polynomial expressed by the 8-bit information of b8 to b15 and D(x) a polynomial expressed by the 8-bit information of b0 to b7.

CRC calculating units 12A, 12B, 12C, 12D, which each have the structure shown in FIG. 43(B), execute the following division operations:

$$A(x)/G(x), B(x)/G(x), C(x)/G(x), D(x)/G(x)$$

using $G(x)=x^{16}+x^{12}+x^5+1$ as the generator polynomial, and output respective ones of the remainders $$R_A(x), R_B(x), R_C(x) \text{ and } R_D(x)$$

A 24-bit shifting unit 13A subjects the remainder $R_A(x)$ to 24-bit shift processing and calculates the remainder $R_A'(x)$ of $x^{24}A(x)/G(x)$, a 16-bit shifting unit 13B subjects the remainder $R_B(x)$ to 16-bit shift processing and calculates the remainder $R_B'(x)$ of $x^{16}B(x)/G(x)$, and an 8-bit shifting unit 13C subjects the remainder $R_C(x)$ to 8-bit shift processing and calculates the remainder $R_C'(x)$ of $x^8C(x)/G(x)$.

When $R_A'(x), R_B'(x), R_C'(x), R_D'(x)$ have been found, a combiner 14 combines the remainders (calculates the exclusive-OR on a bit-by-bit basis) according to the following equation:

$$R_A'(x)+R_B'(x)+R_C'(x)+R_D'(x)$$

and outputs the remainder, i.e., CRC parity bits of 16 bits, that results when the 32-bit input data string is divided by the generator polynomial G(x).

In accordance with the error-detecting encoder of FIG. 1, the time required for CRC calculation (calculation of the parity bits) can be shortened to ¼ of that required in the prior art. If the input data string is divided into n segments, then the time required can be shortened to 1/n.

(c) N-bit Shifting Unit

FIG. 2 is a diagram useful in describing a 16×16 matrix for performing 1-bit shift processing that is equivalent to inputting one "0" and shifting the content of the shift register SR by one bit in the CRC calculating unit shown in (B) of FIG. 43. As to how the matrix should be viewed, the matrix indicates to which bits prior to the shift in the shift register SR the EX-OR operation is applied to obtain each bit after the shift.

Bits prior to the shift to which the EX-OR operation is to be applied are bits at logical "1". For example, the 5$^{th}$ bit after the shift is obtained by an EX-OR operation performed between the 4$^{th}$ and 15$^{th}$ bits before the shift, and the 12$^{th}$ bit after the shift is obtained by an EX-OR operation performed between the 11$^{th}$ and 15$^{th}$ bits before the shift. Furthermore, since the 0$^{th}$ bit after the shift involves only a single "1", it takes on the value of the 15$^{th}$ bit prior to the shift. Similarly, the 1$^{st}$ bit after the shift takes on the value of the 0$^{th}$ bit prior to the shift, the 2$^{nd}$ bit after the shift takes on the value of the 1$^{st}$ bit prior to the shift, and so on.

Accordingly, if the content of the 16-bit shift register SR is made a 16×1 matrix and this is used to multiply the 16×16 1-bit shifting matrix of FIG. 2, then the content of the shift register SR after the 1-bit shift will be obtained as a 16×1 matrix. The addition in this matrix operation is the exclusive-OR operation EX-OR.

Figure 5:
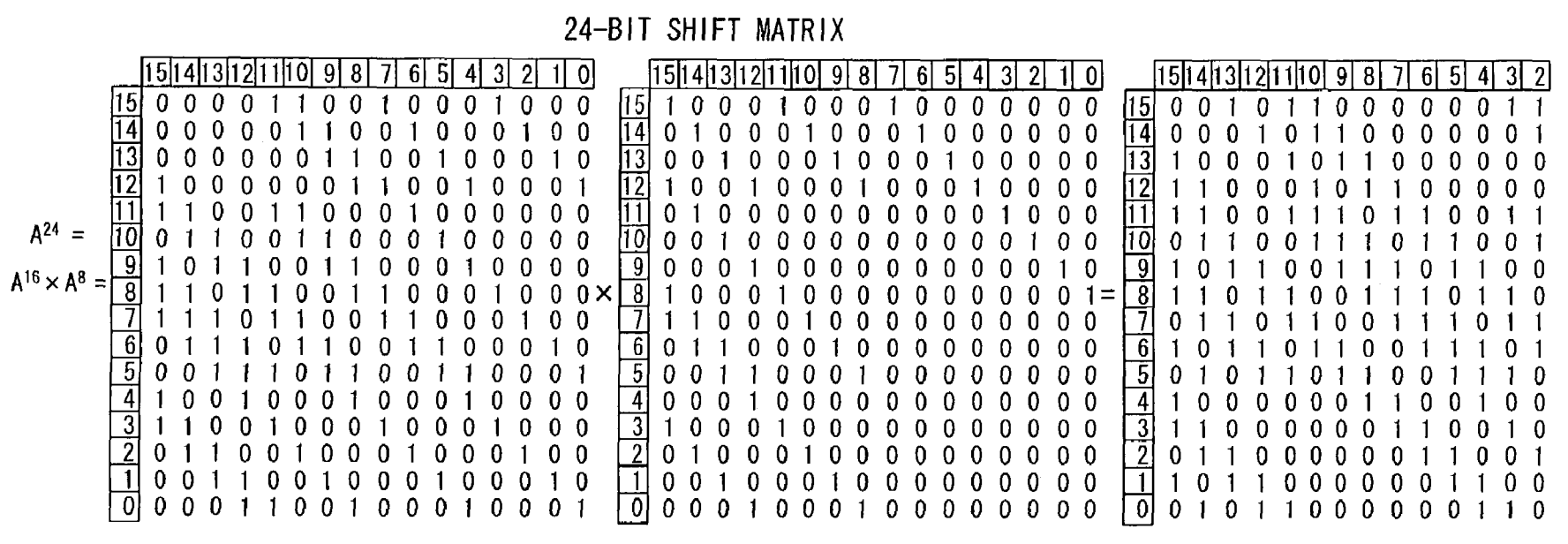

An N-bit shift can be implemented by multiplying the 1-bit shifting matrix by itself N times. That is, if the 1-bit shifting matrix is represented by A, then the calculation matrix that implements the N-bit shift will be $A^N$. Accordingly, a 2-bit shifting matrix $A^2$ (=A×A) and 4-bit shifting matrix $A^4$ (=$A^2$×$A^2$) become as shown in (A) and (B) of FIG. 3, and an 8-bit shifting matrix $A^8$ (=$A^4$×$A^4$) and 16-bit shifting matrix $A^{16}$ (=$A^8$×$A^8$) become as shown in (A) and (B) of FIG. 4. Further, a 24-bit shifting matrix $A^{24}$ (=$A^{16}$×$A^8$) becomes as shown in FIG. 5. A 32-bit shifting matrix $A^{32}$ (=$A^{24}$×$A^8$) and a 40-bit shifting matrix $A^{40}$ (=$A^{32}$×$A^8$) become as shown in (A) and (B) of FIG. 6.

Figure 7:
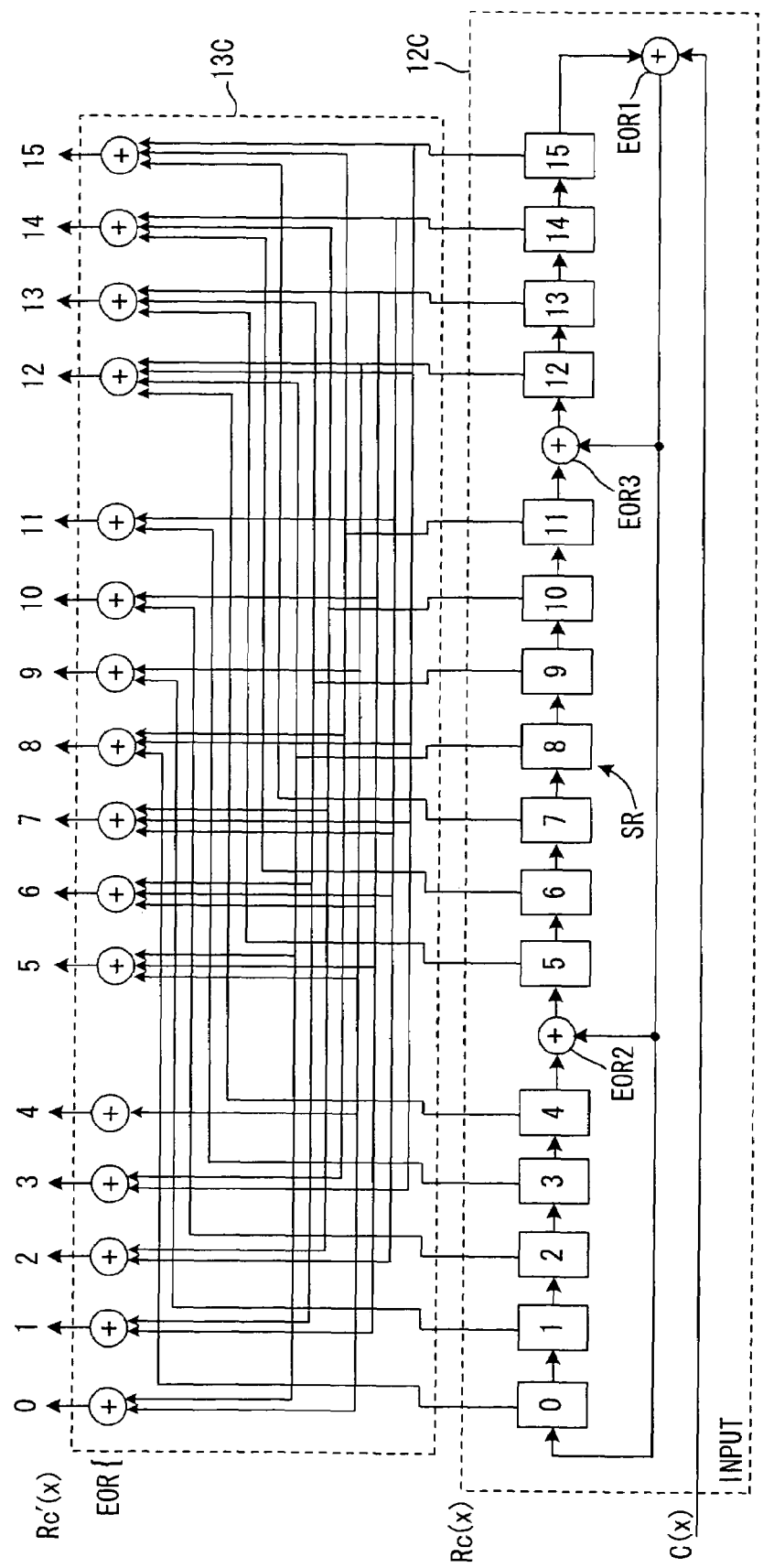
FIG. 7 is a diagram showing the connections of a CRC calculating unit and an 8-bit shifting unit.

In view of the foregoing, the 8-bit shifting unit 13C of FIG. 1 can be implemented by a multiplying circuit that multiplies the transformation matrix $A^8$ on the right side of (A) of FIG. 4 by the 16-bit remainder $R_C(x)$ (expressed by a 16×1 matrix) that is output from the CRC calculating unit 12C. FIG. 7 is a diagram showing the connections of the CRC calculating unit 12C and the 8-bit shifting unit 13C. Using 16 EOR gates, the 8-bit shifting unit 13C outputs 16 bits $R_C'(x)$ that are the result of multiplying the transformation matrix $A^8$ and the remainder $R_C(x)$.

Figure 8:
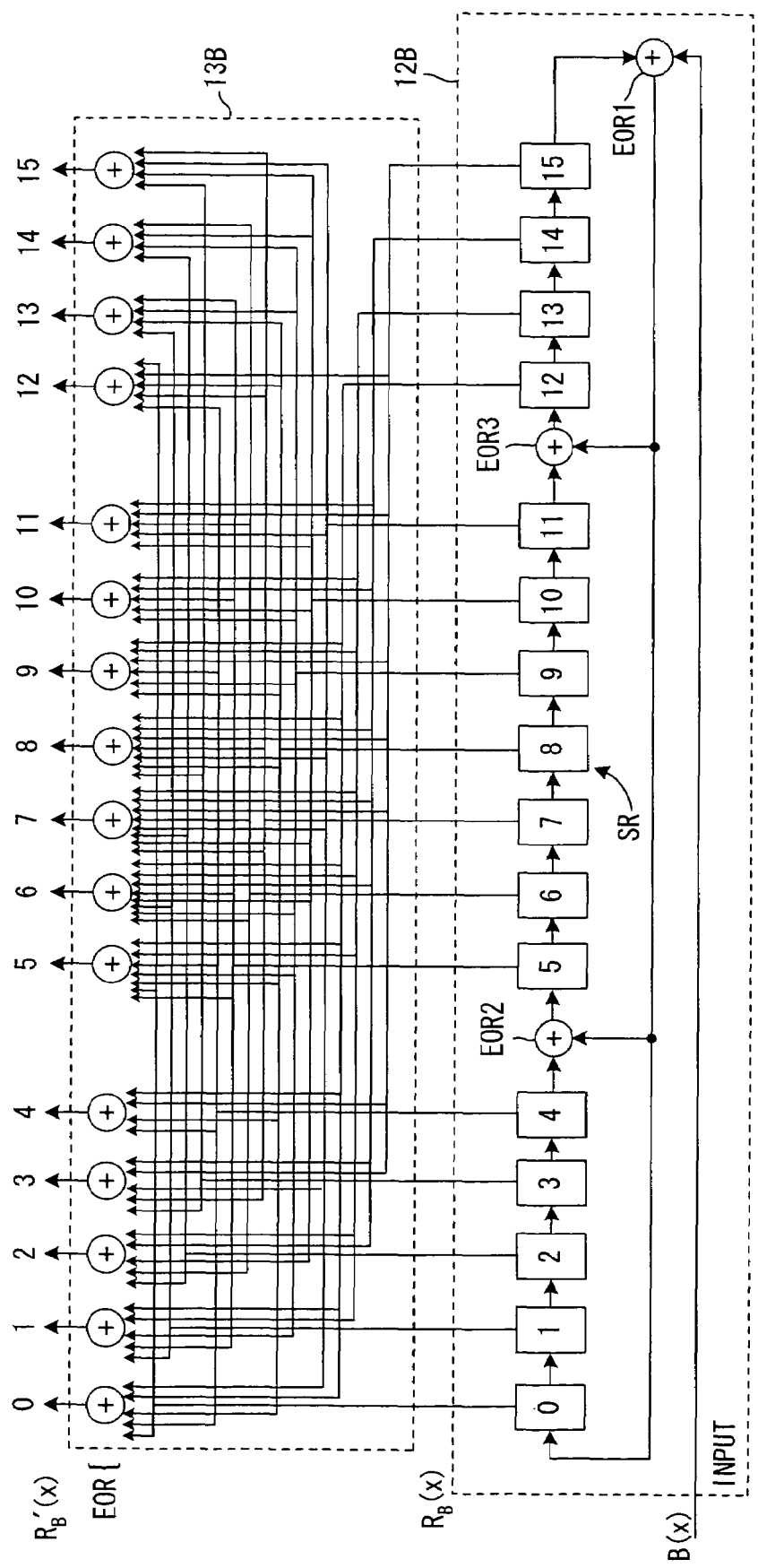
FIG. 8 is a diagram showing the connections of a CRC calculating unit and a 16-bit shifting unit.

Further, the 16-bit shifting unit 13B can be implemented by a multiplying circuit that multiplies the transformation matrix $A^{16}$ on the right side of (B) of FIG. 4 by the 16-bit remainder $R_B(x)$ (expressed by a 16×1 matrix) that is output from the CRC calculating unit 12B. FIG. 8 is a diagram showing the connections of the CRC calculating unit 12B and the 16-bit shifting unit 13B. Using 16 EOR gates, the 16-bit shifting unit 13B outputs 16 bits $R_B'(x)$ that are the result of multiplying the transformation matrix $A^{16}$ and the remainder $R_B(x)$.

Figure 9:
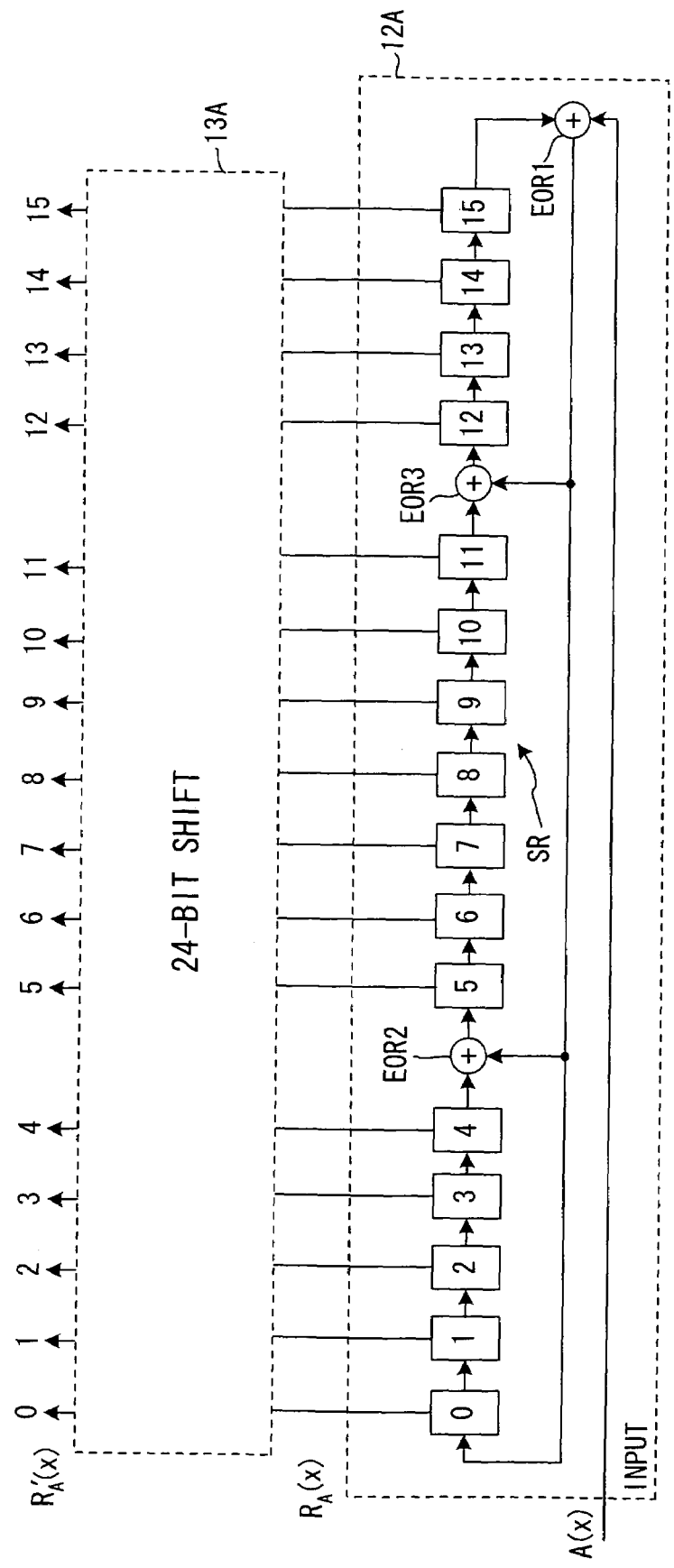
FIG. 9 is a diagram showing the connections of a CRC calculating unit and a 24-bit shifting unit.

Similarly, the 24-bit shifting unit 13A of FIG. 1 can be implemented by a circuit in which the 16-bit remainder $R_A(x)$ that is output from the CRC calculating unit 12A is expressed by a 16×1 matrix and this is used to multiply the transformation matrix $A^{24}$ on the right side of FIG. 5. FIG. 9 is a diagram showing the connections of the CRC calculating unit 12A and the 24-bit shifting unit 13A. Though not illustrated, the 24-bit shifting unit 13A, using 16 EOR gates, outputs 16 bits $R_A'(x)$ that are the result of multiplying the transformation matrix $A^{24}$ and the remainder $R_A(x)$, in a manner similar to that shown in FIGS. 7 and 8.

FIGS. 10 to 14 are diagrams for describing the operation of each part of the error-detecting encoder. Here the input data is assumed to be 32 bits that are all "1"s.

(A) and (B) of FIG. 10 are diagrams useful in describing the operation of the CRC calculating unit 12A and the 24-bit shifting unit 13A, respectively. Bits $x^{31}$ to $x^{24}$ are input successively to the CRC calculating unit 12A from the higher order side by eight clocks. The content of the shift register SR when input of $x^{24}$ is completed becomes the remainder $R_A(x)$ of A(x)/G(x). The 24-bit shifting unit 13A multiplies the transformation matrix $A^{24}$ and the 16×1 matrix $R_A(x)$ together and outputs the remainder $R_A'(x)$ of $x^{24}A(x)/G(x)$. It should be noted that x^m in the Figure signifies $x^m$.

(A) and (B) of FIG. 11 are diagrams useful in describing the operation of the CRC calculating unit 12B and the 16-bit shifting unit 13B, respectively. Bits $x^{23}$ to $x^{16}$ are input successively to the CRC calculating unit 12B from the higher order side by eight clocks. The content of the shift register SR when input of $x^{16}$ is completed becomes the remainder $R_B(x)$ of B(x)/G(x). The 16-bit shifting unit 13B multiplies the transformation matrix $A^{16}$ and the 16×1 matrix $R_B(x)$ together and outputs the remainder $R_B'(x)$ of $x^{16}B(x)/G(x)$.

(A) and (B) of FIG. 12 are diagrams useful in describing the operation of the CRC calculating unit 12C and the 8-bit shifting unit 13C, respectively. Bits $x^{15}$ to $x^8$ are input successively to the CRC calculating unit 12C from the higher order side by eight clocks. The content of the shift register SR when input of $x^8$ is completed becomes the remainder $R_C(x)$ of C(x)/G(x). The 8-bit shifting unit 13C multiplies the transformation matrix $A^8$ and the 16×1 matrix $R_C(x)$ together and outputs the remainder $R_C'(x)$ of $x^8C(x)/G(x)$.

FIG. 13 is a diagram useful in describing operation of the CRC calculating unit 12D. Bits $x^7$ to $x^0$ are input successively to the CRC calculating unit 12D from the higher order side by eight clocks. The content of the shift register SR when input of $x^0$ is completed becomes the remainder $R_D(x)$ [=$R_D'(x)$] of $D(x)/G(x)$.

FIG. 14 is a diagram useful in describing operation of the combiner 14. The latter performs the EX-OR operation among corresponding bits of the remainders $R_A'(x)$, $R_B'(x)$m $R_C'(x)$, $R_D'(x)$ calculated above and outputs 16-bit CRC parity.

(d) Error-detecting Decoder

Figure 15:
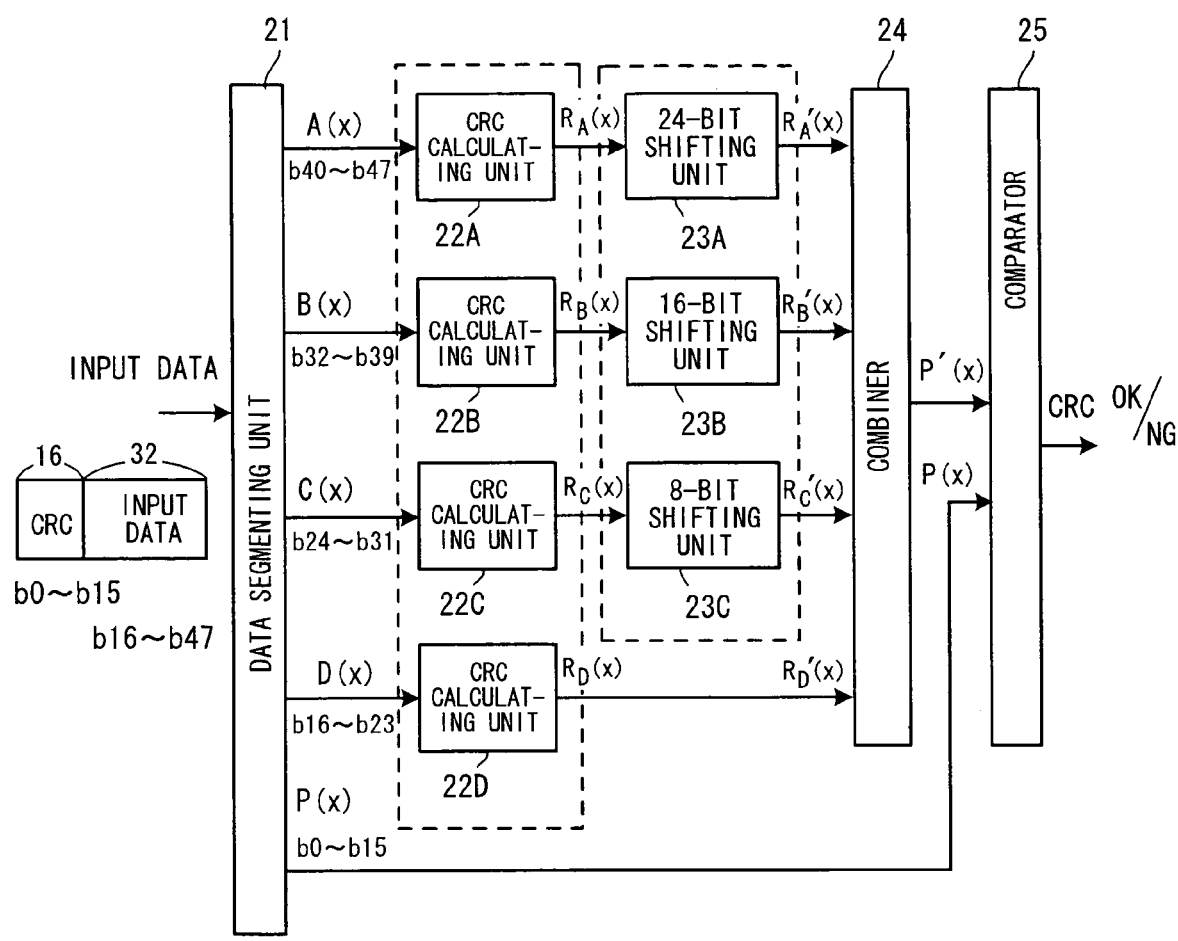
FIG. 15 is a block diagram of an error-detecting decoder according to the present invention.

FIG. 15 is a block diagram of an error-detecting decoder according to the present invention in a case where 16-bit CRC parity has been appended to the lower order side of 32-bit input data. A data segmenting unit 21 segments the 32-bit input data string b16 to b47, from which the CRC parity bits have been excluded, into data strings b16 to b23, b24 to b31, b32 to b39, b40 to b47, and adopts this as $$x^{24}A(x)+x^{16}B(x)+x^8C(x)+D(x)$$

It should be noted that $A(x)$ represents a polynomial expressed by the 8-bit information of b40 to b47, $B(x)$ a polynomial expressed by the 8-bit information of b32 to b39, $C(x)$ a polynomial expressed by the 8-bit information of b24 to b31 and $D(x)$ a polynomial expressed by the 8-bit information of b16 to b23. Further, the data segmenting unit 21 separates and outputs the CRC parity bits $P(x)$ of b0 to b15.

CRC calculating units 22A, 22B, 22C, 22D, which each have the structure shown in (B) of FIG. 43, execute the following division operations:

$$A(x)/G(x), B(x)/G(x), C(x)/G(x), D(x)/G(x)$$

using $G(x)=x^{16}+x^{12}+x^5+1$ as the generator polynomial, and output respective ones of the remainders $$R_A(x), R_B(x), R_C(x) \text{ and } R_D(x)$$

A 24-bit shifting unit 23A subjects the remainder $R_A(x)$ to 24-bit shift processing and calculates the remainder $R_A'(x)$ of $x^{24}A(x)/G(x)$, a 16-bit shifting unit 23B subjects the remainder $R_B(x)$ to 16-bit shift processing and calculates the remainder $R_B'(x)$ of $x^{16}B(x)/G(x)$, and an 8-bit shifting unit 23C subjects the remainder $R_C(x)$ to 8-bit shift processing and calculates the remainder $R_C'(x)$ of $x^8C(x)/G(x)$. It should be noted that each of the shifting units 23A to 23C can be constructed in a manner similar to that of an error-detecting encoder.

When $R_A'(x)$, $R_B'(x)$, $R_C'(x)$, $R_D'(x)$ have been found, a combiner 24 combines the remainders (calculates the exclusive-OR on a bit-by-bit basis) according to the following equation:

$$R_A'(x)+R_B'(x)+R_C'(x)+R_D'(x)$$

and outputs the remainder, i.e., CRC parity bits $P'(x)$, that results when the 32-bit input data string is divided by the generator polynomial $G(x)$.

A comparator 25 compares corresponding bits of the parity bits $P'(x)$ of 16 bits calculated above and parity bits $P(x)$ of 16 bits that have been appended to the input data, decides absence of error if all bits coincide and decides the presence of error if even one bit does not coincide.

FIGS. 16 to 20 are diagrams for describing the operation of each part of the error-detecting decoder. Here it is assumed that among the input data of 48 bits, the 16 bits $x^0$ to $x^{15}$ on the lower order side are CRC parity bits and the 32 bits $x^{16}$ to $x^{47}$ on the higher order side are all "1"s.

(A) and (B) of FIGS. 16 are diagrams useful in describing the operation of the CRC calculating unit 22A and the 24-bit shifting unit 23A, respectively. Bits $x^{47}$ to $x^{40}$ are input successively to the CRC calculating unit 22A from the higher order side by eight clocks. The content of the shift register SR when input of $x^{40}$ is completed becomes the remainder $R_A(x)$ of $A(x)/G(x)$. The 24-bit shifting unit 23A multiplies the transformation matrix $A^{24}$ and the 16×1 matrix $R_A(x)$ together and outputs the remainder $R_A'(x)$ of $x^{24}A(x)/G(x)$.

(A) and (B) of FIG. 17 are diagrams useful in describing the operation of the CRC calculating unit 22B and the 16-bit shifting unit 23B, respectively. Bits $x^{39}$ to $x^{32}$ are input successively to the CRC calculating unit 22B from the higher order side by eight clocks. The content of the shift register SR when input of $x^{32}$ is completed becomes the remainder $R_B(x)$ of $B(x)/G(x)$. The 16-bit shifting unit 23B multiplies the transformation matrix $A^{16}$ and the 16×1 matrix $R_B(x)$ together and outputs the remainder $R_B'(x)$ of $x^{16}B(x)/G(x)$.

Figures 18, 19, 20:
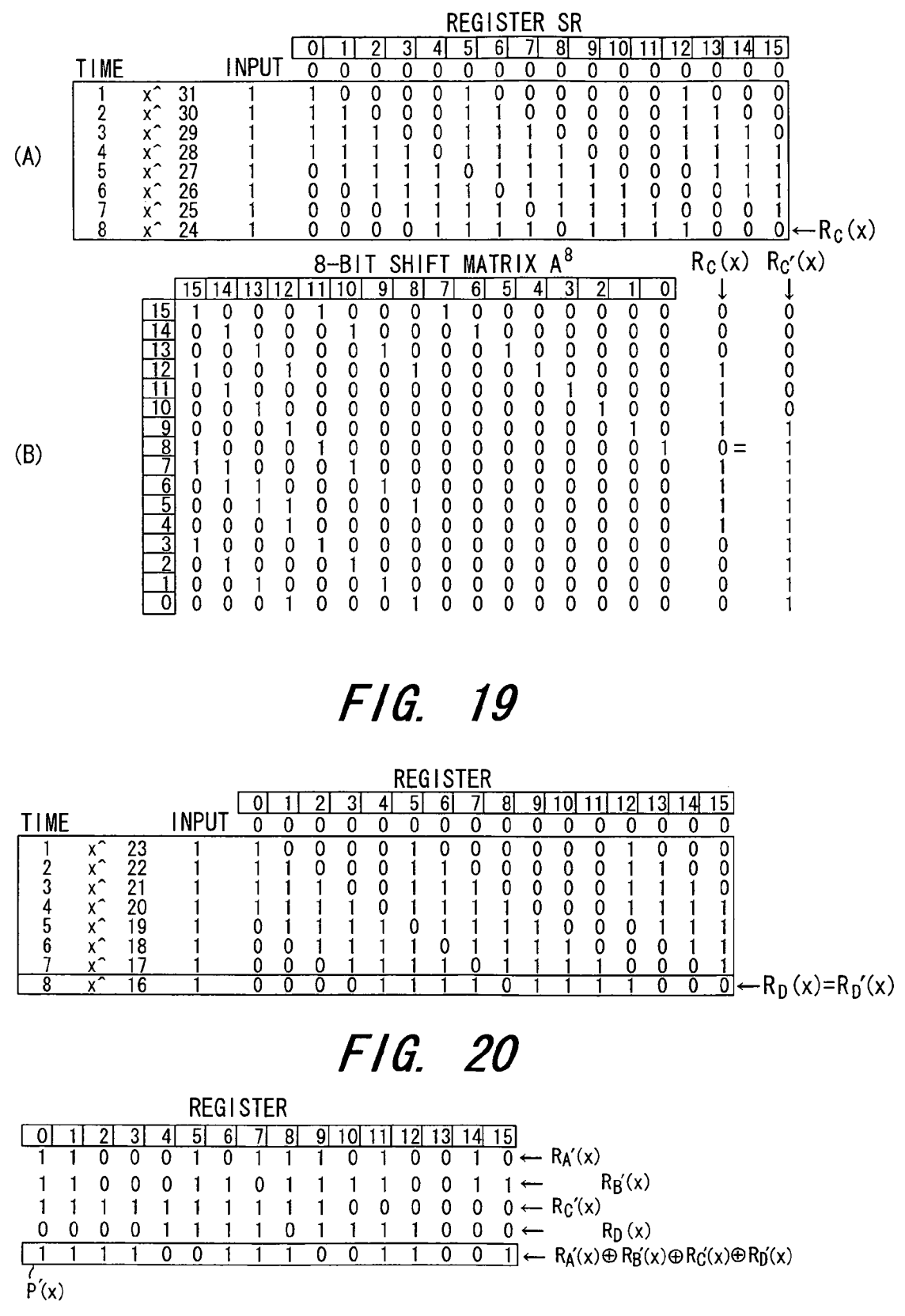

(A) and (B) of FIG. 18 are diagrams useful in describing the operation of the CRC calculating unit 22C and the 8-bit shifting unit 23C, respectively. Bits $x^{31}$ to $x^{24}$ are input successively to the CRC calculating unit 22C from the higher order side by eight clocks. The content of the shift register SR when input of $x^{24}$ is completed becomes the remainder $R_C(x)$ of $C(x)/G(x)$. The 8-bit shifting unit 23C multiplies the transformation matrix $A^8$ and the 16×1 matrix $R_C(x)$ together and outputs the remainder $R_C'(x)$ of $x^8C(x)/G(x)$.

FIG. 19 is a diagram useful in describing operation of the CRC calculating unit 22D. Bits $x^{23}$ to $x^{17}$ are input successively to the CRC calculating unit 22D from the higher order side by eight clocks. The content of the shift register SR when input of $x^{17}$ is completed becomes the remainder $R_D(x)$ [=$R_D'(x)$] of $D(x)/G(x)$.

FIG. 20 is a diagram useful in describing operation of the combiner 24. The latter performs the EX-OR operation among corresponding bits of the remainders $R_A'(x)$, $R_B'(x)$m $R_C'(x)$, $R_D'(x)$ calculated above and outputs 16-bit CRC parity $P'(x)$.

In accordance with the error-detecting decoder of the present invention, the time required for determining whether error is present or not can be shortened to ¼ of that required in the prior art. If the input data string is divided into n segments, then the time required for determining whether error is present or not can be shortened to 1/n. Accordingly, packet delay time can be shortened even in a case where resend control is performed.

(e) Another Example of Error-detecting Decoder

Figure 21:
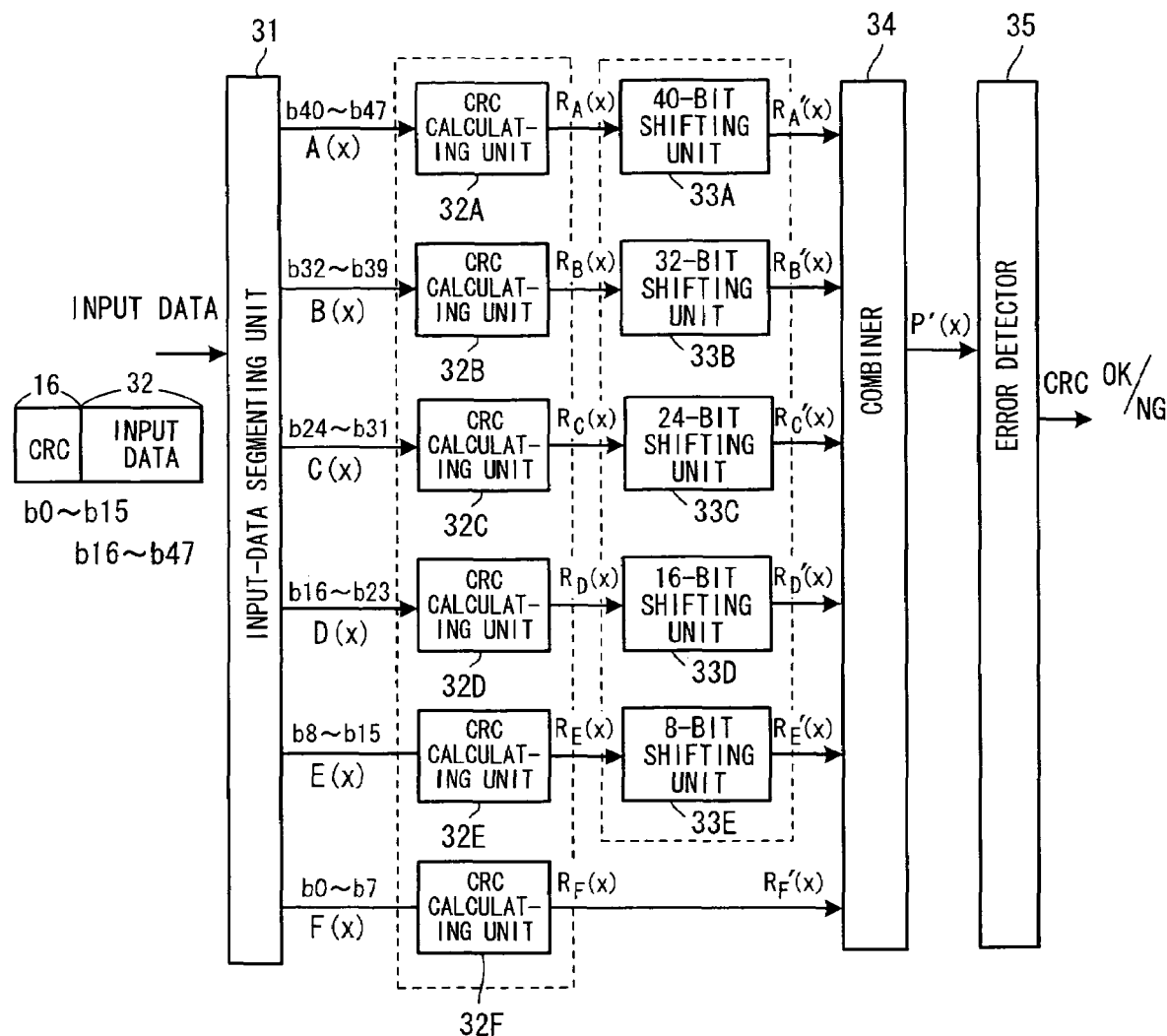
FIG. 21 is a block diagram of another error-detecting decoder according to the present invention.

FIG. 21 is a block diagram of another error-detecting decoder according to the present invention. A data segmenting unit 31 segments a 48-bit input data string b0 to b47, which includes 16-bit CRC parity, into data strings b0 to b7, b8 to b15, b16 to b23, b24 to b31, b32 to b39, b40 to b47 of eight bits each, and adopts this as $$x^{40}A(x)+x^{32}B(x)+x^{24}C(x)+x^{16}D(x)+x^8E(x)+F(x)$$

It should be noted that $A(x)$ represents a polynomial expressed by the 8-bit information of b40 to b47, $B(x)$ a polynomial expressed by the 8-bit information of b32 to b39, $C(x)$ a polynomial expressed by the 8-bit information of b24 to b31, $D(x)$ a polynomial expressed by the 8-bit information of b16 to b23, $E(x)$ a polynomial expressed by the 8-bit information of b8 to b15, and $F(x)$ a polynomial expressed by the 8-bit information of b0 to b7.

CRC calculating units 32A, 32B, 32C, 32D, 32E, 32F which each have the structure shown in (B) of FIG. 43, execute the following division operations:

$$A(x)/G(x), B(x)/G(x), C(x)/G(x), D(x)/G(x), E(x)/G(x), F(x)/G(x)$$

using $G(x)=x^{16}+x^{12}+x^5+1$ as the generator polynomial, and output respective ones of the remainders $$R_A(x), R_B(x), R_C(x), R_D(x), R_E(x), R_F(x)$$

A 40-bit shifting unit 33A subjects the remainder $R_A(x)$ to 40-bit shift processing and calculates the remainder $R_A'(x)$ of $x^{40}A(x)/G(x)$, a 32-bit shifting unit 33B subjects the remainder $R_B(x)$ to 32-bit shift processing and calculates the remainder $R_B'(x)$ of $x^{32}B(x)/G(x)$, a 24-bit shifting unit 33C subjects the remainder $R_C(x)$ to 24-bit shift processing and calculates the remainder $R_C'(x)$ of $x^{24}C(x)/G(x)$, a 16-bit shifting unit 33D subjects the remainder $R_D(x)$ to 16-bit shift processing and calculates the remainder $R_D'(x)$ of $x^{16}D(x)/G(x)$, and an 8-bit shifting unit 33E subjects the remainder $R_E(x)$ to 8-bit shift processing and calculates the remainder $R_E'(x)$ of $x^8E(x)/G(x)$. It should be noted that the 40-bit shifting unit 33A can be implemented by a multiplying circuit that multiplies the transformation matrix $A^{40}$ on the right side of FIG. 6(B) by the 16-bit remainder $R_A(x)$ (expressed by a 16×1 matrix) that is output from the CRC calculating unit 32A, and the 32-bit shifting unit 33B can be implemented by a multiplying circuit that multiplies the transformation matrix $A^{32}$ on the right side of (A) of FIG. 6 by the 16-bit remainder $R_B(x)$ (expressed by a 16×1 matrix) that is output from the CRC calculating unit 32B. Further, the 24-bit CRC calculating unit 33C, 16-bit CRC calculating unit 33D and 8-bit CRC calculating unit 33E can be implemented in a manner similar to that of the error-detected encoder.

When $R_A'(x)$, $R_B'(x)$, $R_C'(x)$, $R_D'(x)$, $R_E'(x)$, $R_F'(x)$ have been found, a combiner 34 combines the remainders (calculates the exclusive-OR on a bit-by-bit basis) according to the following equation:

$$R_A'(x)+R_B'(x)+R_C'(x)+R_D'(x)+R_E'(x)+R_F'(x)$$

and outputs the remainder, i.e., parity bits P'(x), that results when the 48-bit input data string is divided by the generator polynomial G(x). An error detector 35 checks to determine whether all bits of the 16 parity bits P'(x) calculated are "0"s, decides absence of error (CRC is OK) if all bits are "0"s and decides presence of error (CRC is NG) if even one bit is not "0".

FIGS. 22 to 28 are diagrams for describing the operation of each part of the error-detecting encoder of FIG. 21. Here it is assumed that among the input data of 48 bits, the 16 bits $x^0$ to $x^{15}$ on the lower order side are CRC parity bits and the 32 bits $x^{16}$ to $x^{47}$ on the higher order side are all "1"s.

(A) and (B) of FIG. 22 are diagrams useful in describing the operation of the CRC calculating unit 32A and the 40-bit shifting unit 33A, respectively. Bits $x^{47}$ to $x^{40}$ are input successively to the CRC calculating unit 32A from the higher order side by eight clocks. The content of the shift register SR when input of $x^{40}$ is completed becomes the remainder $R_A(x)$ of A(x)/G(x). The 40-bit shifting unit 33A multiplies the transformation matrix $A^{40}$ and the 16×1 matrix $R_A(x)$ together and outputs the remainder $R_A'(x)$ of $x^{40}A(x)/G(x)$.

(A) and (B) of FIG. 23 are diagrams useful in describing the operation of the CRC calculating unit 32B and the 32-bit shifting unit 33B, respectively. Bits $x^{39}$ to $x^{32}$ are input successively to the CRC calculating unit 32B from the higher order side by eight clocks. The content of the shift register SR when input of $x^{32}$ is completed becomes the remainder $R_B(x)$ of B(x)/G(x). The 32-bit shifting unit 33B multiplies the transformation matrix $A^{32}$ and the 16×1 matrix $R_B(x)$ together and outputs the remainder $R_B'(x)$ of $x^{32}B(x)/G(x)$.

(A) and (B) of FIG. 24 are diagrams useful in describing the operation of the CRC calculating unit 32C and the 24-bit shifting unit 33C, respectively. Bits $x^{31}$ to $x^{24}$ are input successively to the CRC calculating unit 32C from the higher order side by eight clocks. The content of the shift register SR when input of $x^{24}$ is completed becomes the remainder $R_C(x)$ of C(x)/G(x). The 8-bit shifting unit 33C multiplies the transformation matrix $A^{24}$ and the 16×1 matrix $R_C(x)$ together and outputs the remainder $R_C'(x)$ of $x^{24}C(x)/G(x)$.

(A) and (B) of FIG. 25 are diagrams useful in describing the operation of the CRC calculating unit 32D and the 16-bit shifting unit 33D, respectively. Bits $x^{23}$ to $x^{16}$ are input successively to the CRC calculating unit 32D from the higher order side by eight clocks. The content of the shift register SR when input of $x^{16}$ is completed becomes the remainder $R_D(x)$ of D(x)/G(x). The 16-bit shifting unit 33D multiplies the transformation matrix $A^{16}$ and the 16×1 matrix $R_D(x)$ together and outputs the remainder $R_D'(x)$ of $x^{16}D(x)/G(x)$.

(A) and (B) of FIG. 26 are diagrams useful in describing the operation of the CRC calculating unit 32E and the 8-bit shifting unit 33E, respectively. Bits $x^{15}$ to $x^8$ are input successively to the CRC calculating unit 32E from the higher order side by eight clocks. The content of the shift register SR when input of $x^8$ is completed becomes the remainder $R_E(x)$ of E(x)/G(x). The 8-bit shifting unit 33E multiplies the transformation matrix $A^8$ and the 16×1 matrix $R_E(x)$ together and outputs the remainder $R_E'(x)$ of $x^8E(x)/G(x)$.

FIG. 27 is a diagram useful in describing operation of the CRC calculating unit 32F. Bits $x^7$ to $x^0$ are input successively to the CRC calculating unit 32F from the higher order side by eight clocks. The content of the shift register SR when input of $x^0$ is completed becomes the remainder $R_F(x)$ [$=R_F'(x)$] of F(x)/G(x).

FIG. 28 is a diagram useful in describing operation of the combiner 34. The latter performs the EX-OR operation among corresponding bits of the remainders $R_A'(x)$, $R_B'(x)$m $R_C'(x)$, $R_D'(x)$, $R_E'(x)$, $R_F'(x)$ calculated above and outputs 16-bit CRC parity P'(x). The error detector 35 decides that there is no error if all bits of the CRC parity P'(x) are "0"s and that error is present if even one bit is "1".

(f) Comparison of Present Invention and Prior Art

If the data length is 32 bits, 32 clocks are required to generate parity with the error-detecting encoder of the prior art. With the error-detecting encoder of the present invention shown in FIG. 1, however, the number of blocks required is eight and therefore calculation time is shortened to ¼.

Further, if the data length is 32 bits and there are 16 parity bits, 32 clocks are required with the prior-art error-detecting decoder that employs the coincidence-detecting decoding method. With the error-detecting decoder of the present invention shown in FIG. 15, however, the number of blocks required is eight and therefore calculation time is shortened to ¼.

Further, if the data length is 32 bits and there are 16 parity bits, 48 clocks are required with the prior-art error-detecting decoder that employs the method of detecting all "0"s. With the error-detecting decoder of the present invention shown in FIG. 21, however, the number of blocks required is eight and therefore calculation time is shortened to ⅙.

The encoders and decoders of the present invention involve hardware that is four times, four times and six times greater in terms of size, respectively, in inverse proportion to calculation time. However, when a case where CRC calculation is performed at an information rate of 100 Mbps and with a 25-MHz clock is considered, the scale of the hardware is equivalent to that of the prior-art example.

Figure 29:
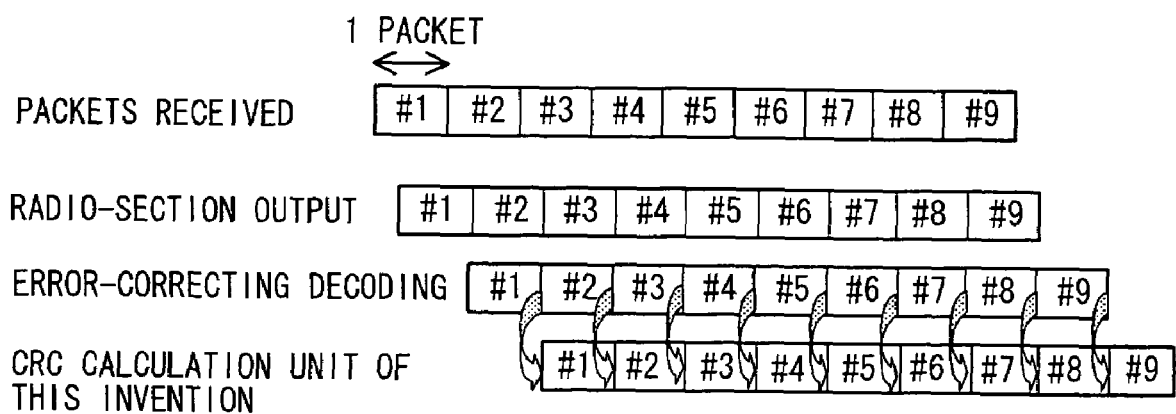
FIG. 29 is a diagram useful in describing the advantages of the present invention.
Figure 47:
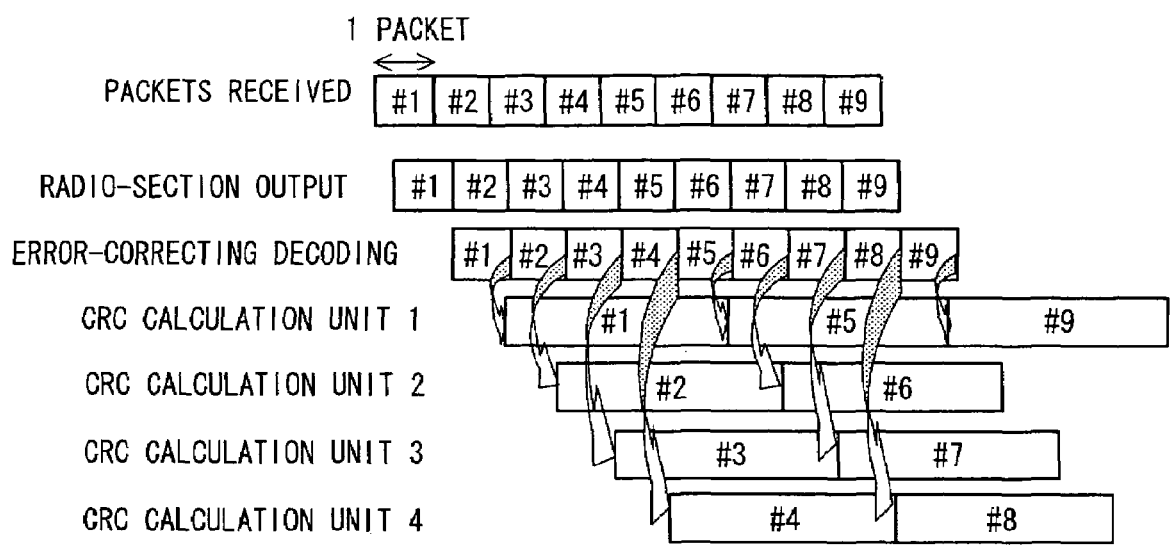
FIG. 47 is a diagram useful in describing the problems of the prior art.

Specifically, in order to perform CRC calculation at an information rate of 100 Mbps and with a 25-MHz clock, four error-detecting decoders are required in the example of the prior art, as described in connection with FIG. 47. With the present invention, on the other hand, only one error-detecting decoder is sufficient because calculation speed is four times greater, as illustrated in FIG. 29. As a result, in the example of the prior art and the present invention, ① the scale of the hardware of the error-detecting decoder, ② the number of items of hardware required to perform a CRC calculation at an information rate of 100 Mbps and with a 25-MHz clock and ③ the computation time are as illustrated in Table 1. It will be understood from the table that in accordance with the present invention, high-speed calculation can be achieved without changing the overall scale of the hardware. Though the foregoing description relates to an error-detecting decoder, the same hold trues for an error-detecting encoder.

TABLE 1

|  | SCALE OF HARDWARE | NUMBER OF HARDWARE ITEMS REQUIRED | CALCULATION TIME |
| --- | --- | --- | --- |
| ERROR-DETECTING DECODER OF PRIOR-ART EXAMPLE | 1 | 4 | 1 |
| ERROR-DETECTING DECODER OF PRESENT INVENTION | 4 | 1 | ¼ |

(B) First Embodiment

Figure 30:
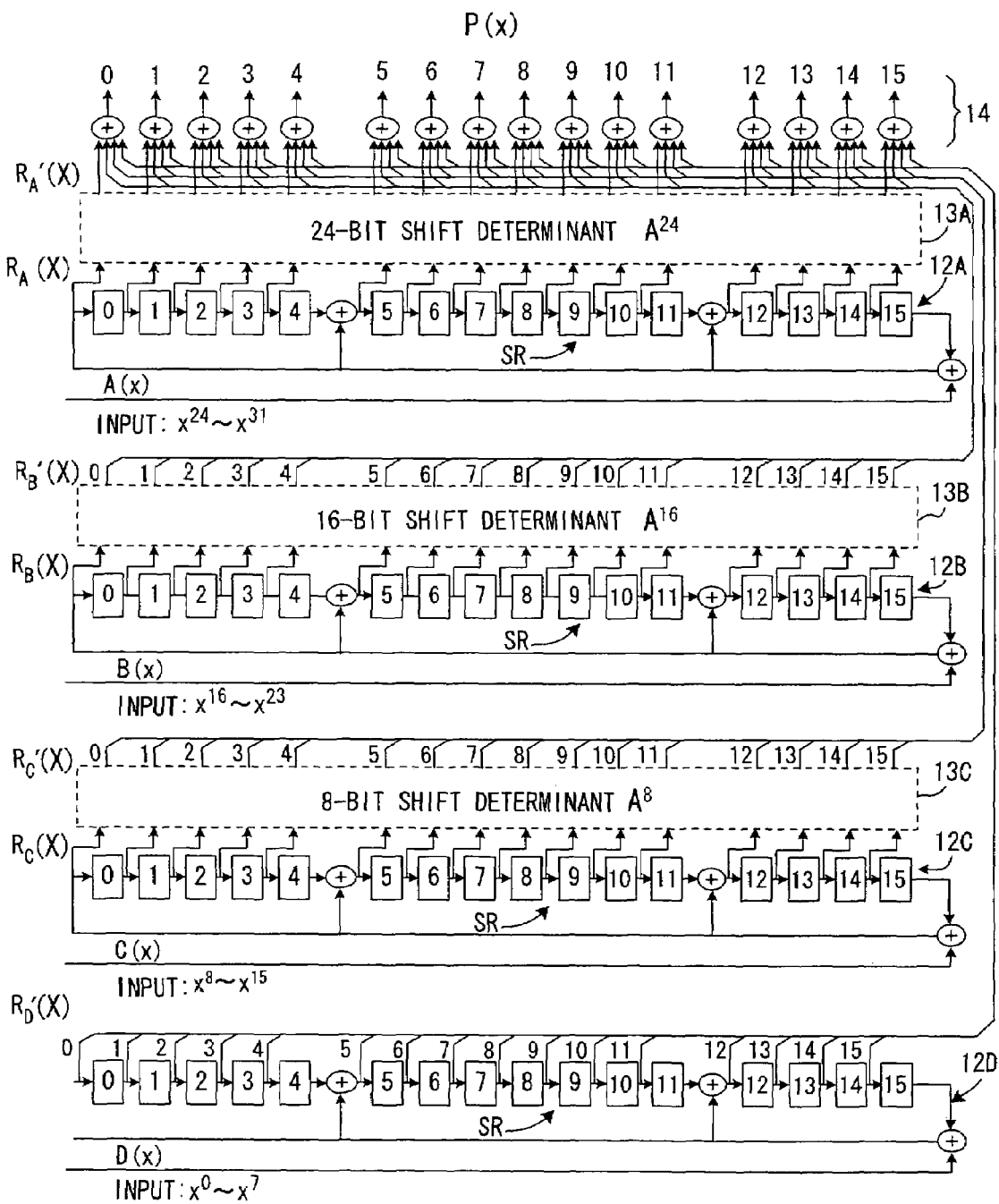
FIG. 30 is a diagram illustrating the structure of an error-detecting encoder according to a first embodiment.

FIG. 30 is a diagram illustrating the structure of an error-detecting encoder according to a first embodiment. This is for a case where CRC parity of a 32-bit data string $x^1$ to $x^{31}$ is generated by the generator polynomial $G(x)=x^{16}+x^{12}+x^5+1$. Components in FIG. 30 identical with those shown in FIG. 1 are designated by like reference characters. Further, it is assumed that 32-bit input data is segmented into strings $x^0$ to $x^7$, $x^8$ to $x^{15}$, $x^{16}$ to $x^{23}$, $x^{24}$ to $x^{31}$ of eight bits each and is expressed by $$x^{24}A(x)+x^{16}B(x)+x^8C(x)+D(x)$$

Assume that the initial value in the shift register SR in all of the CRC calculating units 12A to 12D is "0". A data segmenting unit (not shown) segments the 32-bit data string into strings $x^0$ to $x^7$, $x^8$ to $x^{15}$ $x^{16}$ to $x^{23}$, $x^{24}$ to $x^{31}$ of eight bits each and input these strings to respective ones of the CRC calculating units.

The bits $x^{31}$ to $x^{24}$ are input to the shift register of the CRC calculating unit 12A from the higher order side by eight clocks, and the result of calculation [the remainder $R_A(x)$ of $A(x)/G(x)$] is subjected to 24-bit shift processing by the 24-bit shifting unit 13A to effect a conversion to the remainder $R_A'(x)$ of $x^{24}A(x)/G(x)$.

The bits $x^{23}$ to $x^{16}$ are input to the shift register of the CRC calculating unit 12B from the higher order side by eight clocks, and the result of calculation [the remainder $R_B(x)$ of $B(x)/G(x)$] is subjected to 16-bit shift processing by the 16-bit shifting unit 13B to effect a conversion to the remainder $R_B'(x)$ of $x^{16}B(x)/G(x)$.

The bits $x^{15}$ to $x^8$ are input to the shift register of the CRC calculating unit 12C from the higher order side by eight clocks, and the result of calculation [the remainder $R_C(x)$ of $C(x)/G(x)$] is subjected to 8-bit shift processing by the 8-bit shifting unit 13C to effect a conversion to the remainder $R_C'(x)$ of $x^8C(x)/G(x)$.

The bits $x^7$ to $x^0$ are input to the shift register of the CRC calculating unit 12D from the higher order side by eight clocks, whereby the remainder $R_D(x)$ of $D(x)/G(x)$ is calculated.

The above-described calculations are performed simultaneously, and the combiner 14 takes the EX-OR of these results of calculation, namely the remainders $R_A'(x)$, $R_B'(x)$, $R_C'(x)$, $R_D(x)$, bit by bit and outputs CRC parity P(x).

(C) Second Embodiment

Figure 31:
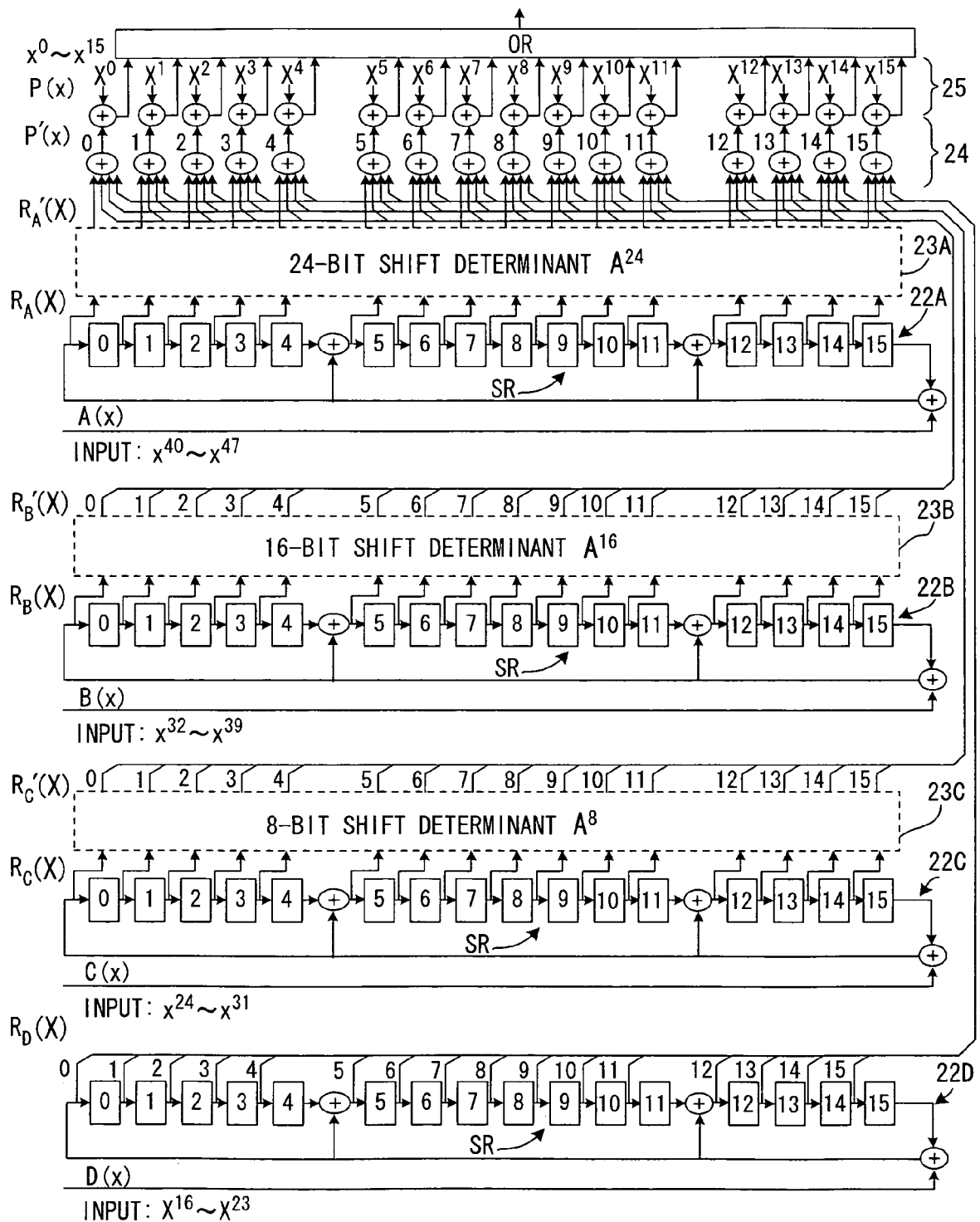
FIG. 31 is a diagram illustrating the structure of an error-detecting decoder according to a second embodiment.

FIG. 31 is a diagram illustrating the structure of an error-detecting encoder according to a second embodiment. Components in FIG. 31 identical with those shown in FIG. 15 are designated by like reference characters. Here 16-bit CRC parity has been appended to the lower order side of 32-bit input data. This CRC parity has been generated using the generator polynomial $G(x)=x^{16}+x^{12}+x^5+1$ and appended to the input data string. Accordingly, the error-detecting decoder detects whether the information bits of 32 bits and the 16-bit CRC parity are correct using this generator polynomial $G(x)=x^{16}+x^{12}+x^5+1$.

Assume that the initial value in the shift register SR in all of the CRC calculating units 22A to 22D is "0". A data segmenting unit (not shown) separates the 48-bit data string into 16-bit CRC parity $x^0$ to $x^{15}$ on the lower order side and 32-bit input data $x^{16}$ to $x^{47}$ on the higher order side, segments the 32-bit input data into data strings $x^{16}$ to $x^{23}$, $x^{24}$ to $x^{31}$, $x^{32}$ to $x^{39}$, $x^{40}$ to $x^{47}$ of eight bits each and inputs these data strings to respective ones of the CRC calculating units.

The bits $x^{47}$ to $x^{40}$ are input to the shift register of the CRC calculating unit 22A from the higher order side by eight clocks and the result of calculation [the remainder $R_A(x)$ of $A(x)/G(x)$] by the CRC calculating unit 22A is input to the 24-bit shifting unit 23A, whereby 24-bit shift processing is executed to effect a conversion to the remainder $R_A'(x)$ of $x^{24}A(x)/G(x)$.

The bits $x^{39}$ to $x^{32}$ are input to the shift register of the CRC calculating unit 22B from the higher order side by eight clocks and the result of calculation [the remainder $R_B(x)$ of $B(x)/G(x)$] by the CRC calculating unit 22B is input to the 16-bit shifting unit 23B, whereby 16-bit shift processing is executed to effect a conversion to the remainder $R_B'(x)$ of $x^{16}B(x)/G(x)$.

The bits $x^{31}$ to $x^{24}$ are input to the shift register of the CRC calculating unit 22C from the higher order side by eight clocks and the result of calculation [the remainder $R_C(x)$ of $C(x)/G(x)$] by the CRC calculating unit 22C is input to the 8-bit shifting unit 23C, whereby 8-bit shift processing is executed to effect a conversion to the remainder $R_C'(x)$ of $x^8C(x)/G(x)$.

The bits $x^{23}$ to $x^{16}$ are input to the shift register of the CRC calculating unit 22D from the higher order side by eight clocks, whereby the remainder $R_D(x)$ of $D(x)/G(x)$ is calculated.

The above-described calculations are performed simultaneously, and the combiner 24 takes the EX-OR of these results of calculation, namely the remainders $R_A'(x)$, $R_B'(x)$, $R_C'(x)$, $R_D(x)$, bit by bit and outputs CRC parity P'(x). The comparator 25 takes the EX-OR, bit by bit, between this 16-bit CRC parity P'(x) and the CRC parity P(x) ($x^{15}$ to $x^0$)

that has been appended to the input data, calculates the sum (logical OR) and detects error. Specifically, if the CRC parity bits P'(x) that are the result of calculation and the CRC parity bits P(x) that have been appended to the input data are all the same and there is no error, then the comparator 25 outputs "0". If there is an error, then the comparator 25 outputs "1".

(C) Third Embodiment

Figure 32:
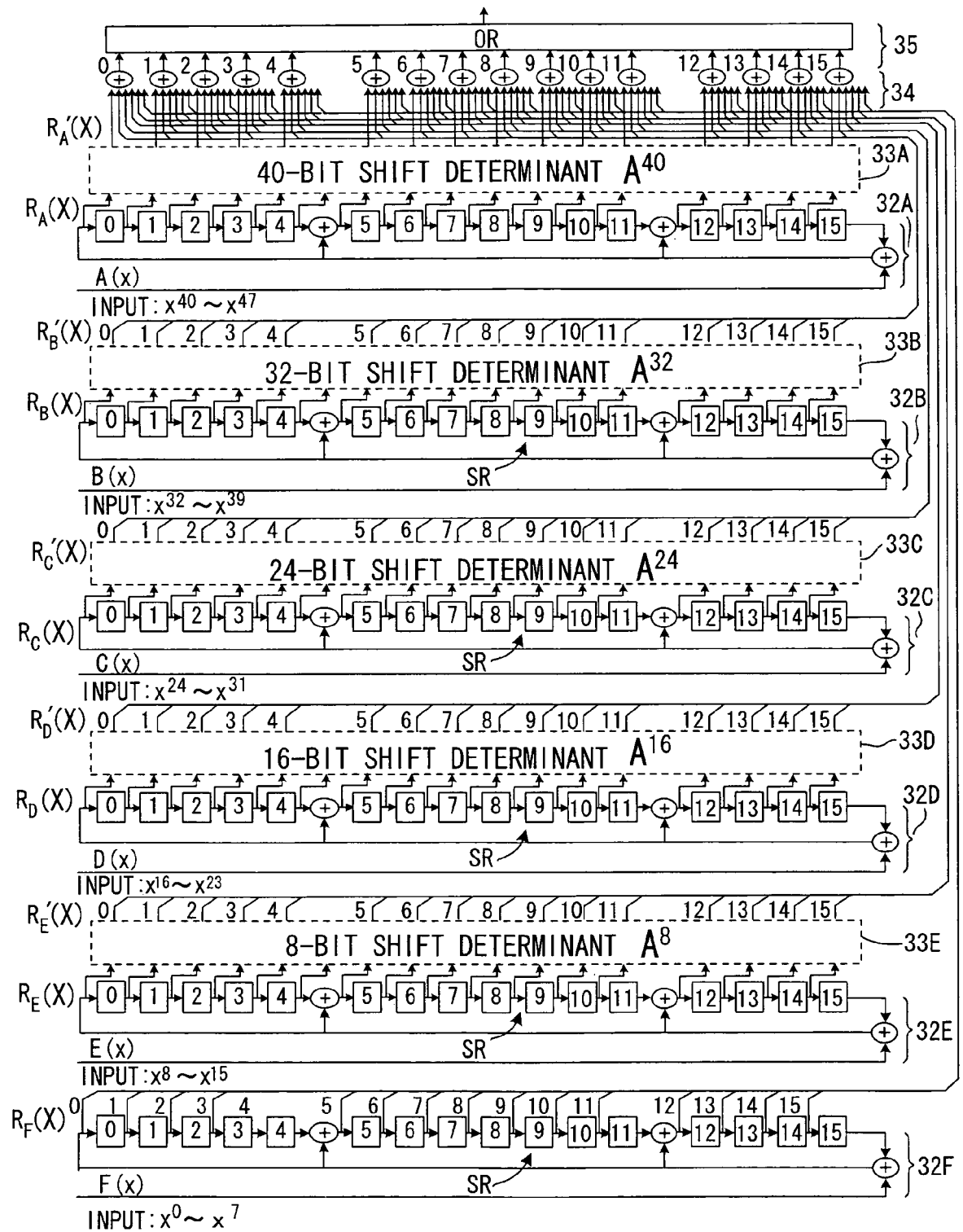
FIG. 32 is a diagram illustrating the structure of an error-detecting decoder according to a third embodiment.

FIG. 32 is a diagram illustrating the structure of an error-detecting encoder according to a third embodiment. Components in FIG. 32 identical with those shown in FIG. 21 are designated by like reference characters. In FIG. 32, 16-bit CRC parity has been appended to the lower order side of 32-bit input data. This CRC parity has been generated using the generator polynomial $G(x)=x^{16}+x^{12}+x^5+1$ and appended to the input data string. Accordingly, the error-detecting decoder detects whether the information bits of 32 bits and the 16-bit CRC parity are correct using this generator polynomial $G(x)=x^{16}+x^{12}+x^5+1$.

The 48-bit data string is segmented into data strings $x^0$ to $x^7$, $x^8$ to $x^{15}$, $x^{16}$ to $x^{23}$, $x^{24}$ to $x^{31}$, $x^{32}$ to $x^{39}$, $x^{40}$ to $x^{47}$ of eight bits each and is expressed by the following polynomial:

$$x^{40}A(x)+x^{32}B(x)+x^{24}C(x)+x^{16}D(x)+x^8E(x)+F(x)$$

Assume that the initial value in the shift register SR in all of the CRC calculating units 32A to 32F is "0". A data segmenting unit (not shown) segments the 48-bit data string into data strings $x^0$ to $x^7$, $x^8$ to $x^{15}$, $x^{16}$ to $x^{23}$, $x^{24}$ to $x^{31}$, $x^{32}$ to $x^{39}$, $x^{40}$ to $x^{47}$ of eight bits each and inputs these data strings to respective ones of the CRC calculating units.

The bits $x^{47}$ to $x^{40}$ are input to the shift register of the CRC calculating unit 32A from the higher order side by eight clocks and the result of calculation [the remainder $R_A(x)$ of $A(x)/G(x)$] is input to the 40-bit shifting unit 33A, whereby 40-bit shift processing is executed to effect a conversion to the remainder $R_A'(x)$ of $x^{40}A(x)/G(x)$.

The bits $x^{39}$ to $x^{32}$ are input to the shift register of the CRC calculating unit 32B from the higher order side by eight clocks and the result of calculation [the remainder $R_B(x)$ of $B(x)/G(x)$] is input to the 32-bit shifting unit 33B, whereby 32-bit shift processing is executed to effect a conversion to the remainder $R_B'(x)$ of $x^{32}B(x)/G(x)$.

The bits $x^{31}$ to $x^{24}$ are input to the shift register of the CRC calculating unit 32C from the higher order side by eight clocks and the result of calculation [the remainder $R_C(x)$ of $C(x)/G(x)$] is input to the 24-bit shifting unit 23C, whereby 24-bit shift processing is executed to effect a conversion to the remainder $R_C'(x)$ of $x^{24}C(x)/G(x)$.

The bits $x^{23}$ to $x^{16}$ are input to the shift register of the CRC calculating unit 32D from the higher order side by eight clocks and the result of calculation [the remainder $R_D(x)$ of $D(x)/G(x)$] is input to the 16-bit shifting unit 33D, whereby 16-bit shift processing is executed to effect a conversion to the remainder $R_D'(x)$ of $x^{16}D(x)/G(x)$.

The bits $x^{15}$ to $x^8$ are input to the shift register of the CRC calculating unit 32E from the higher order side by eight clocks and the result of calculation [the remainder $R_E(x)$ of $E(x)/G(x)$] is input to the 8-bit shifting unit 33E, whereby 8-bit shift processing is executed to effect a conversion to the remainder $R_E'(x)$ of $x^8E(x)/G(x)$.

The bits $x^7$ to $x^0$ are input to the shift register of the CRC calculating unit 32F from the higher order side by eight clocks, whereby the remainder $R_F(x)$ of $F(x)/G(x)$ is calculated.

The above-described calculations are performed simultaneously, and the combiner 34 takes the EX-OR of these results of calculation, namely the remainders $R_A'(x)$, $R_B'(x)$, $R_C'(x)$, $R_D'(x)$, $R_E'(x)$, $R_F(x)$, bit by bit and outputs 16-bit CRC parity P'(x). The error detector 35 calculates the OR of all bits of P'(x). If all bits of the CRC parity P'(x) are "0"s, then there is no error and the error detector 35 outputs "0". If even one bit is "1", then there is an error and the error detector 35 outputs "1".

(E) Fourth Embodiment

Figure 33:
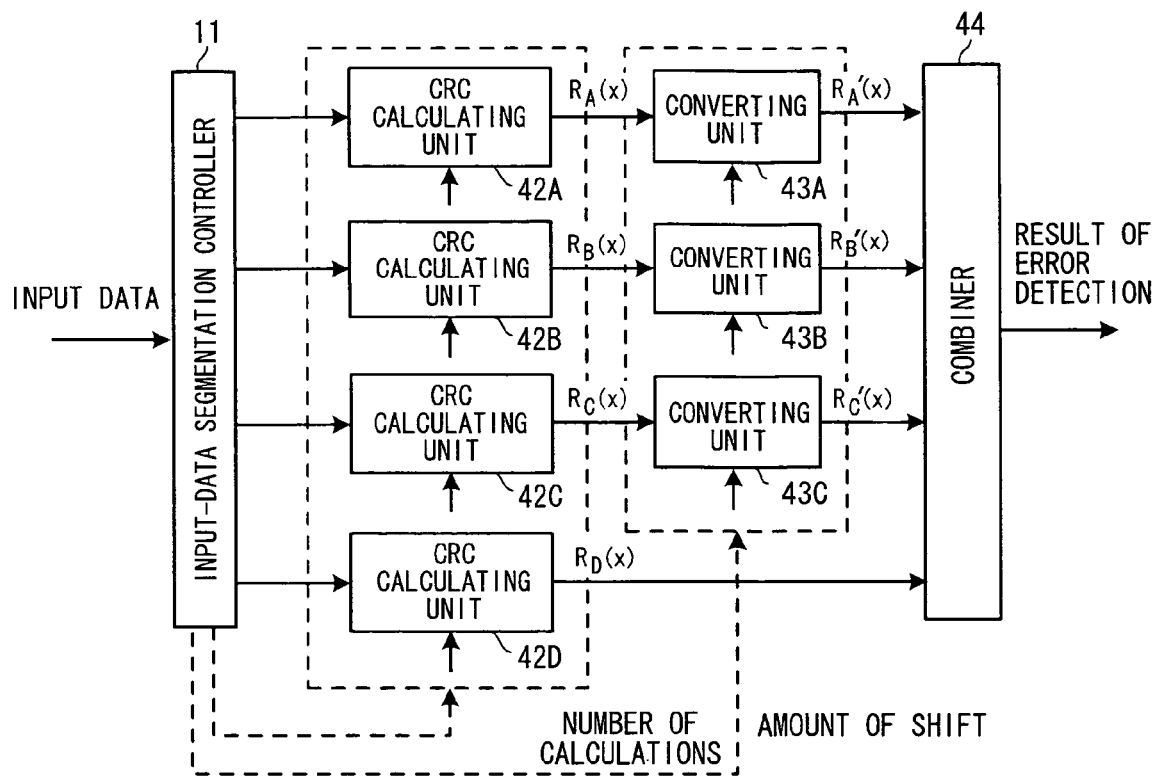
FIG. 33 is a diagram illustrating the structure of an error-detecting decoder according to a fourth embodiment.

FIG. 33 is a block diagram of another error-detecting decoder according to a fourth embodiment. The decoding scheme is the same as that of FIG. 21. The error-detecting decoder of FIG. 33 has four CRC calculating units 42A to 42D. In such case an input-data segmentation controller 41 makes the bit length that is input to each of the CRC calculating units 42A to 42D equal to (overall input bit length)/4

In general, if there are n-number of CRC calculating units, the input bit length is made (overall input bit length)/n For example, if the bit length of CRC error-detecting encoding is 40 bits inclusive of the CRC parity bits, then the input-data segmentation controller 41 segments the input data into the following ten bits at a time:

$$x^{39}, x^{38}, x^{37}, \ldots, x^{31}, x^{30}$$

$$x^{29}, x^{28}, x^{27}, \ldots, x^{21}, x^{20}$$

$$x^{19}, x^{18}, x^{17}, \ldots, x^{11}, x^{10}$$

$$x^9, x^8, x^7, \ldots, x^1, x^0$$

and inputs these to the CRC calculating units 42A, 42B, 42C, 42D, respectively, together with the number ten of input bits (number of calculations). Further, the input-data segmenting unit 41 inputs the amount of bit shift to each of shifting converters 43A, 43B, 43C. In the example above, the input-data segmenting unit 41 instructs the shifting converter 43A of a 30-bit shift, instructs the shifting converter 43B of a 20-bit shift and instructs the shifting converter 43C of a 10-bit shift.

By virtue of the foregoing, the CRC calculating units 42A, 42B, 42C, 42D output the contents of the shift registers, which prevail at the time the data of the specified number of bits is input thereto, as the remainders $R_A(x)$, $R_B(x)$, $R_C(x)$, $R_D(x)$. Further, the shifting converter 43A applies 30-bit shift processing to the remainder $R_A(x)$ input thereto to effect a conversion to the remainder $R_A'(x)$, the shifting converter 43B applies 20-bit shift processing to the remainder $R_B(x)$ input thereto to effect a conversion to the remainder $R_B'(x)$, and the shifting converter 43C applies 10-bit shift processing to the remainder $R_C(x)$ input thereto to effect a conversion to the remainder $R_C'(x)$. A combiner 44 calculates, bit by bit, the EX-OR of the remainders $R_A'(x)$, $R_B'(x)$, $R_C'(x)$, $R_D(x)$, combines the results and performs error detection based upon whether or not all bits are "0"s.

Further, if the next bit length of CRC error-detecting encoding is 50 bits inclusive of the CRC parity bits, then the input-data segmentation controller 41 segments the input data into the following data strings of 13 bits, 13 bits, 12 bits and 12 bits each:

$$x^{49}, x^{48}, x^{47}, \ldots, x^{38}, x^{37}$$

$x^{36}, x^{35}, x^{34}, \ldots, x^{25}, x^{24}$ $x^{23}, x^{22}, x^{21}, \ldots, x^{13}, x^{12}$ $x^{11}, x^{10}, x^9, \ldots, x^1, x^0$ and inputs these to the CRC calculating units 42A, 42B, 42C, 42D, respectively, together with the numbers 13, 13, 12, 12 of input bits (number of calculations). Further, the input-data segmentation controller 41 inputs the amount of bit shift to each of shifting converters 43A, 43B, 43C. In the example above, the input-data segmenting unit 41 instructs the shifting converter 43A of a 37-bit shift, instructs the shifting converter 43B of a 24-bit shift and instructs the shifting converter 43C of a 12-bit shift.

By virtue of the foregoing, the CRC calculating units 42A, 42B, 42C, 42D output the contents of the shift registers, which prevail at the time the data of the specified number of bits is input thereto, as the remainders $R_A(x)$, $R_B(x)$, $R_C(x)$, $R_D(x)$. Further, the shifting converter 43A applies 37-bit shift processing to the remainder $R_A(x)$ input thereto to effect a conversion to the remainder $R_A(x)$, the shifting converter 43B applies 24-bit shift processing to the remainder $R_B(x)$ input thereto to effect a conversion to the remainder $R_B'(x)$, and the shifting converter 43C applies 12-bit shift processing to the remainder $R_C(x)$ input thereto to effect a conversion to the remainder $R_C'(x)$. The combiner 44 calculates, bit by bit, the EX-OR of the remainders $R_A'(x)$, $R_B'(x)$, $R_C'(x)$, $R_D(x)$, combines the results and performs error detection based upon whether or not all bits are "0"s.

As a result of the foregoing, the calculation times of the CRC calculating units can be uniformalized by segmenting the input data string approximately equally by 1/n. This makes it possible to shorten the CRC calculation time.

The idea of segmenting the input data string approximately equally by 1/n can be applied to the error-detecting decoder of FIG. 15 and to the error-detecting encoder of FIG. 1. That is, the input-data segmenting units 11, 21 of FIGS. 1 and 15 segment the input data string in such a manner that the data lengths of the data strings after segmentation will be equal and input the segmented data strings to the CRC calculation units (dividing means) one bit at a time from the higher order side.

(F) Fifth Embodiment

Figure 34:
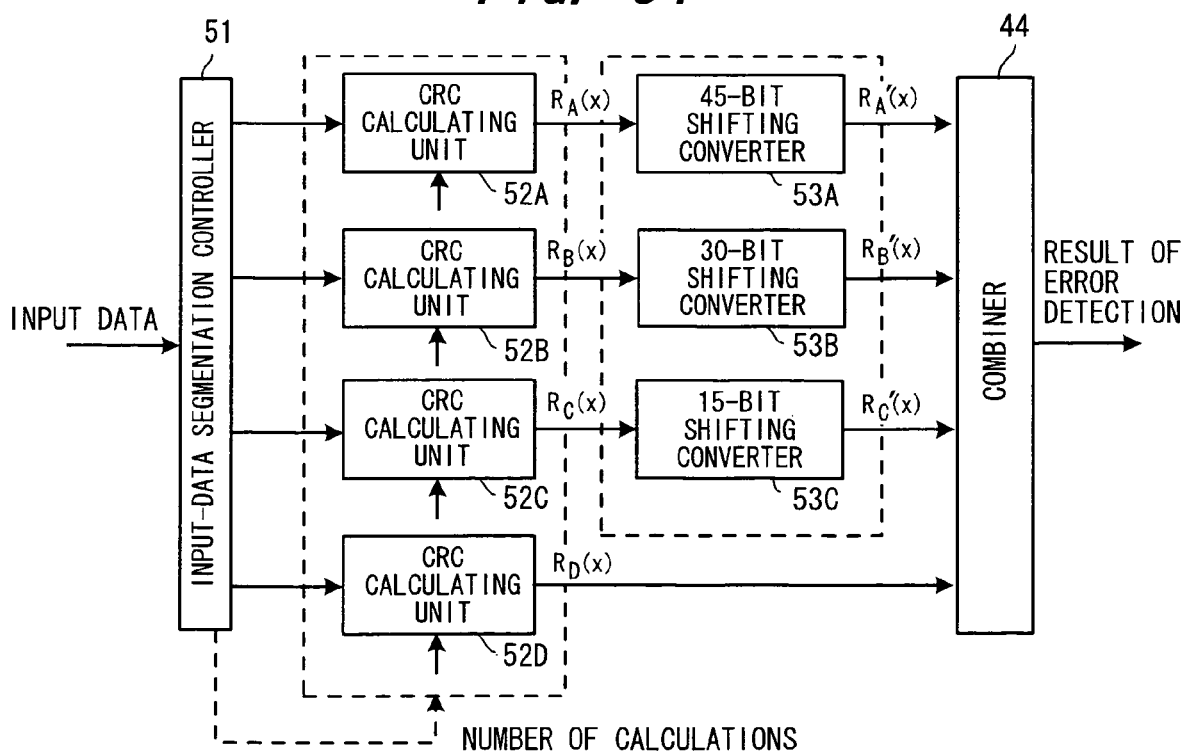
FIG. 34 is a diagram illustrating the structure of an error-detecting decoder according to a fifth embodiment.

FIG. 34 is a block diagram of another error-detecting decoder according to a fifth embodiment. The decoding scheme is the same as that of FIG. 21. The following is assumed for the error-detecting decoder:

① the maximum bit length of CRC error-detecting encoding is 60 bits;

② four CRC calculating units 52A to 52D are provided;

③ the maximum number of bits input to each of the CRC calculating units 52A to 52D is 15; and ④ shifting converters 53A to 53C execute 45-bit, 30-bit and 15-bit shift processing, respectively.

If the bit length of CRC error-detecting encoding is assumed to be 40 bits in the arrangement above, then an input-data segmentation controller 51 segments these 40 bits from the lower order side into data strings of 15 bits each, inputs these data strings to the CRC calculating units 52D, 52C in the order mentioned and inputs the remaining ten bits to the CRC calculating unit 52B; it inputs no bits to the CRC calculating unit 52A. That is, the input-data segmentation controller 51 inputs no data to the CRC calculating unit 52A and inputs the following to respective ones of the CRC calculating units 52B, 52C, 52D:

$x^{39}, x^{38}, x^{37}, x^{36}, x^{35}, x^{34}, x^{33}, x^{32}, x^{31}, x^{30}$ $x^{29}, x^{28}, x^{27}, x^{26}, x^{25}, x^{24}, x^{23}, x^{22}, x^{21}, x^{20}, x^{19}, x^{18}, x^{17}, x^{16}, x^{15}$ $x^{14}, x^{13}, x^{12}, x^{11}, x^{10}, x^9, x^8, x^7, x^6, x^5, x^4, x^3, x^2, x^1, x^0$

Further, the input-data segmenting unit 51 inputs the numbers 0, 10, 15, 15 of input bits (numbers of calculations) to the CRC calculating units 52A, 52B, 52C, 52D, respectively.

By virtue of the foregoing, the CRC calculating units 52A, 52B, 52C, 52D output the contents of the shift registers, which prevail at the time the data of the specified number of bits is input thereto, as the remainders $R_A(x)$ (=0), $R_B(x)$, $R_C(x)$, $R_D(x)$. Further, the 45-bit shifting converter 53A applies 45-bit shift processing to the remainder $R_A(x)$ (=0) input thereto to effect a conversion to the remainder $R_A'(x)$ (=0), the 30-bit shifting converter 53B applies 30-bit shift processing to the remainder $R_B(x)$ input thereto to effect a conversion to the remainder $R_B'(x)$, and the 15-bit shifting converter 53C applies 15-bit shift processing to the remainder $R_C(x)$ input thereto to effect a conversion to the remainder $R_C'(x)$. A combiner 54 calculates, bit by bit, the EX-OR of the remainders $R_A'(x)$, $R_B'(x)$, $R_C'(x)$, $R_D(x)$, combines the results and performs error detection based upon whether or not all bits are "0"s.

Further, if the input bit length of CRC error-detecting encoding is 50 bits, then the input-data segmentation controller 51 segments the input data into the following data strings of 15 bits, 15 bits, 15 bits and 5 bits each from the lower order side and inputs them to the CRC calculating units 52A, 52B, 52C, 52D, respectively:

$x^{49}, x^{48}, x^{47}, x^{46}, x^{45}$ $x^{44}, x^{43}, x^{42}, x^{41}, x^{40}, x^{39}, x^{38}, x^{37}, x^{36}, x^{35}, x^{34}, x^{33}, x^{32}, x^{31}, x^{30}$ $x^{29}, x^{28}, x^{27}, x^{26}, x^{25}, x^{24}, x^{23}, x^{22}, x^{21}, x^{20}, x^{19}, x^{18}, x^{17}, x^{16}, x^{15}$ $x^{14}, x^{13}, x^{12}, x^{11}, x^{10}, x^9, x^8, x^7, x^6, x^5, x^4, x^3, x^2, x^1, x^0$

Further, the input-data segmentation controller 51 inputs the numbers 5, 15, 15, 15 of input bits (number of calculations) to the CRC calculating units 52A, 52B, 52C, 52D, respectively.

By virtue of the foregoing, the CRC calculating units 52A, 52B, 52C, 52D output the contents of the shift registers, which prevail at the time the data of the specified number of bits is input thereto, as the remainders $R_A(x)$, $R_B(x)$, $R_C(x)$, $R_D(x)$. Further, the 45-bit shifting converter 53A applies 45-bit shift processing to the remainder $R_A(x)$ input thereto to effect a conversion to the remainder $R_A'(x)$, the 30-bit shifting converter 53B applies 30-bit shift processing to the remainder $R_B(x)$ input thereto to effect a conversion to the remainder $R_B'(x)$, and the 15-bit shifting converter 53C applies 15-bit shift processing to the remainder $R_C(x)$ input thereto to effect a conversion to the remainder $R_C'(x)$. The combiner 54 calculates, bit by bit, the EX-OR of the remainders $R_A'(x)$, $R_B'(x)$, $R_C'(x)$, $R_D(x)$, combines the results and performs error detection based upon whether or not all bits are "0"s.

In accordance with the fifth embodiment, each bit-shifting converter need only execute a fixed number of bit shifts at all times, as a result of which the structure can be simplified.

The idea of segmenting the input data string in such a manner that the bit lengths of the segmented data strings take on set lengths can be applied to the error-detecting decoder of FIG. 15 and to the error-detecting encoder of FIG. 1. That is, the input-data segmenting units 11, 21 of FIGS. 1 and 15 segment the input data string in such a manner that the data lengths of the data strings after segmentation will take on set lengths and input the segmented data strings to the CRC calculation units (dividing means) one bit at a time from the higher order side.

(G) Sixth Embodiment

Figure 35:
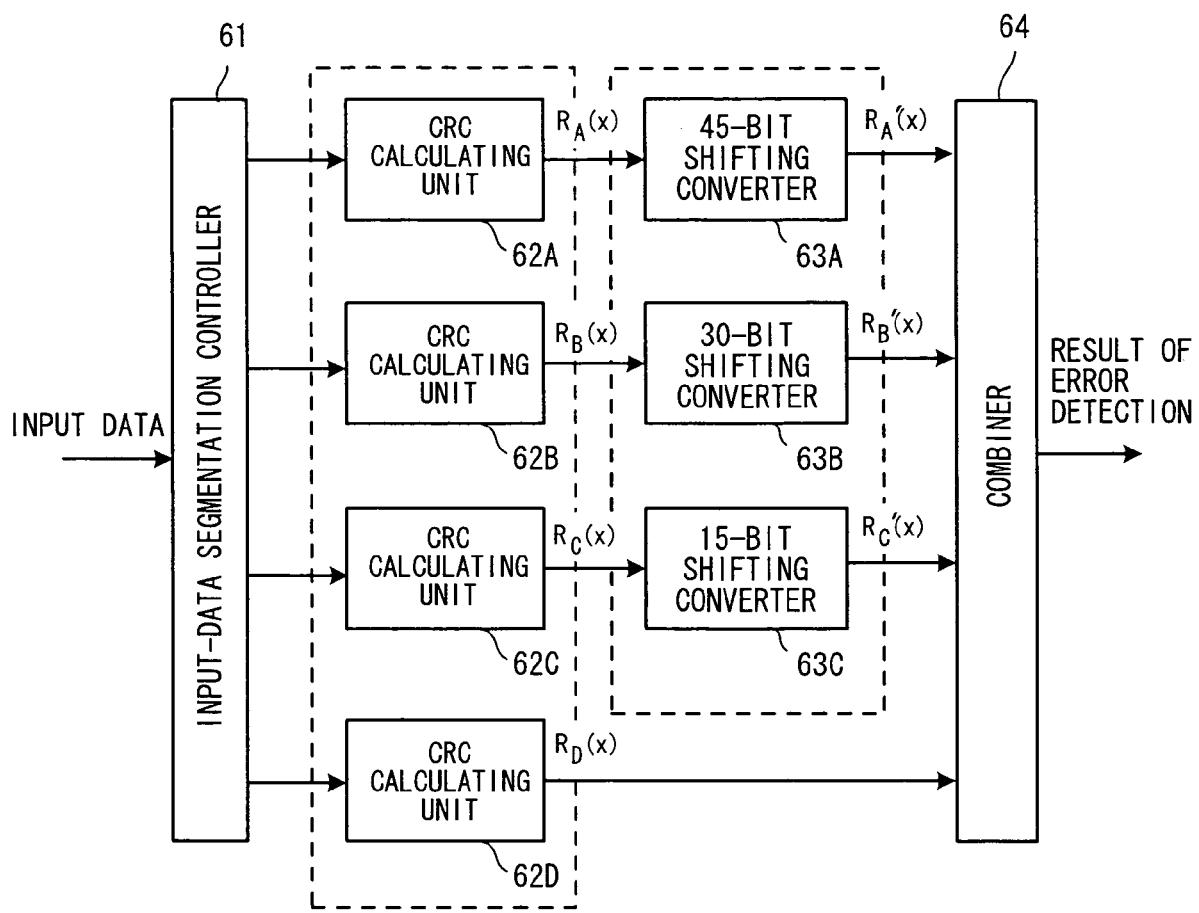
FIG. 35 is a diagram illustrating the structure of an error-detecting decoder according to a sixth embodiment.

FIG. 35 is a block diagram of another error-detecting decoder according to a sixth embodiment. The decoding scheme is the same as that of FIG. 21. The following is assumed for the error-detecting decoder:

① the maximum bit length of CRC error-detecting encoding is 60 bits;
② four CRC calculating units 62A to 62D are provided;
③ the maximum number of bits input to each of the CRC calculating units 62A to 62D is 15; and
④ shifting converters 63A to 63C execute 45-bit, 30-bit and 15-bit shift processing, respectively.

If the bit length of CRC error-detecting encoding is assumed to be 40 bits in the arrangement above, then an input-data segmentation controller 61 segments these 40 bits from the lower order side into data strings of 15 bits each, inputs these data strings to the CRC calculating units 62D, 62C in the order mentioned and inputs a total of 15 bits, into which "0"s have been embedded from the higher order side, to those units for which the number of input bits is less than 15. Accordingly, the input-data segmentation controller 61 inputs the following data strings to respective ones of the CRC calculating units 62A, 62B, 62C, 62D:

0, 0, 0, 0, 0, 0, 0, 0, 0, 0, 0, 0, 0, 0, 0, 0

0, 0, 0, 0, 0, $x^{39}$, $x^{38}$, $x^{37}$, $x^{36}$, $x^{35}$, $x^{34}$, $x^{33}$, $x^{32}$, $x^{31}$, $x^{30}$ $x^{29}$, $x^{28}$, $x^{27}$, $x^{26}$, $x^{25}$, $x^{24}$, $x^{23}$, $x^{22}$, $x^{21}$, $x^{20}$, $x^{19}$, $x^{18}$, $x^{17}$, $x^{16}$, $x^{15}$ $x^{14}$, $x^{13}$, $x^{12}$, $x^{11}$, $x^{10}$, $x^{9}$, $x^{8}$, $x^{7}$, $x^{6}$, $x^{5}$, $x^{4}$, $x^{3}$, $x^{2}$, $x^{1}$, $x^{0}$

By virtue of the foregoing, the CRC calculating units 62A, 62B, 62C, 62D output the contents of the shift registers, which prevail at the time the 15-bit data is input thereto, as the remainders $R_A(x)$ (=0), $R_B(x)$, $R_C(x)$, $R_D(x)$. Further, the 45-bit shifting converter applies 63A 45-bit shift processing to the remainder $R_A(x)$ (=0) input thereto to effect a conversion to the remainder $R_A'(x)$ (=0), the 30-bit shifting converter 63B applies 30-bit shift processing to the remainder $R_B(x)$ input thereto to effect a conversion to the remainder $R_B'(x)$, and the 15-bit shifting converter 63C applies 15-bit shift processing to the remainder $R_C(x)$ input thereto to effect a conversion to the remainder $R_C'(x)$. A combiner 64 calculates, bit by bit, the EX-OR of the remainders $R_A'(x)$, $R_B'(x)$, $R_C'(x)$, $R_D(x)$, combines the results and performs error detection based upon whether or not all bits are "0"s.

Further, if the bit length of CRC error-detecting encoding is 50 bits, then the input-data segmentation controller 61 segments the input data into the following data strings of 15 bits, 15 bits, 15 bits and 5 bits each from the lower order side and inputs them to the CRC calculating units 62A, 62B, 62C, 62D, respectively:

0, 0, 0, 0, 0, 0, 0, 0, 0, 0, 0, $x^{49}$, $x^{48}$, $x^{47}$, $x^{46}$, $x^{45}$ $x^{44}$, $x^{43}$, $x^{42}$, $x^{41}$, $x^{40}$, $x^{39}$, $x^{38}$, $x^{37}$, $x^{36}$, $x^{35}$, $x^{34}$, $x^{33}$, $x^{32}$, $x^{31}$, $x^{30}$ $x^{29}$, $x^{28}$, $x^{27}$, $x^{26}$, $x^{25}$, $x^{24}$, $x^{23}$, $x^{22}$, $x^{21}$, $x^{20}$, $x^{19}$, $x^{18}$, $x^{17}$, $x^{16}$, $x^{15}$ $x^{14}$, $x^{13}$, $x^{12}$, $x^{11}$, $x^{10}$, $x^{9}$, $x^{8}$, $x^{7}$, $x^{6}$, $x^{5}$, $x^{4}$, $x^{3}$, $x^{2}$, $x^{1}$, $x^{0}$

By virtue of the foregoing, the CRC calculating units 62A, 62B, 62C, 62D output the contents of the shift registers, which prevail at the time the 15-bit data is input thereto, as the remainders $R_A(x)$, $R_B(x)$, $R_C(x)$, $R_D(x)$. Further, the 45-bit shifting converter 63A applies 45-bit shift processing to the remainder $R_A(x)$ input thereto to effect a conversion to the remainder $R_A'(x)$, the 30-bit shifting converter 63B applies 30-bit shift processing to the remainder $R_B(x)$ input thereto to effect a conversion to the remainder $R_B'(x)$, and the 15-bit shifting converter 53C applies 15-bit shift processing to the remainder $R_C(x)$ input thereto to effect a conversion to the remainder $R_C'(x)$. The combiner 64 calculates, bit by bit, the EX-OR of the remainders $R_A'(x)$, $R_B'(x)$, $R_C'(x)$, $R_D(x)$, combines the results and performs error detection based upon whether or not all bits are "0"s.

In accordance with the sixth embodiment, a fixed number of items of data is input to each of the CRC calculating units at all times, as a result of which structure can be simplified. In addition, each bit-shifting converter need only execute a fixed number of bit shifts at all times. This makes possible a further simplification in structure.

The idea of adding "0"s in a number equivalent to the shortfall in number of bits to the higher order side of segmented data strings whose bits lengths are less than the set length can be applied to the error-detecting decoder of FIG. 15 and to the error-detecting encoder of FIG. 1. That is, the data segmenting units 11, 21 of FIGS. 1 and 15 segment the input data string in such a manner that the data lengths of the data strings after segmentation will take on set lengths, add "0"s in a number equivalent to the shortfall in number of bits to the higher order side of segmented data strings whose bits lengths are less than the set length and input the segmented data strings to the CRC calculation units (dividing means) one bit at a time from the higher order side.

(H) Seventh Embodiment

Figure 36:
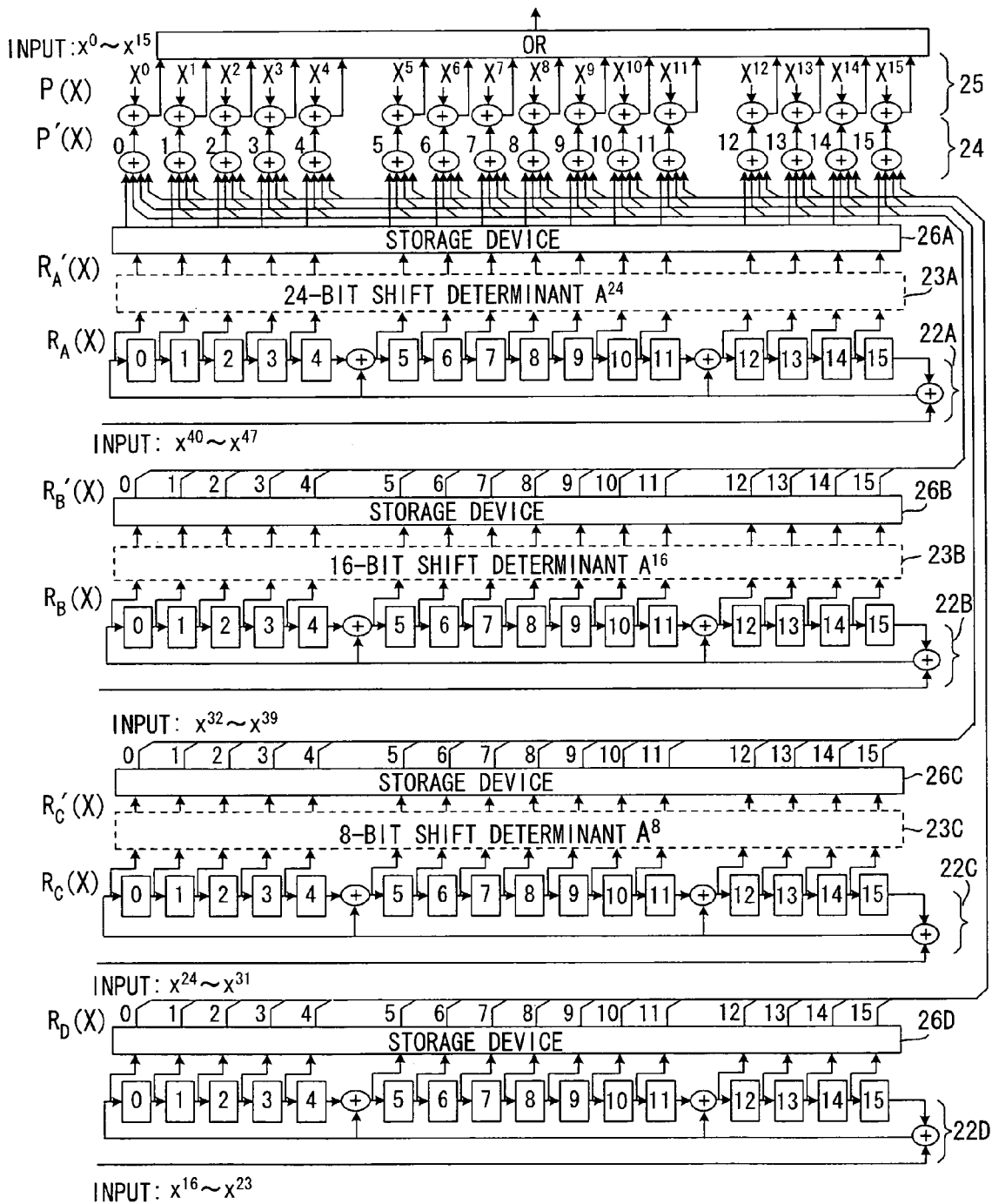
FIG. 36 is a diagram illustrating the structure of an error-detecting decoder according to a seventh embodiment.

FIG. 36 is a block diagram of an error-detecting decoder according to a seventh embodiment. Components identical with those of the error-detecting decoder of FIG. 31 are designated by like reference characters. This embodiment differs in that ① it is provided with storage devices 26A to 26D for storing the remainders $R_A'(x)$, $R_B'(x)$, $R_C'(x)$, $R_D(x)$ obtained by bit-shift processing, and ② a remainder is re-calculated only with regard to 8-bit segmented data that has been input again owing to detection of error, this remainder is combined with stored remainders of other segmented data and CRC parity is output.

In the error-detecting decoder of the seventh embodiment, initial error detection is performed by a method similar to that of FIG. 31. However, if an error has been detected and data partially re-entered, a remainder is re-calculated only for 8-bit segmented data that has been re-entered, this remainder is combined with stored remainders of other segmented data and CRC parity is output.

Assume that the initial value in the shift register in all of the CRC calculating units 22A to 22D is "0" at the start. A data segmenting unit (not shown) separates the 48-bit data string into 16-bit CRC parity $x^0$ to $x^{15}$ on the lower order side and 32-bit input data $x^{16}$ to $x^{47}$ on the higher order side, segments the 32-bit input data into data strings $x^{16}$ to $x^{23}$, $x^{24}$ to $x^{31}$, $x^{32}$ to $x^{39}$, $x^{40}$ to $x^{47}$ of eight bits each and inputs these data strings to respective ones of the CRC calculating units 22A to 22D.

The bits $x^{47}$ to $x^{40}$ are input to the shift register of the CRC calculating unit 22A from the higher order side by eight clocks, the result of calculation [the remainder $R_A(x)$ of $A(x)/G(x)$] by the CRC calculating unit 22A is input to the 24-bit shifting unit 23A, whereby 24-bit shift processing is executed to effect a conversion to the remainder $R_A'(x)$ of $x^{24}A(x)/G(x)$, and the remainder is stored in the storage device 26A.

The bits $x^{39}$ to $x^{32}$ are input to the shift register of the CRC calculating unit 22B from the higher order side by eight clocks, the result of calculation [the remainder $R_B(x)$ of $B(x)/G(x)$] by the CRC calculating unit 22B is input to the 16-bit shifting unit 23B, whereby 16-bit shift processing is executed to effect a conversion to the remainder $R_B'(x)$ of $x^{16}B(x)/G(x)$, and the remainder is stored in the storage device 26B.

The bits $x^{31}$ to $x^{24}$ are input to the shift register of the CRC calculating unit 22C from the higher order side by eight clocks, the result of calculation [the remainder $R_C(x)$ of $C(x)/G(x)$] by the CRC calculating unit 22C is input to the 8-bit shifting unit 23C, whereby 8-bit shift processing is executed to effect a conversion to the remainder $R_C'(x)$ of $x^8C(x)/G(x)$, and the remainder is stored in the storage device 26C.

The bits $x^{23}$ to $x^{16}$ are input to the shift register of the CRC calculating unit 22D from the higher order side by eight clocks, whereby the remainder $R_D(x)$ of $D(x)/G(x)$ is calculated, and the remainder is stored in the storage device 26D.

The above-described calculations are performed simultaneously, and the combiner 24 takes the EX-OR of these results of calculation, namely the remainders $R_A'(x)$, $R_B'(x)$, $R_C'(x)$, $R_D(x)$, bit by bit and outputs CRC parity $P'(x)$. The comparator 25 takes the EX-OR, bit by bit, between this 16-bit CRC parity $P'(x)$ and the CRC parity $P(x)$ ($x^{15}$ to $x^0$) that has been appended to the input data, calculates the sum (logical OR) and detects error. Specifically, if the CRC parity bits $P'(x)$ that are the result of calculation and the CRC parity bits $P(x)$ that have been appended to the input data are all the same and there is no error, then the comparator 25 outputs "0". If there is an error, then the comparator 25 outputs "1".

If an error has been detected, e.g., if only bits $x^{39}$ to $x^{32}$ have been re-entered, the 8-bit data $x^{39}$ to $x^{32}$ is input again only to the shift register of CRC calculating unit 22B by eight clocks and the result of calculation [the remainder $R_B(x)$ of $B(x)/G(x)$] by the CRC calculating unit 22B is input to the 16-bit shifting unit 23B, whereby a 16-bit shift is performed to effect a conversion to the remainder $R_B'(x)$ of $x^{16}B(x)/G(x)$.

The combiner 24 reads out the remainders $R_A'(x)$, $R_C'(x)$, $R_D(x)$ that have been stored in the storage devices 26A, 26C, 26D and takes the EX-OR, bit by bit, between these remainders and the result $R_B'(x)$ obtained by the 16-bit shift in the 24-bit shifting unit 23B. The comparator 25 takes the EX-OR, bit by bit, between this 16-bit CRC parity $P'(x)$ and the CRC parity $P(x)$ ($x^{15}$ to $x^0$) that has been appended to the input data, calculates the sum (logical OR) and detects error.

Figure 37:
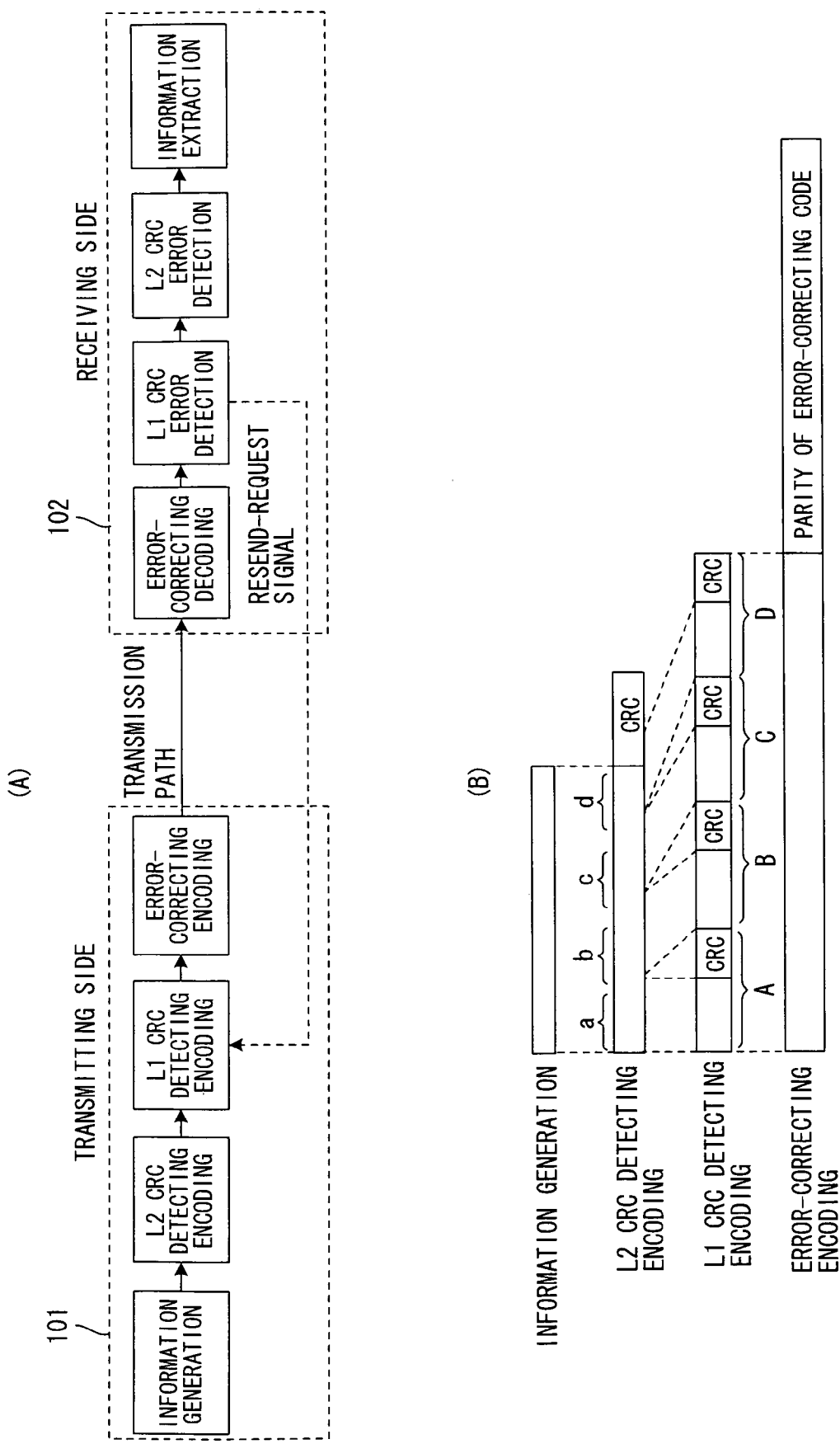
FIG. 37 is a diagram of overall system configuration and a diagram useful in describing data processing.

An example of application of the seventh embodiment will now be illustrated. A case where the CRC has been run twice will be described in accordance with (A) and (B) of FIG. 37. (A) is a block diagram of the overall system, and (B) is a diagram for describing data processing.

A transmitting side 101 subjects the entirety of information to L2-layer CRC error-detecting encoding. Next, the transmitting side segments the data (data with L2-layer CRC parity), which has been encoded for error detection, into a plurality of segments a to d, subjects each item of segmented data to L1-layer CRC error-detecting encoding, finally applies error-correcting encoding and transmits the result.

After error-correcting decoding has been performed, a receiving side 102 segments decoded data into a plurality of segments A to D and applies L1-layer CRC error-detecting processing to each item of segmented data. If L2-layer CRC error-detecting processing were to be executed after it is judged that absolutely no error has been detected as a result of L1 CRC error detection, calculations would be performed twice and, as a consequence, efficiency would decline. Accordingly, error-detecting processing in the L1 layer is executed at the same time as error-detecting processing in the L2 layer. However, if an error is detected in even one of the data strings A to D by L1-layer CRC error detection, CRC error-detecting processing in the L2 layer will be wasted and the same calculations will be performed from the beginning even if only the erroneous portion in the L1 layer is resent.

Here the method of the seventh embodiment is applied. Specifically, by adopting a to d as the units of calculation in L2-layer CRC error detection, the lengths are made the same as the units of CRC calculation in L1-layer error detection, the results of calculation are stored and, if data is partially resent, only this portion is calculated. If this arrangement is adopted, more efficient L2-layer CRC error detection can be performed. Since layers higher than the L2 layer often execute processing by software, the fact that results are obtained by partial calculation is preferable because this improves the processing efficiency of the processor.

Figure 38:
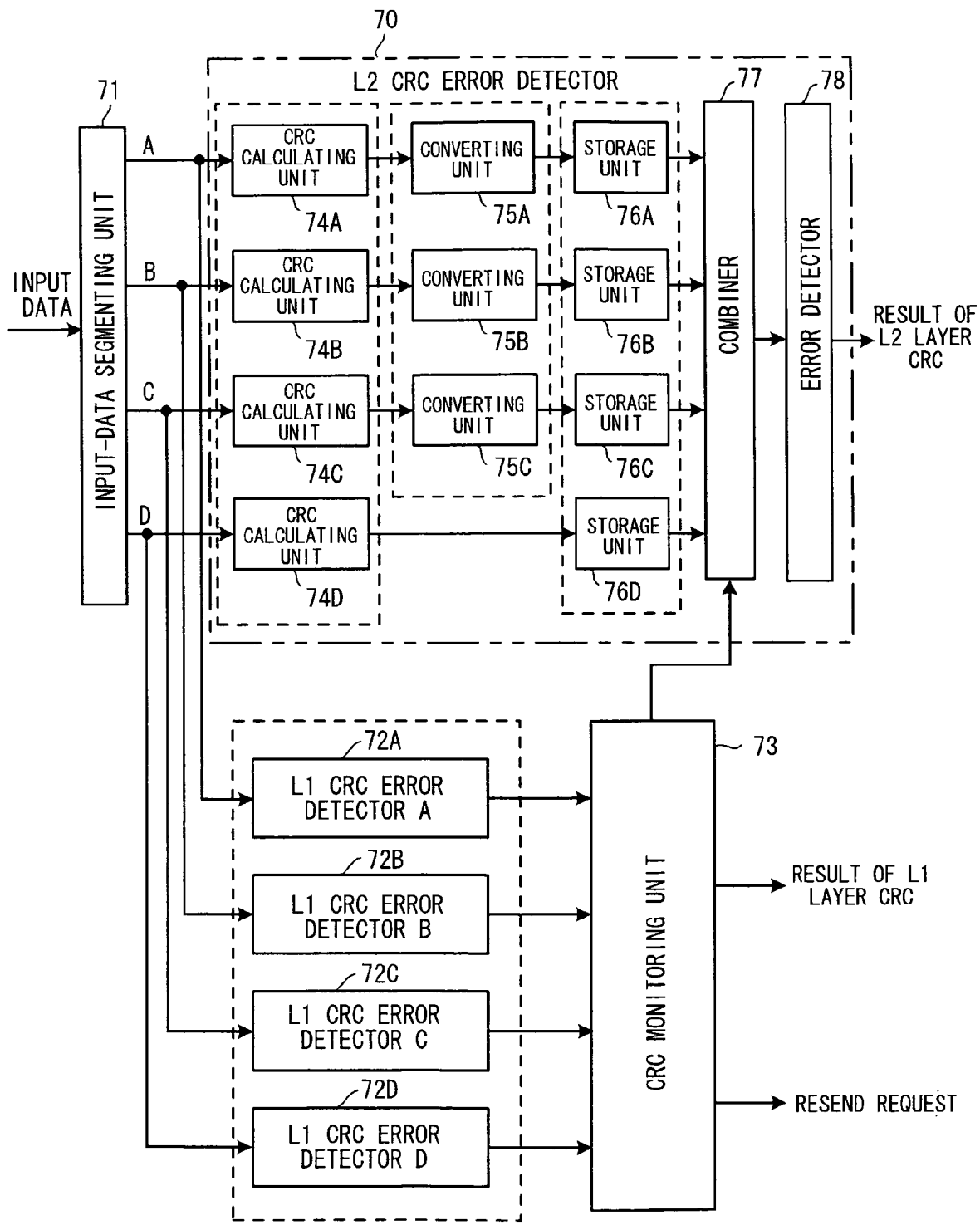
FIG. 38 is a block diagram of an error-detecting decoder, which is an example of application of the seventh embodiment.

FIG. 38 is a block diagram of an error-detecting decoder that is an example of application of the seventh embodiment. An input-data segmentation controller 71 segments an input data string into units A to D [see (B) of FIG. 37] of L1-layer CRC calculation, inputs these to L1 CRC error detectors 72A to 72D, respectively, and to CRC calculating units 74A to 74D, respectively, of an L2 CRC error detector 70. The L1 CRC error detectors 72A to 72D and the L2 CRC error detector 70 execute error-detecting processing simultaneously.

The L1 CRC error detectors 72A to 72D perform CRC calculations with regard to the segmented data strings A to D and output the results of these calculations. A CRC monitoring unit 73 monitors whether L1-layer error exists based upon the results of error detection from the L1 CRC error detectors 72A to 72D and inputs a combine-enable signal to a combiner in the L2 CRC error detector 70 if there is no error.

In parallel with the foregoing, the CRC calculating units 74A to 74D of the L2 CRC error detector 70 output remainders obtained by dividing, by a generator polynomial, the portions of the data from which the L1 CRC parity included in the input data strings A to D has been excluded. Shifting converters 75A to 75C perform a conversion by applying bit-shift processing, in a bit-shift amount conforming to the segmentation position of the data strings A to C, to the remainders obtained by the CRC calculating units 74A to 74D and store the results in storage units 76A to 76D. In response to the combine-enable signal, a combiner 77 combines the remainders (calculates the EX-OR bit by bit) that have been stored in the storage units 76A to 76D, and an error detector 78 performs L2-layer CRC error detection based upon the result of combination.

If any result of error detection by the L1 CRC error detectors 72A to 72D indicates an error, the CRC monitoring unit 73 requests the transmitting side to resend the erroneous portion of the data. For example, if the data string B contains an error, the CRC monitoring unit requests that the data string B be resent. If the data string B has been resent, then the input-data segmentation controller 71 inputs the data to the L1 CRC error detector 72B and to the CRC calculating unit 74B of the L2 CRC error detector 70.

The L1 CRC error detector 72B performs the CRC calculation with regard to the segmented data string B and outputs the result of calculation. The CRC monitoring unit 73 monitors whether L1-layer error exists based upon the results of error detection from the L1 CRC error detectors 72A to 72D and allows the combiner 77 to combine remainders if there is no error. In parallel with the foregoing, the CRC calculating unit 74B outputs the remainder obtained by dividing, by the generator polynomial, the portion of the data from which the L1 CRC parity included in the input data string B has been excluded, and the shifting converter 75B performs a conversion by applying bit-shift processing, in a bit-shift amount conforming to the segmentation position of the data string B, to the remainder obtained by the CRC calculating unit 75B and stores the result in the storage unit 76B. In response to the enable signal from the CRC monitoring unit 73, the combiner 77 combines the remainders (calculates the EX-OR bit by bit) that have been stored in the storage units 76A to 76D, and the error detector 78 performs L2-layer CRC error detection based upon the result of combination.

(I) Eighth Embodiment

Figure 39:
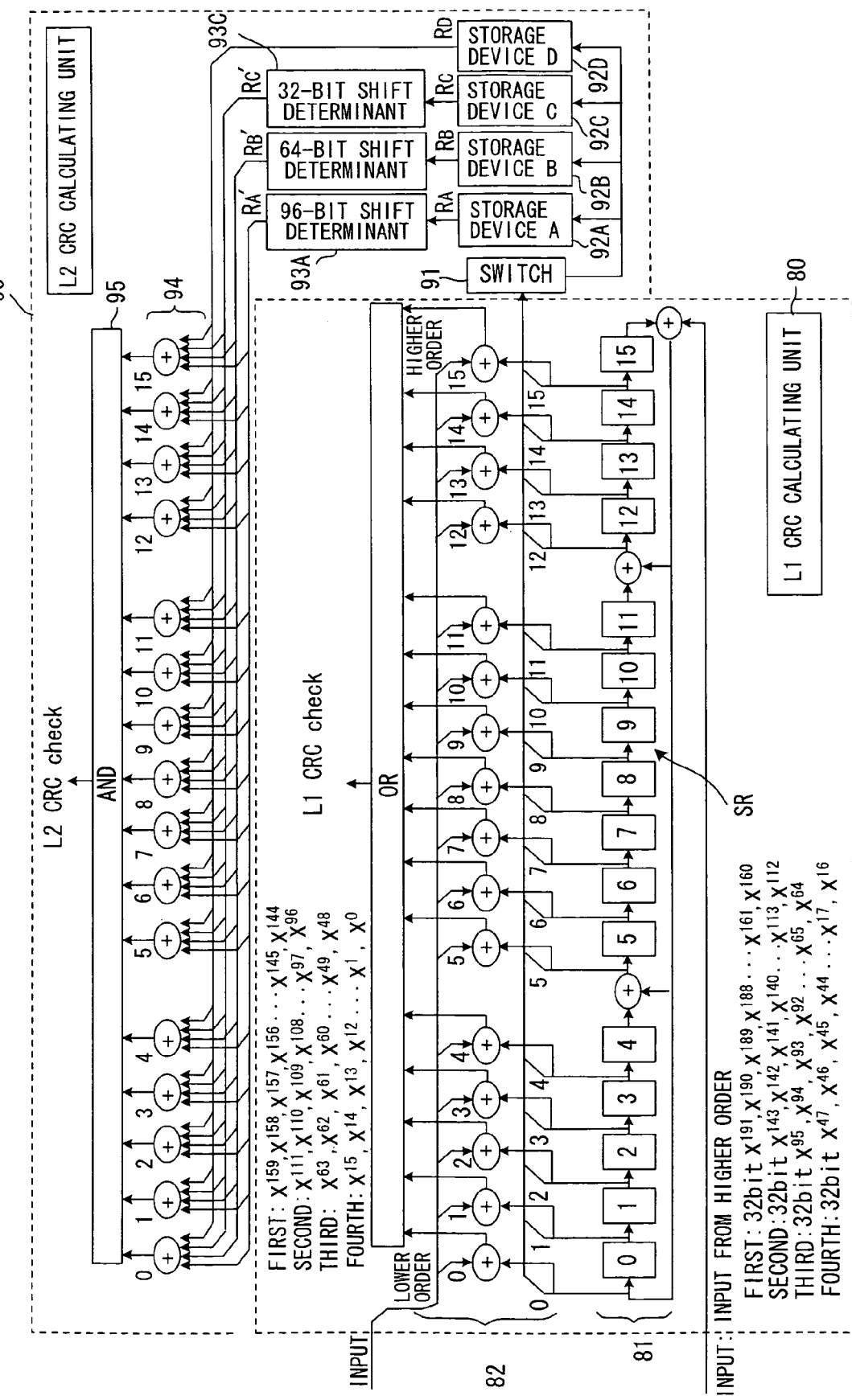
FIG. 39 is a diagram illustrating the structure of an error-detecting decoder according to an eighth embodiment.
Figure 40:
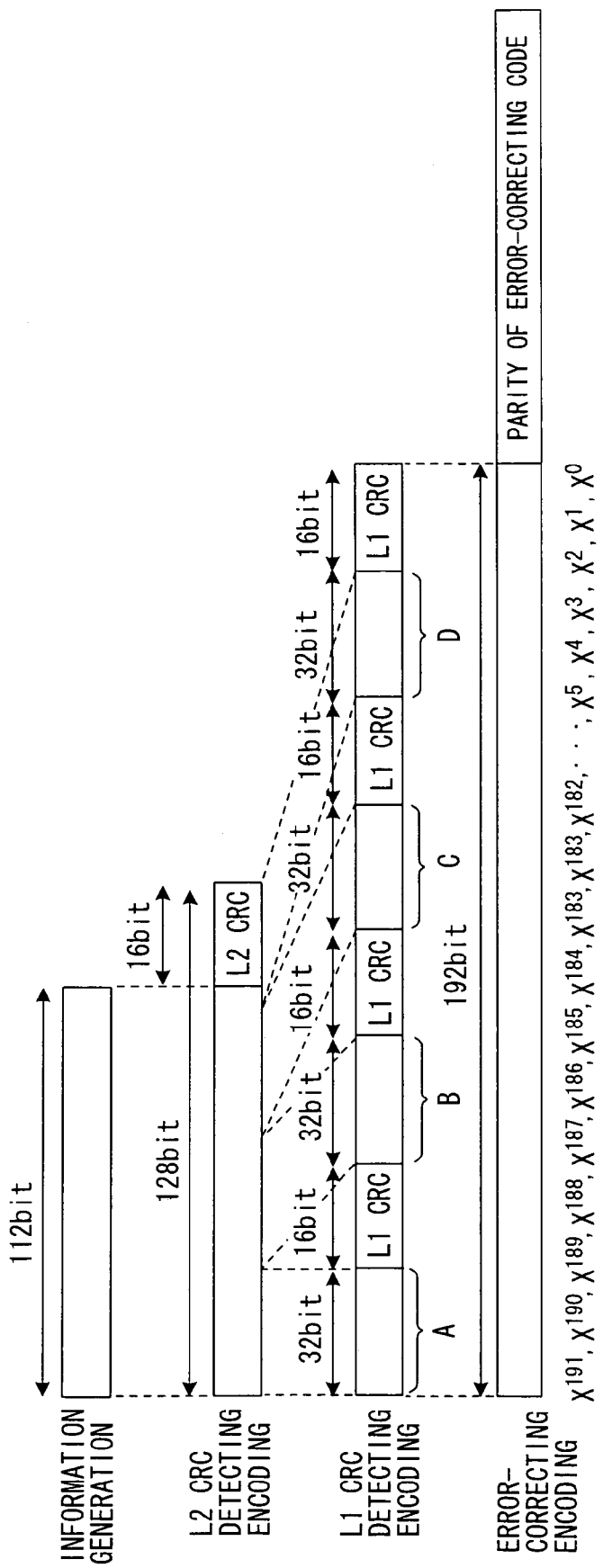
FIG. 40 is a diagram useful in describing data processing.

FIG. 39 is another diagram that shows the structure of an error-detecting decoder according to an eighth embodiment. This is applicable in the system configuration shown in (A) of FIG. 37 in which the CRC is run twice. FIG. 40 is a diagram for describing data processing.

On the side of the error-detecting encoder, L2-layer CRC error-detecting encoding is applied to the entirety of 112-bit information and 16-bit L2 CRC parity is appended, as illustrated in FIG. 40. Next, the 128-bit data (data with the appended L2 CRC parity) that has undergone error-detecting encoding is segmented into a plurality of data strings A to D of 32 bits each, 16-bit L1 CRC parity is appended to each of the segmented data strings A to D, error-correcting encoding is finally applied and the result is transmitted.

An L1 CRC calculating unit 80 (FIG. 3) provided on the receiving side performs an L1 CRC calculation by the coincidence-detecting decoding method. It should be noted that the L1 CRC calculating unit 80 can employ any decoding method, such as the all-"0"s-detecting encoding method or the decoding method of the present invention. Further, it is assumed that an L2 CRC calculating unit 90 performs an L2 CRC calculation by the decoding method shown in FIG. 21.

The L1 CRC calculating unit 80 performs the initial L1 CRC calculation first. Specifically, 32-bit data A ($x^{191}$, $x^{190}$, $x^{189}$, $x^{188}$, ..., $x^{161}$, $x^{160}$) is input to the shift register SR of a divider 81. When input of data to the shift register is completed, an error detector 82 compares the value [remainder $R_A(x)$] in the shift register SR and the L1 CRC parity ($x^{159}$, $x^{158}$, $x^{157}$, $x^{156}$, ..., $x^{145}$, $x^{144}$) and performs L1 CRC error detection based upon whether or not all bits coincide. At the same time, the value [remainder $R_A(x)$] in the shift register is delivered to the L2 CRC calculating unit 90. The latter controls a switch 91 to thereby store this value in a storage device 92A.

Next, the L1 CRC calculating unit 80 clears the shift register SR and performs the next L1 CRC calculation. Specifically, 32-bit data B ($x^{143}$, $x^{142}$, $x^{141}$, $x^{140}$, ..., $x^{113}$, $x^{112}$) is input to the shift register SR. When input of data to the shift register is completed, the error detector 82 compares the value [remainder $R_B(x)$] in the shift register SR and the L1 CRC parity ($x^{111}$, $x^{110}$, $x^{109}$, $x^{108}$, ..., $x^{97}$, $x^{96}$) and performs L1 CRC error detection based upon whether or not all bits coincide. At the same time, the value [remainder $R_B(x)$] in the shift register is delivered to the L2 CRC calculating unit 90. The latter controls the switch 91 to thereby store this value in a storage device 92B.

Next, the L1 CRC calculating unit 80 clears the shift register SR and performs the next L1 CRC calculation. Specifically, 32-bit data B ($x^{95}$, $x^{94}$, $x^{93}$, $x^{92}$, ..., $x^{65}$, $x^{64}$) is input to the shift register SR. When input of data to the shift register is completed, the error detector 82 compares the value [remainder $R_C(x)$] in the shift register SR and the L1 CRC parity ($x^{63}$, $x^{62}$, $x^{61}$, $x^{60}$, ..., $x^{49}$, $x^{48}$) and performs L1 CRC error detection based upon whether or not all bits coincide. At the same time, the value [remainder $R_C(x)$] in the shift register is delivered to the L2 CRC calculating unit 90. The latter controls the switch 91 to thereby store this value in a storage device 92C.

Next, the L1 CRC calculating unit 80 clears the shift register SR and performs the next L1 CRC calculation. Specifically, 32-bit data B ($x^{47}$, $x^{46}$, $x^{45}$, $x^{44}$, ..., $x^{17}$, $x^{16}$) is input to the shift register SR. When input of data to the shift register is completed, the error detector 82 compares the value [remainder $R_D(x)$] in the shift register SR and the L1 CRC parity ($x^{15}$, $x^{14}$, $x^{13}$, $x^{12}$, ..., $x^{1}$, $x^{0}$) and performs L1 CRC error detection based upon whether or not all bits coincide. At the same time, the value [remainder $R_D(x)$] in the shift register is delivered to the L2 CRC calculating unit 90. The latter controls the switch 91 to thereby store this value in a storage device 92D.

When L1 CRC error detection end by virtue of the operation above, the L2 CRC calculating unit 90 starts L2 CRC calculation. Specifically, a 96-bit shifting unit 93A reads the stored data [remainder $R_A(x)$] out of the storage device 92A and applies 96-bit shift processing to this remainder. A 64-bit shifting unit 93B reads the stored data [remainder $R_B(x)$] out of the storage device 92B and applies 64-bit shift processing to this remainder. A 32-bit shifting unit 93C reads the stored data [remainder $R_C(x)$] out of the storage device 92C and applies 32-bit shift processing to this remainder. A combiner 94 calculates, bit by bit, the EX-OR of the bit-shifted remainders $R_A'(x)$, $R_B'(x)$, $R_C'(x)$, $R_D(x)$, and an error detector 95 performs L2-layer CRC error detection based upon whether or not the result of combination is all "0"s for the bits.

Figure 41:
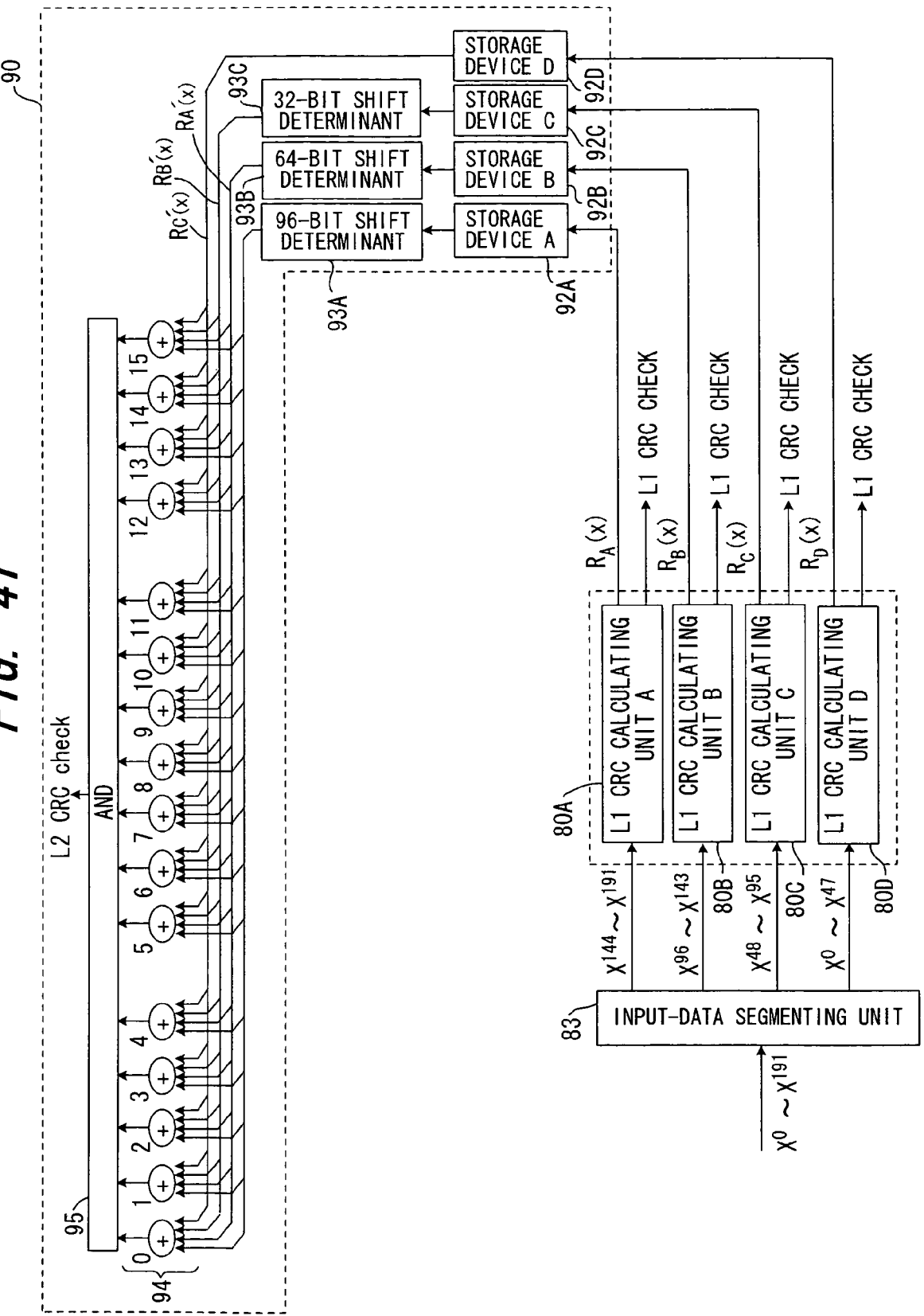
FIG. 41 is a diagram illustrating another structure of an error-detecting decoder according to an eighth embodiment.
Figure 42:
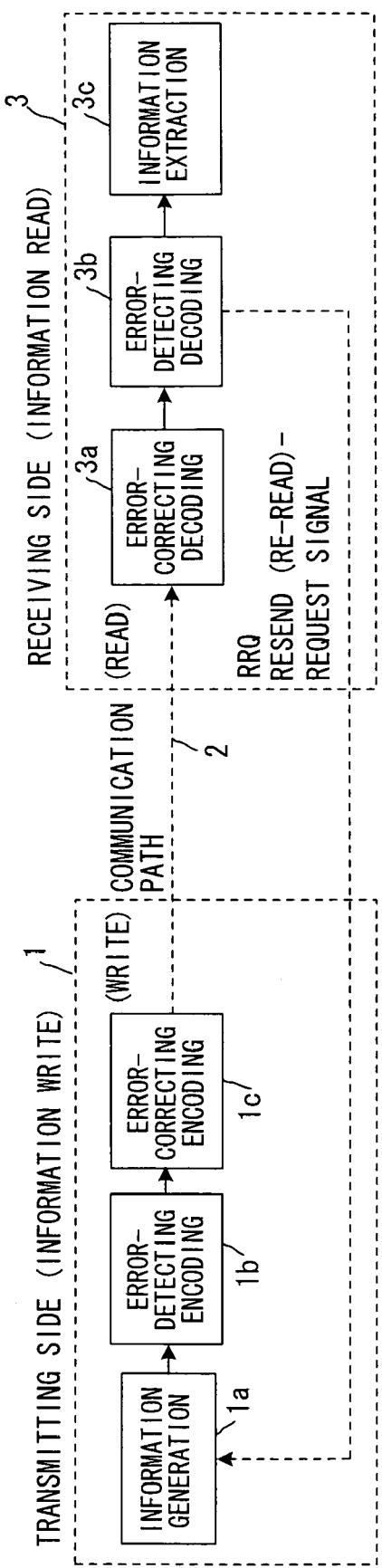
FIG. 42 illustrates an example of the configuration of a system to which error detection is applied.

In FIG. 39, the L1 CRC calculating unit 80 calculates the remainders $R_A(x)$, $R_B(x)$, $R_C(x)$, $R_D(x)$ in serial fashion. However, as shown in FIG. 41, an input-data segmenting unit 83 and four L1 CRC calculating units 80A to 80D can be provided and it can be so arranged that the remainders $R_A(x)$, $R_B(x)$, $R_C(x)$, $R_D(x)$ are calculated by respective ones of these units together with execution of the L1 CRC check. It should be noted that the L1 CRC calculating units 80A to 80D have a structure identical with that of the L1 CRC calculating unit 80 in FIG. 39.

In accordance with the eighth embodiment, shift-register operation in the L2 CRC calculating unit 90 can be made unnecessary, thereby allowing the structure of hardware to be simplified.

(J) Ninth Embodiment

An error-detecting encoder and an error-detecting decoder have been described above. However, the error-detecting encoder of FIG. 1 can be used as is as a dividing apparatus that regards a K-bit input data string as a first polynomial K(x), divides it by a second polynomial [a generator polynomial G(x)] and calculates the remainder. In other words, the dividing apparatus can be constructed by ① data segmenting means 11 for segmenting an input data string into a plurality of sub-data strings; ② for every segmented sub-data string, dividing means 12A to 12D for regarding information bits of the sub-data strings as polynomials, dividing them by a second polynomial and calculating the remainders; ③ converting means 13A to 13D for applying conversion processing, which conforms to segmentation position of the sub-data strings, to the remainders on a per-remainder basis; and ④ a combiner 14 for combining converted values that have been obtained by the conversion processing, and adopting the result of combining the converted values as a remainder that prevails when a K-bit input data string is divided by the second polynomial.

Such a dividing apparatus is not limited to use in an error-detecting encoder and can be utilized in various kinds of encoding.

What is claimed is:

1. An error-detecting decoding apparatus for applying error-detecting processing to an input data string to which parity bits have been appended and detecting error in the input data string, comprising:
   data segmenting means for segmenting said input data string into a plurality of sub-data strings;
   dividing means for dividing the segmented sub-data strings by a generator polynomial and calculating first remainders;
   converting means for applying conversion processing, which conforms to a segmentation position of the sub-data strings, to said first remainders on a per-remainder basis;
   combining means for combining the converted values, which have been obtained by said conversion processing, and outputting parity bits; and
   an error detector for detecting whether or not input data is erroneous depending upon whether said parity bits output from the combining means and said parity bits that have been appended to the input data coincide, wherein data strings are obtained by appending a single "0" to the ends of said segmented sub-data strings and divided by said generator polynomial, the remainders of the division being adopted as second remainders, and if a transformation matrix for converting said first remainders to the second remainders is represented by matrix A and the segmentation position of said sub-data string is an Sth bit, then said converting means executes said conversion processing by multiplying a matrix $A^S$ by the first remainders.

2. An error-detecting decoding apparatus according to claim 1, wherein said transformation matrix $A^S$ obtained by multiplying the matrix A by itself S times is implemented by hardware, the first remainders are input to said hardware and said conversion processing is executed.

3. An error-detecting decoding apparatus according to claim 1, wherein in a case where said dividing means includes n-number of CRC calculating units which divide respective ones of the segmented sub-data by the generator polynomial and calculate the first remainders, said data segmenting means segments the input data string in such a manner that bit lengths of each of said sub-data strings become equal to an overall input bit length divided by n, and inputs the sub-data strings to said n-number of CRC calculating units one bit at a time from the higher order side.

4. An error-detecting decoding apparatus according to claim 1, wherein said data segmenting means segments the input data string in such a manner that bit length of the sub-data strings take on a set length, and inputs the sub-data strings to said dividing means one bit at a time from the higher order side.

5. An error-detecting decoding apparatus according to claim 4, wherein said data segmenting means appends "0"s to the higher order side of a sub-data string of which bit length is less than said set length so that the bit length of said sub-data string becomes the set length.

6. An error-detecting decoding apparatus according to claim 1, further comprising:
   storage means for storing each converted value obtained by said conversion processing;
   wherein a remainder is re-calculated only with regard to sub-data that has been input again owing to an error, a result of conversion of said remainder is combined with the stored results of conversion of other sub-data, and parity bits are output.

7. An error-detecting decoding apparatus for applying error-detecting processing to an input data string to which parity bits have been appended and detecting error in the input data string, comprising:
   data segmenting means for segmenting said input data string, inclusive of parity bits, into a plurality of sub-data strings;
   dividing means for dividing the segmented sub-data strings by a generator polynomial and calculating first remainders;
   converting means for applying conversion processing, which conforms to a segmentation position of the sub-data strings, to said remainders on a per-remainder basis;
   a combiner for combining the converted values that have been obtained by said conversion processing; and
   an error detector for detecting whether or not input data is erroneous depending upon whether result of combining converted values is that all bits are "0"s, wherein data strings are obtained by appending a single "0" to the ends of said segmented sub-data strings and are divided by said generator polynomial, the remainders of the division being adopted as second remainders, and if a transformation matrix for converting said first remainders to the second remainders is represented by matrix A and the segmentation position of said sub-data string is an Sth bit, then said converting means executes said conversion processing by multiplying a matrix $A^S$ by the first remainders.

8. An error-detecting decoding apparatus according to claim 7, wherein said transformation matrix $A^S$ obtained by multiplying the matrix A by itself S times is implemented by hardware, the first remainders are input to said hardware and said conversion processing is executed.

9. An error-detecting decoding apparatus according to claim 7, wherein in a case where said dividing means includes n-number of CRC calculating units which divide respective ones of the segmented sub-data by the generator polynomial and calculate the first remainders, said data segmenting means segments the input data string in such a manner that bit lengths of each of said sub-data strings become equal to an overall input bit length divided by n, and inputs the sub-data strings to said n-number of CRC calculating units one bit at a time from the higher order side.

10. An error-detecting decoding apparatus according to claim 7, wherein said data segmenting means segments the input data string in such a manner that bit length of the sub-data strings take on a set length, and inputs the sub-data strings to said dividing means one bit at a time from the higher order side.

11. An error-detecting decoding apparatus according to claim 10, wherein said data segmenting means appends "0"s to the higher order side of a sub-data string of which bit length is less than said set length so that the bit length of said sub-data string becomes the set length.

12. An error-detecting decoding apparatus according to claim 7, further comprising:
  storage means for storing each converted value obtained by said conversion processing;
wherein a remainder is re-calculated only with regard to sub-data that has been input again owing to an error, a result of conversion of said remainder is combined with the stored results of converting other sub-data, and parity bits are output.

* * * * *